(12) United States Patent
Rostoker

(10) Patent No.: US 9,123,512 B2
(45) Date of Patent: Sep. 1, 2015

(54) RF CURRENT DRIVE FOR PLASMA ELECTRIC GENERATION SYSTEM

(75) Inventor: Norman Rostoker, Irvine, CA (US)

(73) Assignee: THE REGENTS OF THE UNVIERSITY OF CALIFORNIA, Oakland, CA (US)

( * ) Notice: Subject to any disclaimer, the term of this patent is extended or adjusted under 35 U.S.C. 154(b) by 398 days.

(21) Appl. No.: 11/371,196

(22) Filed: Mar. 7, 2006

(65) Prior Publication Data

US 2006/0254520 A1 Nov. 16, 2006

Related U.S. Application Data

(60) Provisional application No. 60/659,767, filed on Mar. 7, 2005.

(51) Int. Cl.
*G21B 1/00* (2006.01)
*H01J 37/32* (2006.01)
*G21B 1/05* (2006.01)

(52) U.S. Cl.
CPC ........... *H01J 37/32678* (2013.01); *G21B 1/052* (2013.01); *Y02E 30/122* (2013.01)

(58) Field of Classification Search
USPC ......... 376/100, 107, 121, 127, 128, 129, 146, 376/147, 154; 315/111.21, 111.41, 111, 51, 315/111.61, 111.71, 111.81, 111.91; 176/1, 176/2, 3, 4, 5
See application file for complete search history.

(56) References Cited

U.S. PATENT DOCUMENTS 3,036,963 A 5/1962 Christofilos
3,071,525 A 1/1963 Christofilos
3,120,470 A * 2/1964 Imhoff et al. ................. 376/132
3,132,996 A 5/1964 Baker et al.
3,170,841 A 2/1965 Post
(Continued)

FOREIGN PATENT DOCUMENTS

BE 825258 5/1975
GB 1 387 098 3/1975
(Continued)

OTHER PUBLICATIONS

Dawson et al., "Isotope separation in Plasma by Use Ion Cyclotron Resonance", Phys. Rev. Letter, 37 (23), pp. 1547-1550, 1976.*
(Continued)

*Primary Examiner* — Jack W Keith
*Assistant Examiner* — Marshall O'Connor
(74) *Attorney, Agent, or Firm* — One LLP

(57) ABSTRACT

A system and apparatus for controlled fusion in a field reversed configuration (FRC) magnetic topology and conversion of fusion product energies directly to electric power. Preferably, plasma ions are magnetically confined in the FRC while plasma electrons are electrostatically confined in a deep energy well, created by tuning an externally applied magnetic field. In this configuration, ions and electrons may have adequate density and temperature so that upon collisions ions are fused together by the nuclear force, thus forming fusion products that emerge in the form of an annular beam. Energy is removed from the fusion product ions as they spiral past electrodes of an inverse cyclotron converter. Advantageously, the fusion fuel plasmas that can be used with the present confinement and energy conversion system include advanced (aneutronic) fuels.

6 Claims, 23 Drawing Sheets

(56) References Cited

U.S. PATENT DOCUMENTS

| | | | |
|---|---|---|---|
| 3,182,213 A | 5/1965 | Rosa | |
| 3,258,402 A | 6/1966 | Farnsworth | |
| 3,386,883 A | 6/1968 | Farnsworth | |
| 3,527,977 A | 9/1970 | Ruark | |
| 3,530,036 A | 9/1970 | Hirsch | |
| 3,530,497 A | 9/1970 | Hirsch et al. | |
| 3,577,317 A | 5/1971 | Woods | |
| 3,621,310 A | 11/1971 | Takeuchi et al. | |
| 3,663,362 A | 5/1972 | Stix | |
| 3,664,921 A | 5/1972 | Christofilos | |
| 3,668,065 A | 6/1972 | Moir | 376/147 |
| 3,859,164 A | 1/1975 | Nowak | 176/2 |
| 4,010,396 A | 3/1977 | Ress et al. | 313/231.3 |
| 4,054,846 A | 10/1977 | Smith et al. | |
| 4,057,462 A | 11/1977 | Jassby et al. | 176/5 |
| 4,065,351 A | 12/1977 | Jassby et al. | 176/5 |
| 4,098,643 A | 7/1978 | Brown | |
| 4,182,650 A * | 1/1980 | Fischer | 376/144 |
| 4,189,346 A | 2/1980 | Jarnagin | 176/5 |
| 4,202,725 A | 5/1980 | Jarnagin | 176/5 |
| 4,233,537 A | 11/1980 | Limpaecher | 313/231.3 |
| 4,246,067 A | 1/1981 | Linlor | 176/3 |
| 4,267,488 A | 5/1981 | Wells | 315/111.7 |
| 4,274,919 A | 6/1981 | Jensen et al. | 176/3 |
| 4,303,467 A | 12/1981 | Scornavacca et al. | |
| 4,314,879 A | 2/1982 | Hartman et al. | 376/128 |
| 4,317,057 A | 2/1982 | Bazarov et al. | |
| 4,347,621 A | 8/1982 | Dow | 376/139 |
| 4,350,927 A | 9/1982 | Maschke | |
| 4,371,808 A | 2/1983 | Urano et al. | |
| 4,390,494 A | 6/1983 | Salisbury | 376/107 |
| 4,397,810 A | 8/1983 | Salisbury | 376/107 |
| 4,416,845 A | 11/1983 | Salisbury | 376/107 |
| 4,434,130 A | 2/1984 | Salisbury | 376/107 |
| 4,483,737 A | 11/1984 | Mantei | 438/732 |
| 4,543,231 A | 9/1985 | Ohkawa | 376/133 |
| 4,543,465 A | 9/1985 | Sakudo et al. | |
| 4,548,782 A | 10/1985 | Manheimer et al. | 376/127 |
| 4,560,528 A | 12/1985 | Ohkawa | 376/121 |
| 4,584,160 A | 4/1986 | Kageyama | |
| 4,584,473 A | 4/1986 | Hashimoto et al. | 250/251 |
| 4,601,871 A | 7/1986 | Turner | 376/144 |
| 4,615,755 A | 10/1986 | Tracy et al. | 156/345.53 |
| 4,618,470 A | 10/1986 | Salisbury | 376/123 |
| 4,630,939 A | 12/1986 | Mayes | |
| 4,639,348 A | 1/1987 | Jarnagin | 376/107 |
| 4,650,631 A | 3/1987 | Knorr | 376/127 |
| 4,687,616 A | 8/1987 | Moeller | |
| 4,826,646 A | 5/1989 | Bussard | 376/129 |
| 4,853,173 A | 8/1989 | Stenbacka | 376/123 |
| 4,894,199 A | 1/1990 | Rostoker | 376/107 |
| 4,904,441 A | 2/1990 | Sorensen et al. | |
| 5,015,432 A | 5/1991 | Koloc | 376/148 |
| 5,041,760 A | 8/1991 | Koloc | |
| 5,160,694 A | 11/1992 | Steudtner | 376/107 |
| 5,160,695 A | 11/1992 | Bussard | 376/107 |
| 5,206,516 A | 4/1993 | Keller et al. | 250/492.2 |
| 5,339,336 A * | 8/1994 | Sudan | 376/107 |
| 5,355,399 A | 10/1994 | Golovanivsky et al. | |
| 5,420,425 A | 5/1995 | Bier et al. | 250/292 |
| 5,422,481 A * | 6/1995 | Louvet | 250/291 |
| 5,483,077 A | 1/1996 | Glavish | |
| 5,502,354 A | 3/1996 | Correa et al. | |
| 5,537,005 A | 7/1996 | Goebel et al. | 315/111.81 |
| 5,557,172 A | 9/1996 | Tanaka | |
| 5,677,597 A | 10/1997 | Tanaka | |
| 5,747,800 A | 5/1998 | Yano et al. | |
| 5,811,201 A | 9/1998 | Skowronski | |
| 5,846,329 A | 12/1998 | Hori et al. | |
| 5,923,716 A | 7/1999 | Meacham | 376/121 |
| 6,084,356 A | 7/2000 | Seki et al. | |
| 6,248,251 B1 | 6/2001 | Sill | |
| 6,255,648 B1 | 7/2001 | Littlejohn et al. | 250/286 |
| 6,271,529 B1 | 8/2001 | Farley et al. | |
| 6,322,706 B1 | 11/2001 | Ohkawa | 210/695 |
| 6,335,535 B1 | 1/2002 | Miyake et al. | |
| 6,345,537 B1 | 2/2002 | Salamitou | |
| 6,390,019 B1 | 5/2002 | Grimbergen et al. | 118/723 R |
| 6,396,213 B1 | 5/2002 | Koloc | |
| 6,408,052 B1 * | 6/2002 | McGeoch | 378/119 |
| 6,452,168 B1 | 9/2002 | McLucky et al. | |
| 6,477,216 B2 | 11/2002 | Koloc | |
| 6,488,807 B1 | 12/2002 | Collins et al. | |
| 6,593,539 B1 | 7/2003 | Miley et al. | 219/121.36 |
| 6,611,106 B2 * | 8/2003 | Monkhorst et al. | 315/111.41 |
| 6,628,740 B2 | 9/2003 | Monkhorst et al. | |
| 6,632,324 B2 | 10/2003 | Chan | |
| 6,664,740 B2 | 12/2003 | Rostoker et al. | |
| 6,712,927 B1 | 3/2004 | Grimbergen et al. | 156/345.24 |
| 6,755,086 B2 | 6/2004 | Salamitou et al. | |
| 6,850,011 B2 | 2/2005 | Monkhorst et al. | |
| 6,852,942 B2 | 2/2005 | Monkhorst et al. | |
| 6,888,907 B2 | 5/2005 | Monkhorst et al. | |
| 6,891,911 B2 | 5/2005 | Rostoker et al. | |
| 6,894,446 B2 | 5/2005 | Monkhorst et al. | |
| 6,995,515 B2 | 2/2006 | Rostoker et al. | |
| 7,002,148 B2 | 2/2006 | Monkhorst et al. | |
| 7,015,646 B2 | 3/2006 | Rostoker et al. | |
| 7,026,763 B2 | 4/2006 | Rostoker et al. | |
| 7,115,887 B1 * | 10/2006 | Hassanein et al. | 250/504 R |
| 7,126,284 B2 | 10/2006 | Rostoker et al. | |
| 7,129,656 B2 | 10/2006 | Rostoker et al. | |
| 7,439,678 B2 | 10/2008 | Rostoker et al. | |
| 2001/0006093 A1 | 7/2001 | Tabuchi et al. | |
| 2001/0035498 A1 | 11/2001 | Li et al. | |
| 2003/0150710 A1 | 8/2003 | Evans | |
| 2003/0197129 A1 | 10/2003 | Murrell et al. | |
| 2003/0230240 A1 | 12/2003 | Rostoker et al. | |
| 2003/0230241 A1 | 12/2003 | Rostoker et al. | |
| 2004/0047442 A1 | 3/2004 | Monkhorst et al. | |

FOREIGN PATENT DOCUMENTS

| | | |
|---|---|---|
| RU | 2 056 649 C1 | 3/1996 |
| WO | WO 97/10605 | 3/1997 |
| WO | WO 99/65056 | 12/1999 |

OTHER PUBLICATIONS

Miley et al., "On desing and Development issues for the FRC and related Alternate Confinement Concepts", Fusion Engineering and Design, 48, 327-337, 2000.*

Arsenin at al., "Suppression of plasma instabilities by the feedback method", Soviet Physics Uspekhi, v. 20, No. 9, pp. 736-745.*

Goldston, R., Fusion Alternatives, Dec. 19, 1997, Science, vol. 278, No. 5346, pp. 2031-2037.*

Wong et al., Proton-Boron colliding beam fusion reactor, pp. 1-25.*

Lampe et al., Comments on the Colliding Beam Fusion Reactor Proposed by Rostoker, Binderbauer and Monkhorst for Use with the p-11B Fusion Reaction, Navel Research Laboratory, Oct. 30, 1998, pp. 1-37.*

Cohen et al., Ion Heating in the Field-Reversed Configuration by Rotating Magnetic Fields near the Ion-Cyclotron Resonance, Dec. 11, 2000, Phyical Review Letters, vol. 85, No. 24.*

Rostoker, N. et al., *Self-colliding beams as an alternative fusion system for D-He/sup 3/reactors*, Current trends in International fusion research. Proceedings of the first International Symposium of Evaluation of Current Trends in Fusion Research, Washington, D.C., Nov. 14-18, 1997, pp. 33-41.

Rostoker, N. et al., *Colliding Beam Fusion Reactor*, University of California, Irvine, and University of Florida, Gainesville, FL, pp. 1-26 (1997).

Ware, A. et al., *Electrostatic plugging of open-ended magnetic containment systems*, Nuclear Fusion, Dec. 1969, Austria, vol. 9, No. 4, pp. 353-361.

Ruggiero, Alessandro G., *Proton-Boron Colliding Beams for Nuclear Fusion*, Proceedings if ICONE 8 8th Int'l. Conference on Nuclear Engineering (Apr. 2-6, 2000, Baltimore, MD), pp. 1-11).

Rostoker, N. et al., *Self-colliding beams as an alternative fusion system*, Proceedings of the International Conference on High Power Particle Beams (10th), San Diego, CA (Jun. 20-24, 1994), pp. 195-201).

(56) References Cited

OTHER PUBLICATIONS

Rostoker, N. et al., *Comments on Plasma Phys. Controlled Fusion, Self-Colliding Systems for Aneutronic Fusion*, vol. 15, No. 2, pp. 105-120, 1992 Gordon and Breach, Science Publishers S.A., U.K.
Binderbauer et al., *Turbulent transport in magnetic confinement: how to avoid it*, Dept. of Physics, University of California, Irvine, CA (Apr. 8, 1996), pp. 1-15.
Welcome to Colliding Beam Fusion (http://fusion.ps.uci.edu/beam/intro.html) (Copyright 1997), pp. 1-3.
Rostoker, Norman, *Advanced Fusion Energy and Future Energy Mix Scenarios*, Abstracts with Programs from 1999 Annual Meeting and Exposition, The Geological Society of America (Oct. 25-28, 1999), Denver, CO).
Dawson, John M., *Advanced Fuels for CTR, Four Workshops in Alternate Concepts in Controlled Fusion*, Electric Power Research Institute, Palo Alto, CA (May 1977), pp. 143-147.
Rostoker, Norman, *Alternate Fusion Concepts, Current Trends in International Fusion Research*, edited by Panarella, Plenum Press, New York and London, pp. 489-495 (1997).
Rostoker, N. et al., *Classical Scattering in a High Beta Self-Collider/FRC*, AIP Conference Proceedings 311 (Irvine, CA 1993), Physics of High Energy Particles in Toroidal Systems, American Institute of Physics, New York.
Rostoker, N. et al., *Colliding Beam Fusion Reactor*, 12th Inter'l. Conference on High-Power Particle Beams, Beans '98, Haifa, Israel (Jun. 7-12, 1998), vol. 1, 8 pages.
Rostoker, N. et al., *Colliding Beam Fusion Reactor*, American Association for the Advancement of Science (Nov. 21, 1997), vol. 278, pp. 1419-1422.
Wessel et al., *Colliding Beam Fusion Reactor Space Propulsion System*, Space Tech. and Applications International Forum—2000, edited by M.S. El-Genk (2000 American Institute of Physics, pp. 1425-1430.
Wessel et al., *D-T Beam Fusion Reactor*, Journal of Fusion Energy, vol. 17, No. 3 (Sep. 1998), pp. 209-211.
Rostoker et al., *Fusion Reactors Based on Colliding Beams in a Field Reversed Configuration Plasma*, Comments Plasma Phys. Controlled Fusion (1997), vol. 18, No. 1, No. 1, pp. 11-23.
Rostoker, *Large Orbit Magnetic Confinement Systems for Advanced Fusion Fuels*, Final Technical Report, U.S. Department of Commerce, National Technical Information Service (Apr. 1, 1990-Feb. 29, 1992).
Tusczewski, M., *"Field Reversed Configurations,"* Nuclear Fusion, vol. 28, No. 11, pp. 2033-2092 (1988).
Tuszewski, M., *"Status of the Field-Reversed Configuration as an Alternate Confinement Concept"*, Fusion Technology, vol. 15, (Mar. 1989).
Rider, Todd H., *"Fundamental limitations on plasma fusion systems not in thermodynamic equilibrium,"* Phys, Plasmas 4 (4), pp. 1039-1046, Apr. 1997.
Avanzini et al., *"Feasibility of Fusion Power Generation by Accelerated Ion Beams,"* ICENES, pp. 305-309, Jun. 30-Jul. 4, 1986.
Dawson, John M., *"Advanced Fuels fo CTR,"* Four Workshops in Alternate Concepts in Controlled Fusion, EPRI ER-429-SR Special Report, Part B: Extended Summaries, pp. 143-147, May 1977.
Dawson, John M., *"Alternate Concepts in Controlled Fuison,"* EPRI ER-429-SR Special Report, Part C: CTR Using the p-$^{11}$B Reaction, pp. iii-30, May 1977.
*"Letters,"* ISSN 0036-8075, Science, vol. 278, pp. 2024, 2032-2034, No. 5346, Dec. 19, 1997.
Finn et al., *"Field-Reversed Configurations with a Component of Energetic Particles,"* Nuclear Fusion, vol. 22, pp. 1443-1458, No. 11, (1982).
Tamdem Energy Corporation Presentation, Dec. 12, 1997.
Post, Richard F., *"Nuclear Fusion,"* McGraw-Hill Encyclopedia of Science & Tehcnology, 6$^{th}$ Ed., pp. 142-153, 12 NIO-OZO.
Rider, Todd H., *"A general critique of inertial-electrostatic confinement fusion systems,"* Phys. Plasmas, vol. 2, No. 6, Pt. 1, pp. 1853-1870, Jun. 1995.

Dobrott, D., *"Alternate Fuels in Fusion Reactors,"* Nuclear Technology/Fusion, pp. 339-347, vol. 4, Sep. 1983.
Miley et al., *"A Possible Route to Small, Flexible Fusion Units,"* Energy, vol. 4, pp. 163-170, Special Issue: 1978 Midwest Energy Conference.
Heidbrink et al., *"The diffusion of fast ions in Ohmic TFTR discharges,"* Phys. Fluids B, vol. 3, No. 11, pp. 3167-3170, Nov. 1991.
Heidbrink et al., *"Comparison of Experimental and Theoretical Fast Ion Slowing-Down Times in DIII-D,"* Nuclear Fusion, vol. 28, No. 10, pp. 1897-1900, plus letters page, (1988).
Becker et al., *"Low-Energy Cross Sections for $^{11}B$ $(p,2\alpha)^*$,"* Atornic Nuclei 327, pp. 341-355, (1987).
Rosenbluth et al., *"Fokker-Planck Equation for an Inverse-Square Force,"* The Physical Review, vol. 107, No. 1, pp. 1-6, Jul. 1957.
Feldbacher et al., *"Basic Cross Section Data for Aneutronc Reactor,"* Nucl. Inst. and Methods in Phys. Res., A271, pp. 55-64, (1988).
Naitou et al., *"Kinetic Effects on the Connective Plasma Diffusion and the Heat Transport,"* J. of the Phys. Soc. of Jap., vol. 46, No. 1, pp. 258-264, (1979).
Zweben et al., *"Radial Diffusion Coefficient for Counter-Passing MeV Ions in the TFTR Tokamak,"* Nuclear Fusion, vol. 13, No. 12, pp. 2219-2245, (1991).
Song et al., *"Electron trapping and acceleration in a modified elongated betatron,"* Phys. Fluids B, vol. 4, No. 11, pp. 3771-3780, Nov. 1992.
Wong et al., *"Stability of annular equilibrium of energetic large orbit ion beam,"* Phys. Fluids B., vol. 3, No. 11, pp. 2973-2966, Nov. 1991.
Davis et al., *"Generation of Field-Reversing E Layers with Millisecond Lifetimes,"* Phys. Review Let., vol. 37, No. 9, pp. 542-545, Aug. 30, 1976.
Phelps, et al., *"Observations of the stable equilibrium and classical diffusion of field reversing relativistic electron coils,"* The Phys. of Fluids, vol. 17, No. 12, pp. 2226-2235, Dec. 1974.
Weaver et al., *"Exotic CTR Fuels: Non-Thermal Effects and Laser Fusion Applications,"* Paper presented at 1973 Annual Meeting of the Amer. Phys. Soc. Div. of Plasma Physics, Philadelphia, PA, Oct. 30, 1973.
Weaver et al., *"Fusion Microexplosions, Exotic Fusion Fuels, Direct conversion: Advanced Technology Options for CTR,"* UCID-16309, Apr. 27, 1973.
Weaver et al., *"Exotic CTR Fuels for Direct Conversion—Utilizing Fusion Reactors,"* UCID-16230, Mar. 16, 1973.
Heidbrink, W.W., *"Measurements of classical deceleration of beam ions in the DIII-D tokamak,"* Phys. Fluids B, vol. 2, No. 1, pp. 4-5, Jan. 1990.
Cox, et al., *"Thermonuclear Reaction Listing with Cross-Section Data for Four Advanced Reactions,"*, Fusion Technology, vol. 18, pp. 325-339.
Rostoker et al., *"Colliding Beam Fusion Reactor,"* Science, vol. 278, pp. 1419-1422, Nov. 1997.
Rostoker et al., *"Large Orbit Confinement for Aneutronic Systems,"* Non-Linear and Relativistic Effects in Plasmids, Ed. V. Stefan, Am. Inst. of Phys., New York, pp. 116-135, (1992).
Rostoker et al., *"Magnetic Fusion with High Energy Self-Colliding Ion Beams,"* Phys. Rev. Let., vol. 27, No. 12, pp. 1818-1821 (1993).
Nevins, et al. *"Feasibility of a Colliding Beam Fusion Reactor,"* online available: wysiwyg://66/http://intl.sciencemag.org/cgi/content/full/281/5375/307a.
Carlson (dated Aug. 1998) *"Annotated Bibliography of p-B11 Fusion,"* online available: http://www/ipp.mpg.de/~Arthur.carlson/p-B11-bib.html.
Carlson, (dated Nov. 28, 1997) *"Re: Boron/Proton Colliding Beam Fusion Reactor?"* online available: http://groups.google.com/groups?q=rostok...opuo.fsf%40s4awc.aug.ipp-garching.mpg.de.
Carlson (dated Jan. 4, 1997) *"Fundamental Limitation on Plasma Fusion Systems no in Thermodynamic Equilibrium,"* Online available: http://www.ipp.mpg.de/~Arthur.Carlson/rider.html.
Carlson (dated Sep. 14, 2000), *"Re: Lithium Fission—Why Not?"*, online available: http://groups.google.com/groups?q=rostok...v35u.fsi%40suawc.aug.ipp-garching.mpg.de.
Carlson (dated May 10, 2000), *"Home Page of Dr. A. Carlson"* online available: http://www/rzg.mpg.de/~awc/home.html.

(56) References Cited

OTHER PUBLICATIONS

W.W. Heidbrink, et al. "*The Behaviour of Fast Ions in Tokamak Experiments*," Nuclear Fusion, vol. 34, No. 4 (1994).
L.C. Steinhauer, et al. "*FRC 2001: A White Paper on FRC Development in the Next Five Years*," Fusion Technology vol. 30, Sep. 1996.
Miley, G.H. et al, "*On Design and Development issues for the FRC and Related Alternate Confinement Concepts*," 6th IAEA Technical Committee Meeting and Workshop on Fusion Power Plant Design and Technology, Culham, UK, Mar. 24-27, 1998, vol. 48, No. 3-4, pp. 327-337.
Kalinowsky, H., "*Deceleration of Antiprotons from MeV to keV Energies*" Antihydrogen Workshop, Munich, Germany, Jul. 30-31, 1992, vol. 79, No. 1-4, pp. 73-80.
Lampe et al., "*Comments on the Colliding Beam Fusion reactor Proposed by Rostoker et al. for Use with the p-11B Fusion Reaction*", Naval Research Lab., Plasma Physics Div. (Oct. 30, 1998), title page, pp. i, iii, pp. 1-37.
"A White Paper on FRC Development", Apr. 1998, from http:/depts.washington.edu/ppl/programs/wpr98.pdf, pp. 1-26.
Iwanenko et al., "On the Maximal Energy Attainable in a Betatron", Physical Review, vol. 65, No. 11 and 12, Jun. 1 and 15, 1944, p. 343.
Jeffries, C.D., "A Direct Determination of the Magnetic Moment of the Protons in Units of the Nuclera Magnetron", Physical Review, vol. 81, No. 6, Mar. 15, 1951, pp. 1040-1055, plus Figure 8 (one page).
Tomita et al., "Direct Energy Conversion System for D-3He Fusion", Seventh International Conference on Emerging Nuclear Energy Systems, ICENES '93, 1994, pp. 522-526.
A. V. Shishlov et al., "Long time implosion experiments with double gas puffs", Physics of Plasmas, vol. 7, No. 4, pp. 1252-1262 (Apr. 2000).
Lawson, J.D., Proc. Soc. B70, pp. 6-10 (1957).
Artsimovich, L.A., "Controlled Thermonuclear Reactions", Gordon and Breach Science Publishers, New York (English Edition first Published 1964), pp. 1-9.
Goldston et al, Science vol. 278, No. 5346, pp. 2031-2037 (Dec. 19, 1997).
Rider, T.H., Physics of plasmas 4(4), Apr. 1997, pp. 1039-1046.
Bohm, D., "Quantum Theory", Dover Publications, Inc., New York (copyright 1951) (ISBN 0-486-65969-0), Ch. 12, pp. 277-283.
Nevins, Carlson and Rostoker, Binderbauer and Monkhorst, Science, vol. 281, No. 5375, p. 307 (1998).
Wessel et al, J. Fusion Energy, vol. 17, No. 3, pp. 209-211 (1998).
"Summary, Plasma Science, Advancing Knowledge in the National Interest", National Research Council of the National Academies, The National Academies Press, Washington D.C. (May 2007) (www.nap.edu).
Robinson, "Army Pushes New Weapon Effort", Aviation Week & Technology, Oct. 16, 1978, pp. 42-53.
Tevatron Beam Separator Traveler Assembly, Fermi National Accelerator Laboratory, Batavia, IL 60510 (Jun. 3, 2002), p. 1 and drawing.
U.S. Appl. No. 11/709,995—Office Action, Sep. 16, 2009.
U.S. Appl. No. 11/371,207—Office Action, Sep. 18, 2009.
EP, Search Report, Oct. 17, 2009.
Dawson et al., "Isotope separation in Plasma by Use Ion Cyclotron Resonance", *Phys. Rev. Letters*, 37(23) pp. 1547-1550.
Alexander Wu Chao et al., *Handbook of Accelerator Physics and Engineering* (2nd Printing), World Scientific (1998), Chapter 2, pp. 53, 119-120.
Dolan, "*Fusion Research*", vol. II, pp. 277-309, Pergamon Press, NY (1982).
Bystritskii et al., "*Generation and Transport of Low-Energy Intense Ion Beam*", IEEE Transaction on Plasma Science, vol. 32, No. 5, pp. 1986-1992 (Oct. 2004).
Anderson et al., "*Plasma and Ion Beam Injection into an FRC*", Plasma Physics Reports, vol. 31, No. 10, pp. 809-817((9) (Oct. 2005).
Speth, "*RF Source Overview*", CCNB Padua, pp. 1-29 (Jun. 5-6, 2003).

\* cited by examiner

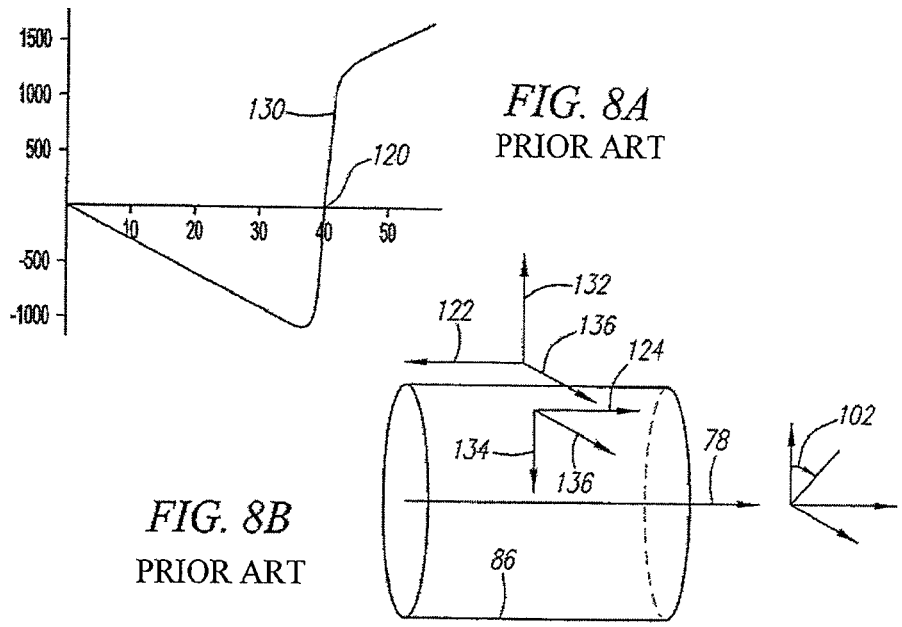
FIG. 8A PRIOR ART
FIG. 8B PRIOR ART
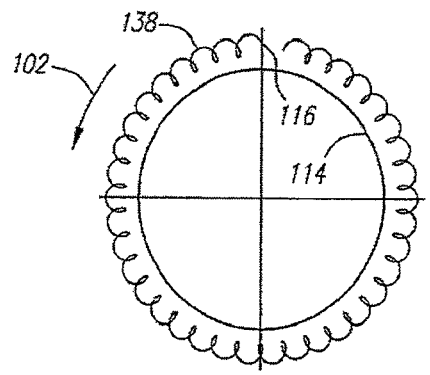
FIG. 9A PRIOR ART
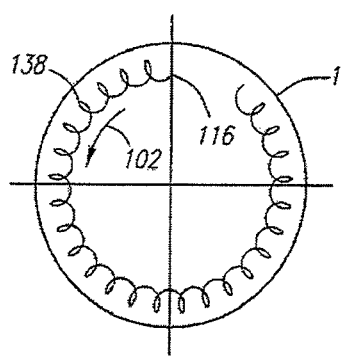
FIG. 9B PRIOR ART
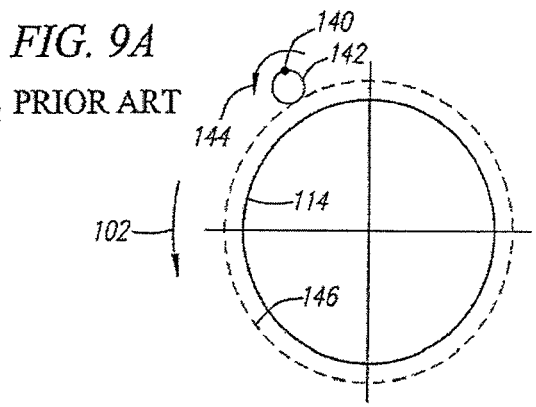
FIG. 9C PRIOR ART

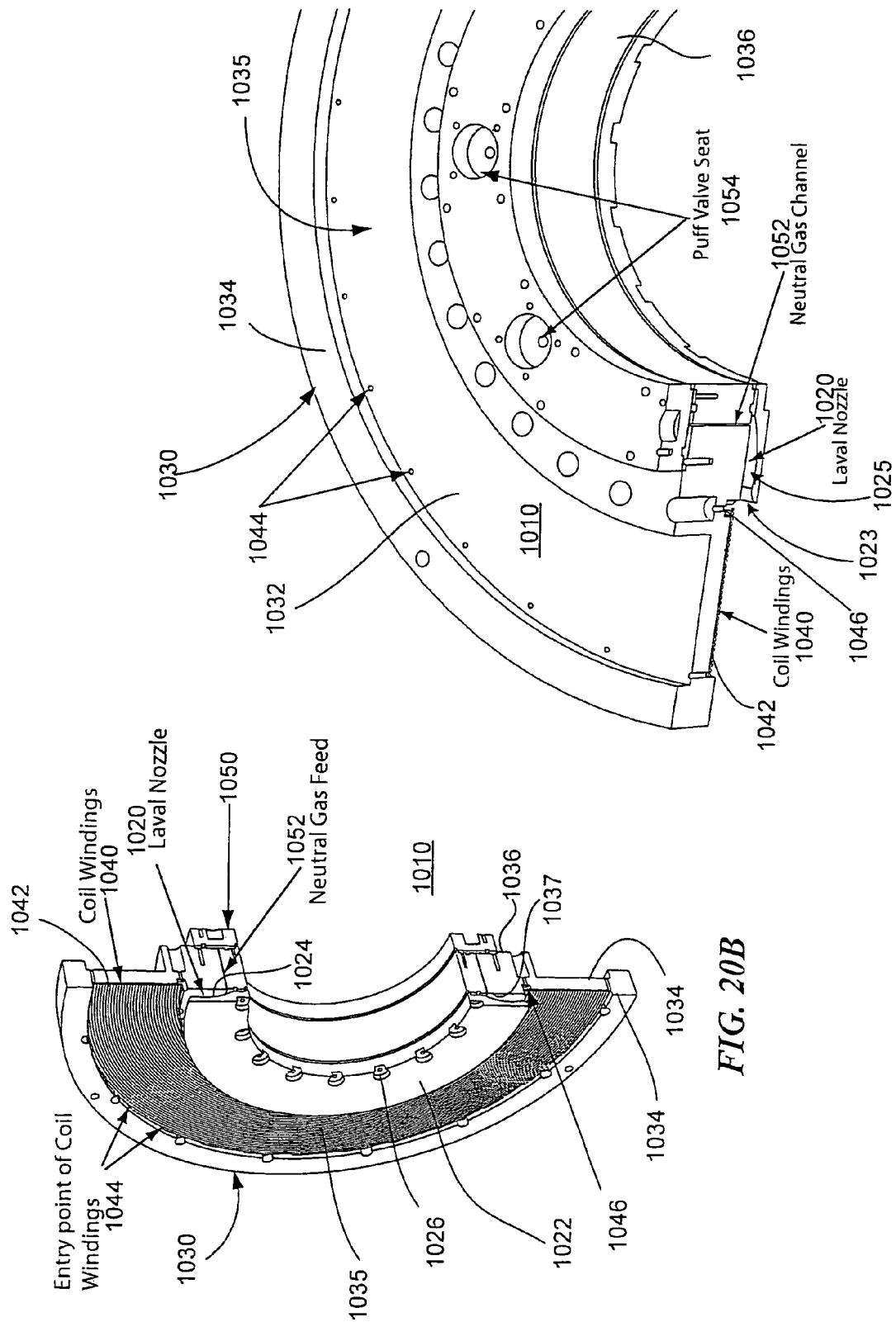

RF CURRENT DRIVE FOR PLASMA ELECTRIC GENERATION SYSTEM

CROSS-REFERENCE TO RELATED APPLICATION

This application claims the benefit of U.S. Provisional Application No. 60/659,767 filed Mar. 7, 2005, which application is incorporated herein by reference.

FIELD OF THE INVENTION

The invention relates generally to the field of plasma physics, and, in particular, to methods and apparati for confining plasma to enable nuclear fusion and for converting energy from fusion products into electricity.

BACKGROUND OF THE INVENTION

Fusion is the process by which two light nuclei combine to form a heavier one. The fusion process releases a tremendous amount of energy in the form of fast moving particles. Because atomic nuclei are positively charged—due to the protons contained therein—there is a repulsive electrostatic, or Coulomb, force between them. For two nuclei to fuse, this repulsive barrier must be overcome, which occurs when two nuclei are brought close enough together where the short-range nuclear forces become strong enough to overcome the Coulomb force and fuse the nuclei. The energy necessary for the nuclei to overcome the Coulomb barrier is provided by their thermal energies, which must be very high. For example, the fusion rate can be appreciable if the temperature is at least of the order of $10^4$ eV—corresponding roughly to 100 million degrees Kelvin. The rate of a fusion reaction is a function of the temperature, and it is characterized by a quantity called reactivity. The reactivity of a D-T reaction, for example, has a broad peak between 30 keV and 100 keV.

Typical fusion reactions include:

$$D+D \rightarrow He^3(0.8\ MeV)+n(2.5\ MeV),$$

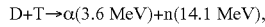
$$D+T \rightarrow \alpha(3.6\ MeV)+n(14.1\ MeV),$$

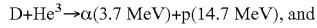
$$D+He^3 \rightarrow \alpha(3.7\ MeV)+p(14.7\ MeV),\ and$$

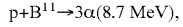
$$p+B^{11} \rightarrow 3\alpha(8.7\ MeV),$$

where D indicates deuterium, T indicates tritium, α indicates a helium nucleus, n indicates a neutron, p indicates a proton, He indicates helium, and $B^{11}$ indicates Boron-11. The numbers in parentheses in each equation indicate the kinetic energy of the fusion products.

The first two reactions listed above—the D-D and D-T reactions—are neutronic, which means that most of the energy of their fusion products is carried by fast neutrons. The disadvantages of neutronic reactions are that (1) the flux of fast neutrons creates many problems, including structural damage of the reactor walls and high levels of radioactivity for most construction materials; and (2) the energy of fast neutrons is collected by converting their thermal energy to electric energy, which is very inefficient (less than 30%). The advantages of neutronic reactions are that (1) their reactivity peaks are at a relatively low temperature; and (2) their losses due to radiation are relatively low because the atomic numbers of deuterium and tritium are 1.

The reactants in the other two equations—D-$He^3$ and p-$B^{11}$—are called advanced fuels. Instead of producing fast neutrons, as in the neutronic reactions, their fusion products are charged particles. One advantage of the advanced fuels is that they create much fewer neutrons and therefore suffer less from the disadvantages associated with them. In the case of D-$He^3$, some fast neutrons are produced by secondary reactions, but these neutrons account for only about 10 percent of the energy of the fusion products. The p-$B^{11}$ reaction is free of fast neutrons, although it does produce some slow neutrons that result from secondary reactions but create much fewer problems. Another advantage of the advanced fuels is that their fusion products comprise charged particles whose kinetic energy may be directly convertible to electricity. With an appropriate direct energy conversion process, the energy of advanced fuel fusion products may be collected with a high efficiency, possibly in excess of 90 percent.

The advanced fuels have disadvantages, too. For example, the atomic numbers of the advanced fuels are higher (2 for $He^3$ and 5 for $B^{11}$). Therefore, their radiation losses are greater than in the neutronic reactions. Also, it is much more difficult to cause the advanced fuels to fuse. Their peak reactivities occur at much higher temperatures and do not reach as high as the reactivity for D-T. Causing a fusion reaction with the advanced fuels thus requires that they be brought to a higher energy state where their reactivity is significant. Accordingly, the advanced fuels must be contained for a longer time period wherein they can be brought to appropriate fusion conditions.

The containment time for a plasma is $\Delta t=r^2/D$, where r is a minimum plasma dimension and D is a diffusion coefficient. The classical value of the diffusion coefficient is $D_c=a_i^2/\tau_{ie}$, where $a_i$ is the ion gyroradius and $\tau_{ie}$ is the ion-electron collision time. Diffusion according to the classical diffusion coefficient is called classical transport. The Bohm diffusion coefficient, attributed to short-wavelength instabilities, is $D_B=(1/16)a_i^2\Omega_i$, where $\Omega_i$ is the ion gyrofrequency. Diffusion according to this relationship is called anomalous transport. For fusion conditions, $D_B/D_c=(1/16)\Omega_i\tau_{ie}\cong 10^8$, anomalous transport results in a much shorter containment time than does classical transport. This relation determines how large a plasma must be in a fusion reactor, by the requirement that the containment time for a given amount of plasma must be longer than the time for the plasma to have a nuclear fusion reaction. Therefore, classical transport condition is more desirable in a fusion reactor, allowing for smaller initial plasmas.

In early experiments with toroidal confinement of plasma, a containment time of $\Delta t \cong r^2/D_B$ was observed. Progress in the last 40 years has increased the containment time to $\Delta t \cong 1000\ r^2/D_B$. One existing fusion reactor concept is the Tokamak. For the past 30 years, fusion efforts have been focused on the Tokamak reactor using a D-T fuel. These efforts have culminated in the International Thermonuclear Experimental Reactor (ITER). Recent experiments with Tokamaks suggest that classical transport, $\Delta t \cong r^2/D_c$, is possible, in which case the minimum plasma dimension can be reduced from meters to centimeters. These experiments involved the injection of energetic beams (50 to 100 keV), to heat the plasma to temperatures of 10 to 30 keV. See W. Heidbrink & G. J. Sadler, 34 *Nuclear Fusion* 535 (1994). The energetic beam ions in these experiments were observed to slow down and diffuse classically while the thermal plasma continued to diffuse anomalously fast. The reason for this is that the energetic beam ions have a large gyroradius and, as such, are insensitive to fluctuations with wavelengths shorter than the ion gyroradius ($\lambda < a_i$). The short-wavelength fluctuations tend to average over a cycle and thus cancel. Electrons, however, have a much smaller gyroradius, so they respond to the fluctuations and transport anomalously.

Because of anomalous transport, the minimum dimension of the plasma must be at least 2.8 meters. Due to this dimension, the ITER was created 30 meters high and 30 meters in diameter. This is the smallest D-T Tokamak-type reactor that is feasible. For advanced fuels, such as D-He$^3$ and p-B$^{11}$, the Tokamak-type reactor would have to be much larger because the time for a fuel ion to have a nuclear reaction is much longer. A Tokamak reactor using D-T fuel has the additional problem that most of the energy of the fusion products energy is carried by 14 MeV neutrons, which cause radiation damage and induce reactivity in almost all construction materials due to the neutron flux. In addition, the conversion of their energy into electricity must be by a thermal process, which is not more than 30% efficient.

Another proposed reactor configuration is a colliding beam reactor. In a colliding beam reactor, a background plasma is bombarded by beams of ions. The beams comprise ions with an energy that is much larger than the thermal plasma. Producing useful fusion reactions in this type of reactor has been infeasible because the background plasma slows down the ion beams. Various proposals have been made to reduce this problem and maximize the number of nuclear reactions.

For example, U.S. Pat. No. 4,065,351 to Jassby et al. discloses a method of producing counterstreaming colliding beams of deuterons and tritons in a toroidal confinement system. In U.S. Pat. No. 4,057,462 to Jassby et al., electromagnetic energy is injected to counteract the effects of bulk equilibrium plasma drag on one of the ion species. The toroidal confinement system is identified as a Tokamak. In U.S. Pat. No. 4,894,199 to Rostoker, beams of deuterium and tritium are injected and trapped with the same average velocity in a Tokamak, mirror, or field reversed configuration. There is a low density cool background plasma for the sole purpose of trapping the beams. The beams react because they have a high temperature, and slowing down is mainly caused by electrons that accompany the injected ions. The electrons are heated by the ions in which case the slowing down is minimal.

In none of these devices, however, does an equilibrium electric field play any part. Further, there is no attempt to reduce, or even consider, anomalous transport.

Other patents consider electrostatic confinement of ions and, in some cases, magnetic confinement of electrons. These include U.S. Pat. No. 3,258,402 to Farnsworth and U.S. Pat. No. 3,386,883 to Farnsworth, which disclose electrostatic confinement of ions and inertial confinement of electrons; U.S. Pat. No. 3,530,036 to Hirsch et al. and U.S. Pat. No. 3,530,497 to Hirsch et al. are similar to Farnsworth; U.S. Pat. No. 4,233,537 to Limpaecher, which discloses electrostatic confinement of ions and magnetic confinement of electrons with multi-pole cusp reflecting walls; and U.S. Pat. No. 4,826,646 to Bussard, which is similar to Limpaecher and involves point cusps. None of these patents consider electrostatic confinement of electrons and magnetic confinement of ions. Although there have been many research projects on electrostatic confinement of ions, none of them have succeeded in establishing the required electrostatic fields when the ions have the required density for a fusion reactor. Lastly, none of the patents cited above discuss a field reversed configuration magnetic topology.

The field reversed configuration (FRC) was discovered accidentally around 1960 at the Naval Research Laboratory during theta pinch experiments. A typical FRC topology, wherein the internal magnetic field reverses direction, is illustrated in FIG. 3 and FIG. 5, and particle orbits in a FRC are shown in FIG. 6 and FIG. 9. Regarding the FRC, many research programs have been supported in the United States and Japan. There is a comprehensive review paper on the theory and experiments of FRC research from 1960-1988. See M. Tuszewski, 28 *Nuclear Fusion* 2033, (1988). A white paper on FRC development describes the research in 1996 and recommendations for future research. See L. C. Steinhauer et al., 30 *Fusion Technology* 116 (1996). To this date, in FRC experiments the FRC has been formed with the theta pinch method. A consequence of this formation method is that the ions and electrons each carry half the current, which results in a negligible electrostatic field in the plasma and no electrostatic confinement. The ions and electrons in these FRCs were contained magnetically. In almost all FRC experiments anomalous transport has been assumed. See, e.g., Tuszewski, beginning of section 1.5.2, at page 2072.

Thus, it is desirable to provide a fusion system having a containment system that tends to substantially reduce or eliminate anomalous transport of ions and electrons and an energy conversion system that converts the energy of fusion products to electricity with high efficiency.

SUMMARY

The present invention is directed to a system that facilitates controlled fusion in a magnetic field having a field-reversed topology and the direct conversion of fusion product energies to electric power. The system, referred to herein as a plasma-electric power generation (PEG) system, preferably includes a fusion reactor having a containment system that tends to substantially reduce or eliminate anomalous transport of ions and electrons. In addition, the PEG system includes an energy conversion system coupled to the reactor that directly converts fusion product energies to electricity with high efficiency.

In one embodiment, anomalous transport for both ions and electrons tends to be substantially reduced or eliminated. The anomalous transport of ions tends to be avoided by magnetically confining the ions in a magnetic field of field reversed configuration (FRC). For electrons, the anomalous transport of energy is avoided by tuning an externally applied magnetic field to develop a strong electric field, which confines the electrons electrostatically in a deep potential well. As a result, fusion fuel plasmas that can be used with the present confinement apparatus and process are not limited to neutronic fuels, but also advantageously include advanced or aneutronic fuels. For aneutronic fuels, fusion reaction energy is almost entirely in the form of charged particles, i.e., energetic ions, that can be manipulated in a magnetic field and, depending on the fuel, cause little or no radioactivity.

In a preferred embodiment, a fusion reactor's plasma containment system comprises a chamber, a magnetic field generator for applying a magnetic field in a direction substantially along a principle axis, and an annular plasma layer that comprises a circulating beam of ions. Ions of the annular plasma beam layer are substantially contained within the chamber magnetically in orbits and the electrons are substantially contained in an electrostatic energy well. In one preferred embodiment the magnetic field generator includes a current coil. Preferably, the magnetic field generator further comprises mirror coils near the ends of the chamber that increase the magnitude of the applied magnetic field at the ends of the chamber. The system also comprises one or more beam injectors for injecting neutralized ion beams into the magnetic field, wherein the beam enters an orbit due to the force caused by the magnetic field. In a preferred embodiment, the system forms a magnetic field having a topology of a field reversed configuration.

In another preferred embodiment, an alternative chamber is provided that prevents the formation of azimuthal image currents in a central region of the chamber wall and enables magnetic flux to penetrate the chamber on a fast timescale. The chamber, which is primarily comprised of stainless steel to provide structural strength and good vacuum properties, includes axial insulating breaks in the chamber wall that run along almost the entire length of the chamber. Preferably, there are three breaks that are about 120 degrees apart from each other. The breaks include a slot or gap formed in the wall. An insert comprising an insulating material, preferably a ceramic or the like, is inserted into the slots or gaps. In the interior of the chamber, a metal shroud covers the insert. On the outside of the chamber, the insert is attached to a sealing panel, preferable formed from fiberglass or the like, that forms a vacuum barrier by means of an O-ring seal with the stainless steel surface of the chamber wall.

In yet another preferred embodiment, an inductive plasma source is mountable within the chamber and includes a shock coil assembly, preferably a single turn shock coil, that is preferably fed by a high voltage (about 5-15 kV) power source (not shown). Neutral gas, such as Hydrogen (or other appropriate gaseous fusion fuel), is introduced into the source through direct gas feeds via a Laval nozzle. Once the gas emanates from the nozzle and distributes itself over the surface of the coil windings of the shock coil, the windings are energized. The ultra fast current and flux ramp-up in the low inductance shock coil leads to a very high electric field within the gas that causes breakdown, ionization and subsequent ejection of the formed plasma from the surface of the shock coil towards the center or mid-plane of the chamber.

In a further preferred embodiment, a RF drive comprises a quadrupolar cyclotron located within the chamber and having four azimuthally symmetrical electrodes with gaps there between. The quadrupole cyclotron produces an electric potential wave that rotates in the same direction as the azimuthal velocity of ions, but at a greater velocity. Ions of appropriate speed can be trapped in this wave, and reflected periodically. This process increases the momentum and energy of the fuel ions and this increase is conveyed to the fuel ions that are not trapped by collisions.

In another embodiment, a direct energy conversion system is used to convert the kinetic energy of the fusion products directly into electric power by slowing down the charged particles through an electromagnetic field. Advantageously, the direct energy conversion system of the present invention has the efficiencies, particle-energy tolerances and electronic ability to convert the frequency and phase of the fusion output power of about 5 MHz to match the frequency of an external 60 Hertz power grid.

In a preferred embodiment, the energy conversion system comprises inverse cyclotron converters (ICC) coupled to opposing ends of the fusion reactor. The ICC have a hollow cylinder-like geometry formed from multiple, preferably four or more equal, semi-cylindrical electrodes with small, straight gaps extending there between. In operation, an oscillating potential is applied to the electrodes in an alternating fashion. The electric field E within the ICC has a multi-pole structure and vanishes on the symmetry axes and increases linearly with radius; the peak value being at the gap.

In addition, the ICC includes a magnetic field generator for applying a uniform uni-directional magnetic field in a direction substantially opposite to the applied magnetic field of the fusion reactor's containment system. At an end furthest from the fusion reactor power core the ICC includes an ion collector. In between the power core and the ICC is a symmetric magnetic cusp wherein the magnetic field of the containment system merges with the magnetic field of the ICC. An annular shaped electron collector is positioned about the magnetic cusp and electrically coupled to the ion collector.

In yet another preferred embodiment, product nuclei and charge-neutralizing electrons emerge as annular beams from both ends of the reactor power core with a density at which the magnetic cusp separates electrons and ions due to their energy differences. The electrons follow magnetic field lines to the electron collector and the ions pass through the cusp where the ion trajectories are modified to follow a substantially helical path along the length of the ICC. Energy is removed from the ions as they spiral past the electrodes, which are connected to a resonant circuit. The loss of perpendicular energy tends to be greatest for the highest energy ions that initially circulate close to the electrodes, where the electric field is strongest.

Other aspects and features of the present invention will become apparent from consideration of the following description taken in conjunction with the accompanying drawings.

BRIEF DESCRIPTION OF THE DRAWINGS

Preferred embodiments are illustrated by way of example, and not by way of limitation, in the figures of the accompanying drawings, in which like reference numerals refer to like components.

FIGS. 8A and 8B show, respectively, the electric field and the direction of the $\vec{E} \times \vec{B}$ drift in a FRC.

FIGS. 9A, 9B and 9C show ion drift orbits.

FIGS. 20B and 20C show partial views of the inductive plasma source.

DETAILED DESCRIPTION OF THE PREFERRED EMBODIMENTS

As illustrated in the figures, a plasma-electric power generation (PEG) system of the present invention preferably includes a colliding beam fusion reactor (CBFR) coupled to a direct energy conversion system. As alluded to above, an ideal fusion reactor solves the problem of anomalous transport for both ions and electrons. The solution to the problem of anomalous transport found herein makes use of a containment system with a magnetic field having a field reversed configuration (FRC). The anomalous transport of ions is avoided by magnetic confinement in the FRC in such a way that the majority of the ions have large, non-adiabatic orbits, making them insensitive to short-wavelength fluctuations that cause anomalous transport of adiabatic ions. In particular, the existence of a region in the FRC where the magnetic field vanishes makes it possible to have a plasma comprising a majority of non-adiabatic ions. For electrons, the anomalous transport of energy is avoided by tuning the externally applied magnetic field to develop a strong electric field, which confines them electrostatically in a deep potential well.

Fusion fuel plasmas that can be used with the present confinement apparatus and process are not limited to neutronic fuels such as D-D (Deuterium-Deuterium) or D-T (Deuterium-Tritium), but also advantageously include advanced or aneutronic fuels such as D-He$^3$ (Deuterium-helium-3) or p-B$^{11}$ (hydrogen-Boron-11). (For a discussion of advanced fuels, see R. Feldbacher & M. Heindler, *Nuclear Instruments and Methods in Physics Research*, A271(1988) JJ-64 (North Holland Amsterdam).) For such aneutronic fuels, the fusion reaction energy is almost entirely in the form of charged particles, i.e., energetic ions, that can be manipulated in a magnetic field and, depending on the fuel, cause little or no radioactivity. The D-He$^3$ reaction produces an H ion and an He$^4$ ion with 18.2 MeV energy while the p-B$^{11}$ reaction produces three He$^4$ ions and 8.7 MeV energy. Based on theoretical modeling for a fusion device utilizing aneutronic fuels, the output energy conversion efficiency may be as high as about 90%, as described by K. Yoshikawa, T. Noma and Y. Yamamoto in Fusion Technology, 19, 870 (1991), for example. Such efficiencies dramatically advance the prospects for aneutronic fusion, in a scalable (1-1000 MW), compact, low-cost configuration.

In a direct energy conversion process of the present invention, the charged particles of fusion products can be slowed down and their kinetic energy converted directly to electricity. Advantageously, the direct energy conversion system of the present invention has the efficiencies, particle-energy tolerances and electronic ability to convert the frequency and phase of the fusion output power of about 5 MHz to match the frequency and phase of an external 60 Hertz power grid.

Fusion Containment System

Figure 1:
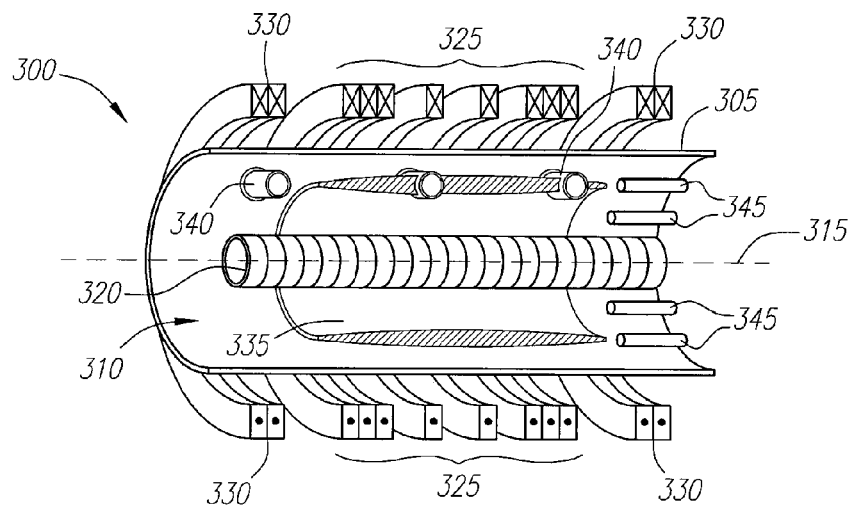
FIG. 1 shows a partial view of an exemplary confinement chamber.

FIG. 1 illustrates a preferred embodiment of a containment system 300 according to the present invention. The containment system 300 comprises a chamber wall 305 that defines therein a confining chamber 310. Preferably, the chamber 310 is cylindrical in shape, with principle axis 315 along the center of the chamber 310. For application of this containment system 300 to a fusion reactor, it is necessary to create a vacuum or near vacuum inside the chamber 310. Concentric with the principle axis 315 is a betatron flux coil 320, located within the chamber 310. The betatron flux coil 320 comprises an electrical current carrying medium adapted to direct current around a long coil, as shown, which preferably comprises parallel windings of multiple separate coils and, most preferably, parallel windings of about four separate coils, to form a long coil. Persons skilled in the art will appreciate that current through the betatron coil 320 will result in a magnetic field inside the betatron coil 320, substantially in the direction of the principle axis 315.

Around the outside of the chamber wall 305 is an outer coil 325. The outer coil 325 produce a relatively constant magnetic field having flux substantially parallel with principle axis 315. This magnetic field is azimuthally symmetrical. The approximation that the magnetic field due to the outer coil 325 is constant and parallel to axis 315 is most valid away from the ends of the chamber 310. At each end of the chamber 310 is a mirror coil 330. The mirror coils 330 are adapted to produce an increased magnetic field inside the chamber 310 at each end, thus bending the magnetic field lines inward at each end. (See FIGS. 3 and 5.) As explained, this bending inward of the field lines helps to contain the plasma 335 in a containment region within the chamber 310 generally between the mirror coils 330 by pushing it away from the ends where it can escape the containment system 300. The mirror coils 330 can be adapted to produce an increased magnetic field at the ends by a variety of methods known in the art, including increasing the number of windings in the mirror coils 330, increasing the current through the mirror coils 330, or overlapping the mirror coils 330 with the outer coil 325.

The outer coil 325 and mirror coils 330 are shown in FIG. 1 implemented outside the chamber wall 305; however, they may be inside the chamber 310. In cases where the chamber wall 305 is constructed of a conductive material such as metal, it may be advantageous to place the coils 325, 330 inside the chamber wall 305 because the time that it takes for the magnetic field to diffuse through the wall 305 may be relatively large and thus cause the system 300 to react sluggishly. Similarly, the chamber 310 may be of the shape of a hollow cylinder, the chamber wall 305 forming a long, annular ring. In such a case, the betatron flux coil 320 could be implemented outside of the chamber wall 305 in the center of that annular ring. Preferably, the inner wall forming the center of the annular ring may comprise a non-conducting material such as glass. As will become apparent, the chamber 310 must be of sufficient size and shape to allow the circulating plasma beam or layer 335 to rotate around the principle axis 315 at a given radius.

The chamber wall 305 may be formed of a material having a high magnetic permeability, such as steel. In such a case, the chamber wall 305, due to induced countercurrents in the material, helps to keep the magnetic flux from escaping the chamber 310, "compressing" it. If the chamber wall were to be made of a material having low magnetic permeability, such as plexiglass, another device for containing the magnetic flux would be necessary. In such a case, a series of closed-loop, flat metal rings could be provided. These rings, known in the art as flux delimiters, would be provided within the outer coils 325 but outside the circulating plasma beam 335. Further, these flux delimiters could be passive or active, wherein the active flux delimiters would be driven with a predetermined current to greater facilitate the containment of magnetic flux within the chamber 310. Alternatively, the outer coils 325 themselves could serve as flux delimiters.

As explained in further detail below, a circulating plasma beam 335, comprising charged particles, may be contained within the chamber 310 by the Lorentz force caused by the magnetic field due to the outer coil 325. As such, the ions in the plasma beam 335 are magnetically contained in large betatron orbits about the flux lines from the outer coil 325, which are parallel to the principle axis 315. One or more beam injection ports 340 are also provided for adding plasma ions to the circulating plasma beam 335 in the chamber 310. In a preferred embodiment, the injector ports 340 are adapted to inject an ion beam at about the same radial position from the principle axis 315 where the circulating plasma beam 335 is contained (i.e., around a null surface described below). Further, the injector ports 340 are adapted to inject ion beams 350 (See FIG. 17) tangent to and in the direction of the betatron orbit of the contained plasma beam 335.

Also provided are one or more background plasma sources 345 for injecting a cloud of non-energetic plasma into the chamber 310. In a preferred embodiment, the background plasma sources 345 are adapted to direct plasma 335 toward the axial center of the chamber 310. It has been found that directing the plasma this way helps to better contain the plasma 335 and leads to a higher density of plasma 335 in the containment region within the chamber 310.

Vacuum Chamber

As described above, application of the containment system of a CBFR, it is necessary to create a vacuum or near vacuum inside the chamber. Since interactions (scattering, charge exchange) between neutrals and plasma fuel always present an energy loss channel, it is critical to limit the residual density in the reactor chamber. Furthermore, impurities resulting from poorly evacuated chambers can lead to contaminating side-reactions during operation and can drain an exorbitant amount of energy during startup as the system has to burn through these residuals.

To achieve a good level vacuum usually involves the use of stainless steel chambers and ports as well as low outgassing materials. In the case of metals, the good vacuum properties are further paired with good structural characteristics. However, conductive materials such as stainless steel and the like, present various problems with regards to their electrical properties. Although these negative effects are all linked, they manifest themselves in different ways. Amongst the most negative characteristics are: Retarded diffusion of magnetic fields through chamber walls, accumulation of electrical charges on the surfaces, drastic alteration of response times of the system to transient signals as well as formation of image currents in the surfaces that impact the desired magnetic topology. Materials that do not have these undesirable characteristics and exhibit good vacuum properties are insulators such as ceramics, glass, quartz and to a lesser degree carbon-fibers. The primary problem with these materials is structural integrity as well as the potential for accidental damage. Fabrication problems such as poor machinability of ceramics are further limitations.

Figure 2A:
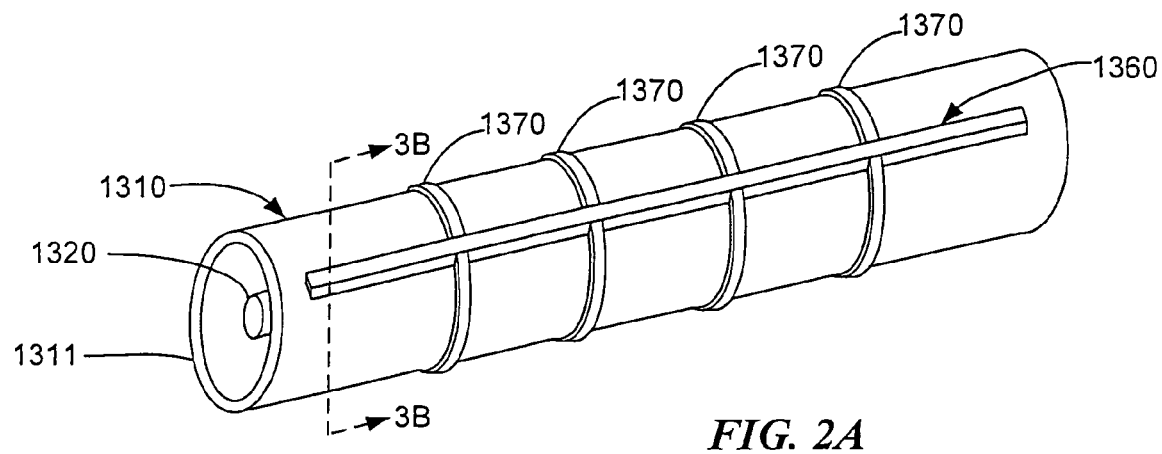
FIG. 2A shows a partial view of another exemplary confinement chamber.
Figure 2B:
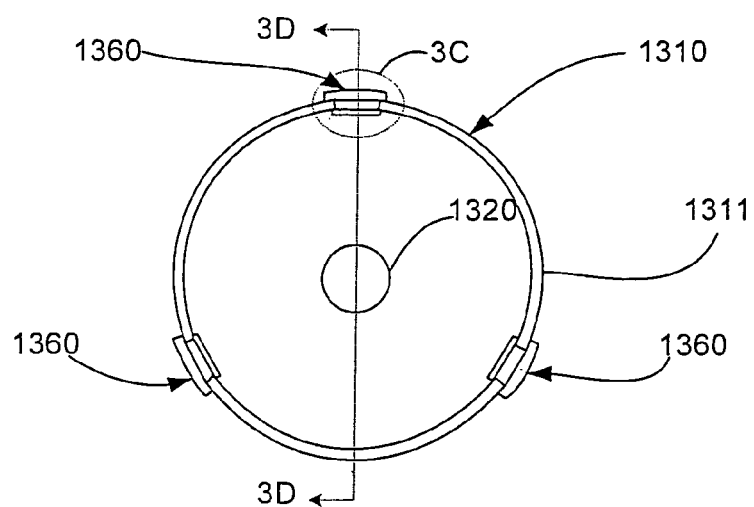
FIG. 2B shows a partial sectional view along line 2B-2B in FIG. 2A.
Figure 2C:
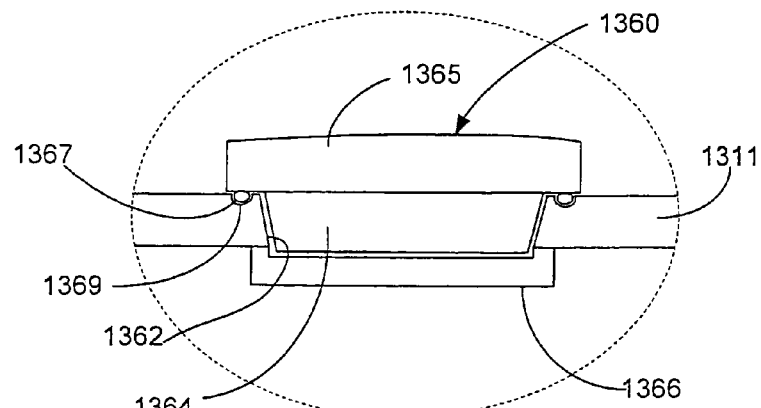
FIG. 2C shows a detail view along line 2C in FIG. 2B.
Figure 2D:
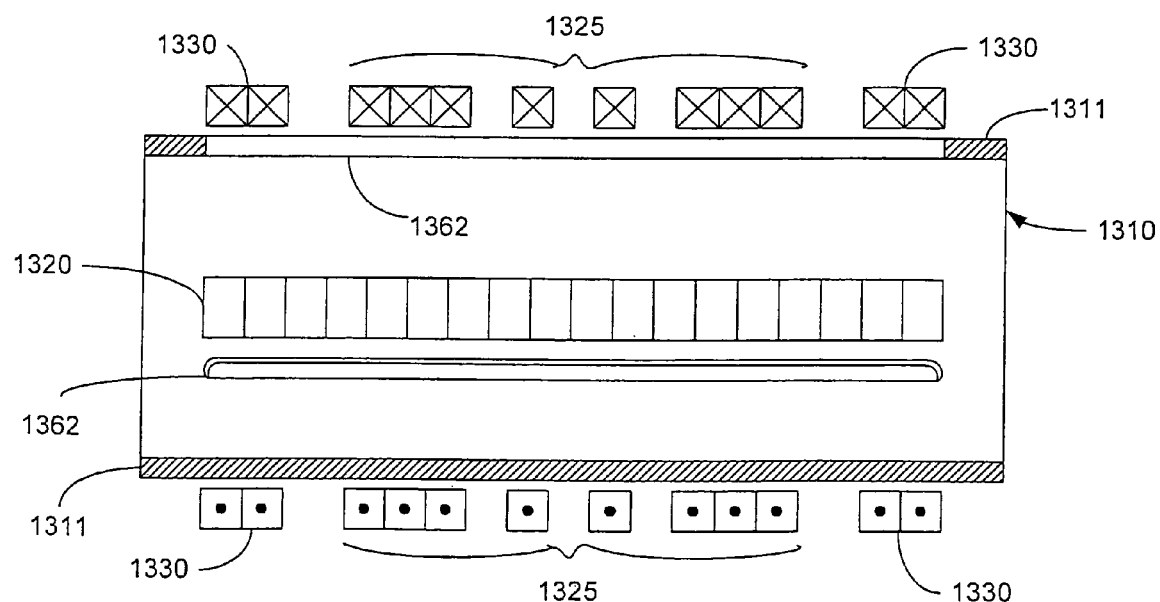
FIG. 2D shows a partial sectional view along line 2D-2D in FIG. 2B.

In one embodiment, as depicted in FIGS. 2A, 2B, 2C and 2D, an alternative chamber 1310 is provided that minimizes these problems. The chamber 1310 of the CBFR is preferably primarily comprised of a metal, preferably stainless steel or the like, to provide structural strength and good vacuum properties. However, the cylindrical wall 1311 of the chamber 1310 includes axial insulating breaks 1360 in the wall 1311 that run along almost the entire length of the chamber 1310 in the central portion of the chamber 1310 or power core region of the CBFR. Preferably, as depicted in FIG. 2B, there are three breaks 1360 that are about 120 degrees apart from each other. The breaks 1360, as depicted in FIG. 2C, include a slot or gap 1362 in the wall 1311 of the chamber 1310 with a seal groove or seat 1369 formed about the periphery of the slot 1362. An O-ring seal 1367 is received in the groove 1369. The slots 1362, as depicted in FIG. 2D, extend almost the entire length of the chamber 1310 leaving sufficient stainless material forming an azimuthally continuous portion of the wall 1311 near the two ends to provide structural integrity and to allow for good quality vacuum seals at the ends. For improved structural integrity and the prevention of implosion, the chamber 1310, as depicted in FIG. 2A, preferably includes a plurality of sets of partial azimuthal ribs 1370 that are integrally formed with the chamber wall 1311 or coupled to the surface of the chamber wall 1311 by welding or the like.

As depicted in FIG. 2C, the gap 1362 is filled with an insert 1364 formed of ceramic material. The insert 1364 extends slightly into the interior of the chamber 1310 and is covered on the inside by a metal shroud 1366 to prevent secondary plasma emission from collisions of primary plasma ions from the circulating plasma beam with the ceramic material. On the outside of the chamber 1310, the insert 1364 is attached to a sealing panel 1365 that forms a vacuum barrier by means of an O-ring seal 1367 with the stainless steel surface of the chamber wall 1311. To preserve desirable vacuum properties, the sealing panel 1365 is preferably formed from a substrate, preferably fiberglass or the like, which is more flexible and creates a tighter seal with the O-ring 1367 than a ceramic material would, especially when inward pressure slightly deforms the chamber 1310.

The inserts or ceramic insulators 1364 inside the slots 1362 preferably prevent current from arching across the gaps 1362 and, thus, prevent the formation of azimuthal image currents in the chamber wall 1311. Image currents are a manifestation of Lenz's Law, which is nature's tendency to counteract any change in flux: for example, the change in flux that occurs in the flux coil 1320 during the formation of a FRC, as described below. Without slots 1362 in the cylindrical wall 1311 of the chamber 1310, the changing flux in the flux coil 1320 causes an equal and opposite inductively induced current to form in the stainless steel wall 1311 such as to cancel the magnetic flux change inside the chamber 1310. While the induced image currents would be weaker (due to inductive losses) than the current applied to the flux coil 1320, the image current tends to strongly reduce the applied or confinement magnetic field within the chamber 1310, which, when not addressed, tends to negatively impact the magnetic field topology and alter the confinement characteristics inside of the chamber 1310. The existence of the slots 1362 prevents azimuthal image currents from forming in the wall 1311 toward the mid-plane of the chamber 1310 away from the ends of the chamber 1310 in the azimuthally continuous portion of the wall 1311. The only image currents that can be carried by the chamber wall 1311 toward the mid-plane away from the ends of the chamber 1310 are very weak currents that flow parallel to the longitudinal axis of the slots 1362. Such currents have no impact on the axial magnetic confinement fields of the FRC as the magnetic image fields produced by the image currents longitudinally traversing the chamber wall 1311 only exhibit radial and azimuthal components. The azimuthal image currents formed in the azimuthally continuous conducting portion of the wall 1311 near the ends of the chamber 1310 tend not to negatively impact and/or alter the confinement characteristics inside of the chamber 1310 as the magnetic topology in this vicinity is not important to confinement of the plasma.

In addition to preventing the formation of azimuthal image currents in the chamber wall 1311, the slots 1362 provide a way for magnetic flux from the field and mirror coils 1325 and 1330 to penetrate the chamber 1310 on a fast timescale. The slots 1362 enable sub-millisecond level fine-tuning and feedback control of the applied magnetic field as a result.

Charged Particles in a FRC

Figure 3:
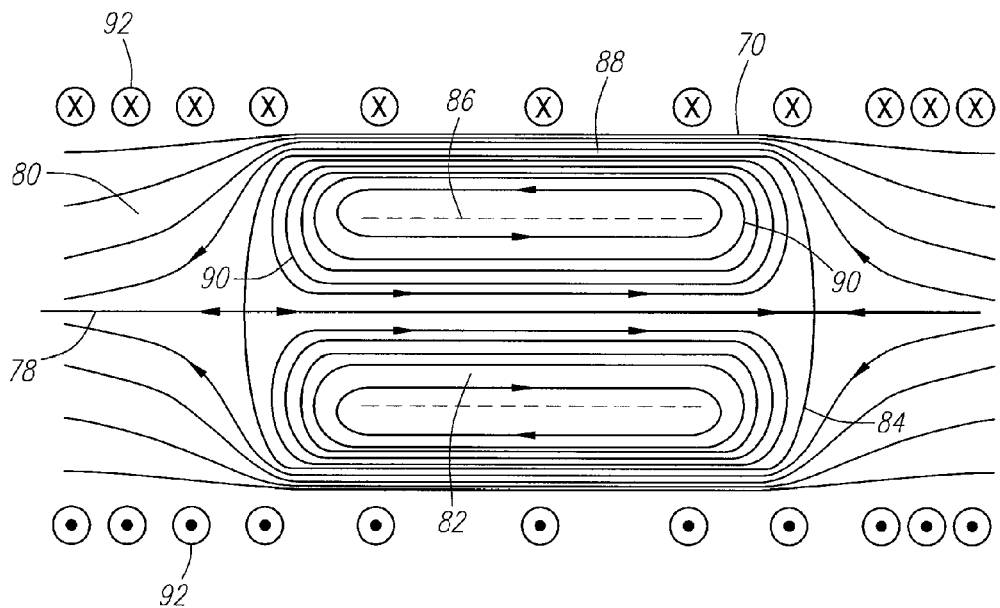
FIG. 3 shows the magnetic field of a FRC.

FIG. 3 shows a magnetic field of a FRC 70. The system has cylindrical symmetry with respect to its axis 78. In the FRC, there are two regions of magnetic field lines: open 80 and closed 82. The surface dividing the two regions is called the separatrix 84. The FRC forms a cylindrical null surface 86 in which the magnetic field vanishes. In the central part 88 of the FRC the magnetic field does not change appreciably in the axial direction. At the ends 90, the magnetic field does change appreciably in the axial direction. The magnetic field along the center axis 78 reverses direction in the FRC, which gives rise to the term "Reversed" in Field Reversed Configuration (FRC).

Figure 4A:
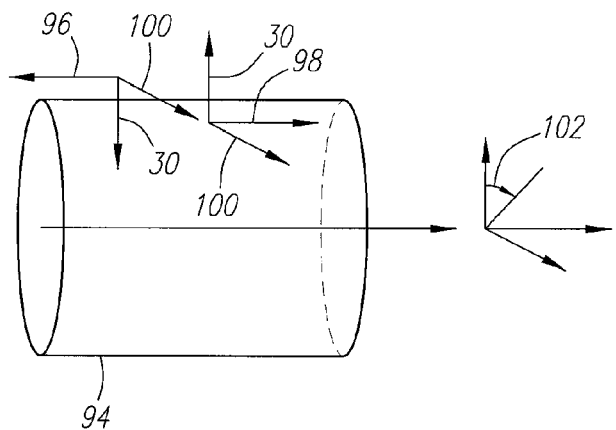
FIGS. 4A and 4B show, respectively, the diamagnetic and the counterdiamagnetic direction in a FRC.

In FIG. 4A, the magnetic field outside of the null surface 94 is in a first direction 96. The magnetic field inside the null surface 94 is in a second direction 98 opposite the first. If an ion moves in the direction 100, the Lorentz force 30 acting on it points towards the null surface 94. This is easily appreciated by applying the right-hand rule. For particles moving in the diamagnetic direction 102, the Lorentz force always points toward the null surface 94. This phenomenon gives rise to a particle orbit called betatron orbit, to be described below.

Figure 4B:
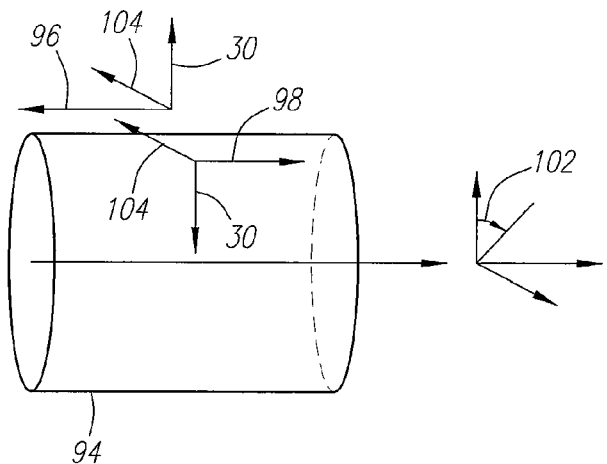

FIG. 4B shows an ion moving in the counterdiamagnetic direction 104. The Lorentz force in this case points away from the null surface 94. This phenomenon gives rise to a type of orbit called a drift orbit, to be described below. The diamagnetic direction for ions is counterdiamagnetic for electrons, and vice versa.

Figure 5:
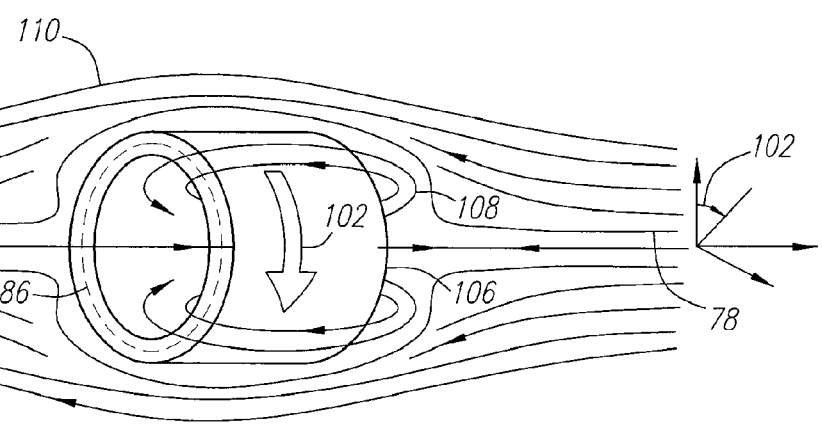
FIG. 5 shows a colliding beam system.

FIG. 5 shows a ring or annular layer of plasma 106 rotating in the ions' diamagnetic direction 102. The ring 106 is located around the null surface 86. The magnetic field 108 created by the annular plasma layer 106, in combination with an externally applied magnetic field 110, forms a magnetic field having the topology of a FRC (The topology is shown in FIG. 3).

The ion beam that forms the plasma layer 106 has a temperature; therefore, the velocities of the ions form a Maxwell distribution in a frame rotating at the average angular velocity of the ion beam. Collisions between ions of different velocities lead to fusion reactions. For this reason, the plasma beam layer or power core 106 is called a colliding beam system.

Figure 6:
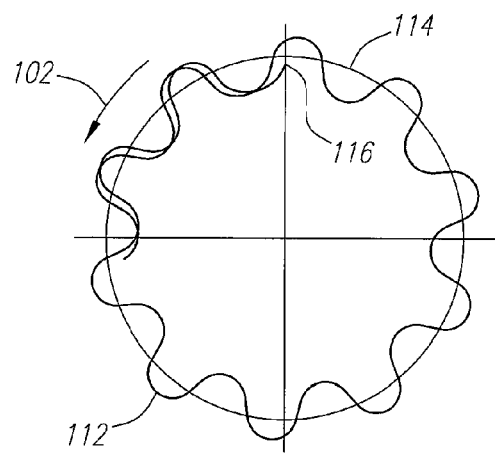
FIG. 6 shows a betatron orbit.

FIG. 6 shows the main type of ion orbits in a colliding beam system, called a betatron orbit 112. A betatron orbit 112 can be expressed as a sine wave centered on the null circle 114. As explained above, the magnetic field on the null circle 114 vanishes. The plane of the orbit 112 is perpendicular to the axis 78 of the FRC. Ions in this orbit 112 move in their diamagnetic direction 102 from a starting point 116. An ion in a betatron orbit has two motions: an oscillation in the radial direction (perpendicular to the null circle 114), and a translation along the null circle 114.

Figure 7A:
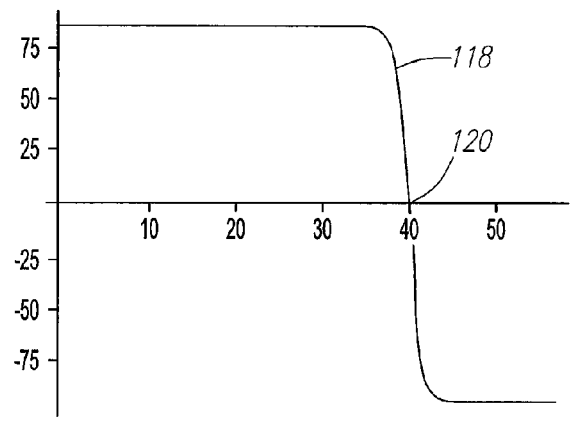
FIGS. 7A and 7B show, respectively, the magnetic field and the direction of the gradient drift in a FRC.

FIG. 7A is a graph of the magnetic field 118 in a FRC. The horizontal axis of the graph represents the distance in centimeters from the FRC axis 78. The magnetic field is in kilogauss. As the graph depicts, the magnetic field 118 vanishes at the null circle radius 120.

Figure 7B:
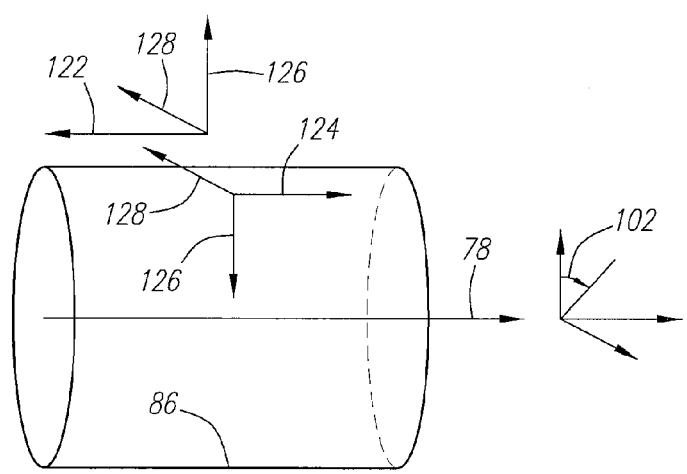

As shown in FIG. 7B, a particle moving near the null circle will see a gradient 126 of the magnetic field pointing away from the null surface 86. The magnetic field outside the null circle is in a first direction 122, while the magnetic field inside the null circle is in a second direction 124 opposite to the first. The direction of a gradient drift is given by the cross product $\vec{B} \times \nabla B$, where $\nabla B$ is the gradient of the magnetic field; thus, it can be appreciated by applying the right-hand rule that the direction of the gradient drift is in the counterdiamagnetic direction, whether the ion is outside or inside the null circle 128.

FIG. 8A is a graph of the electric field 130 in a FRC. The horizontal axis of the graph represents the distance in centimeters from the FRC axis 78. The electric field is in volts/cm. As the graph depicts, the electric field 130 vanishes close to the null circle radius 120.

As shown if FIG. 8B, the electric field for ions is deconfining; it points in directions 132, 134 away from the null surface 86. The magnetic field, as before, is in opposite directions 122,124 inside and outside of the null surface 86. It can be appreciated by applying the right-hand rule that the direction of the $\vec{E} \times \vec{B}$ drift is in the diamagnetic direction 102, whether the ion is outside or inside the null surface 136.

FIGS. 9A and 9B show another type of common orbit in a FRC, called a drift orbit 138. Drift orbits 138 can be outside of the null surface 114, as shown in FIG. 9A, or inside it, as shown in FIG. 9B. Drift orbits 138 rotate in the diamagnetic direction if the $\vec{E} \times \vec{B}$ drift dominates or in the counterdiamagnetic direction if the gradient drift dominates. The drift orbits 138 shown in FIGS. 9A and 9B rotate in the diamagnetic direction 102 from starting point 116.

A drift orbit, as shown in FIG. 9C, can be thought of as a small circle rolling over a relatively bigger circle. The small circle 142 spins around its axis in the sense 144. It also rolls over the big circle 146 in the direction 102. The point 140 will trace in space a path similar to 138.

Figure 10A:
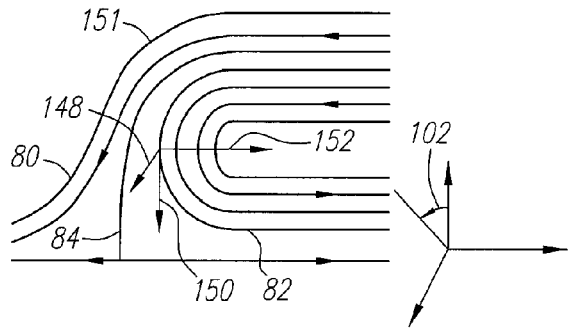
FIGS. 10A and 10B show the Lorentz force at the ends of a FRC.
Figure 10B:
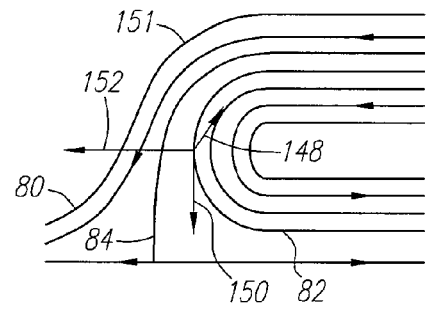

FIGS. 10A and 10B show the direction of the Lorentz force at the ends of a FRC 151. In FIG. 10A, an ion is shown moving in the diamagnetic direction 102 with a velocity 148 in a magnetic field 150. It can be appreciated by applying the right-hand rule that the Lorentz force 152 tends to push the ion back into the region of closed field lines. In this case, therefore, the Lorentz force 152 is confining for the ions. In FIG. 10B, an ion is shown moving in the counterdiamagnetic direction with a velocity 148 in a magnetic field 150. It can be appreciated by applying the right-hand rule that the Lorentz force 152 tends to push the ion into the region of open field lines. In this case, therefore, the Lorentz force 152 is deconfining for the ions.

Magnetic and Electrostatic Confinement in a FRC

A plasma layer 106 (see FIG. 5) can be formed in a FRC by injecting energetic ion beams around the null surface 86 in the diamagnetic direction 102 of ions. (A detailed discussion of different methods of forming the FRC and plasma ring follows below.) In the circulating plasma layer 106, most of the ions have betatron orbits 112 (see FIG. 6), are energetic, and are non-adiabatic; thus, they are insensitive to short-wavelength fluctuations that cause anomalous transport.

In a plasma layer 106 formed in a FRC and under equilibrium conditions, the conservation of momentum imposes a relation between the angular velocity of ions $\omega_i$ and the angular velocity of electrons $\omega_e$. The relation is $$\omega_e = \omega_i \left[1 - \frac{\omega_i}{\Omega_0}\right], \text{ where } \Omega_0 = \frac{ZeB_0}{m_i c}. \tag{1}$$

In Eq. 1, Z is the ion atomic number, $m_i$ is the ion mass, e is the electron charge, $B_0$ is the magnitude of the applied magnetic field, and c is the speed of light. There are three free parameters in this relation: the applied magnetic field $B_0$, the electron angular velocity $\omega_e$, and the ion angular velocity $\omega_i$. If two of them are known, the third can be determined from Eq. 1.

Because the plasma layer 106 is formed by injecting ion beams into the FRC, the angular velocity of ions $\omega_i$ is determined by the injection kinetic energy of the beam $W_i$, which is given by $$W_i = \frac{1}{2} m_i V_i^2 = \frac{1}{2} m_i (\omega_i r_0)^2 \tag{2}$$

Here, $V_i = \omega_i r_0$, where $V_i$ is the injection velocity of ions, $\omega_i$ is the cyclotron frequency of ions, and $r_0$ is the radius of the null surface 86. The kinetic energy of electrons in the beam has been ignored because the electron mass $m_e$ is much smaller than the ion mass $m_i$.

Figure 11A:
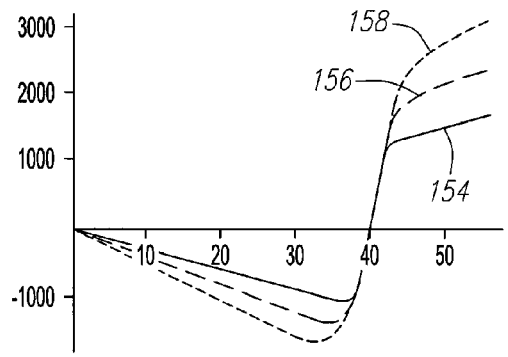
FIGS. 11A and 11B show the tuning of the electric field and the electric potential in the colliding beam system.
Figure 11B:
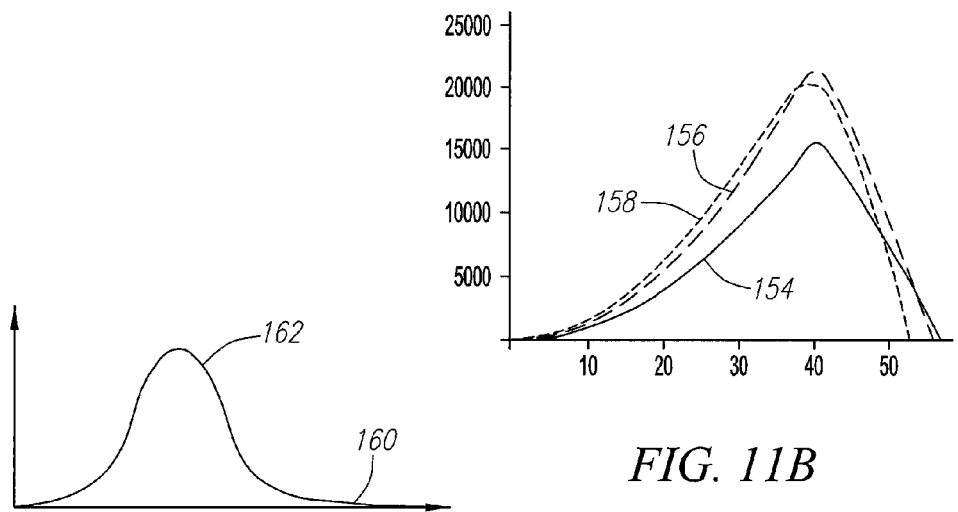

For a fixed injection velocity of the beam (fixed $\omega_i$), the applied magnetic field $B_0$ can be tuned so that different values of $\omega_e$ are obtainable. As will be shown, tuning the external magnetic field $B_0$ also gives rise to different values of the electrostatic field inside the plasma layer. This feature of the invention is illustrated in FIGS. 11A and 11B. FIG. 11A shows three plots of the electric field (in volts/cm) obtained for the same injection velocity, $\omega_i = 1.35 \times 10^7 \text{s}^{-1}$, but for three different values of the applied magnetic field $B_0$:

| Plot | Applied magnetic field ($B_0$) | electron angular velocity ($\omega_e$) |
| --- | --- | --- |
| 154 | $B_0 = 2.77$ kG | $\omega_e = 0$ |
| 156 | $B_0 = 5.15$ kG | $\omega_e = 0.625 \times 10^7 \text{s}^{-1}$ |
| 158 | $B_0 = 15.5$ kG | $\omega_e = 1.11 \times 10^7 \text{s}^{-1}$ |

The values of $\omega_e$ in the table above were determined according to Eq. 1. One can appreciate that $\omega_e > 0$ means that $\Omega_0 > \omega_i$ in Eq. 1, so that electrons rotate in their counterdiamagnetic direction. FIG. 11B shows the electric potential (in volts) for the same set of values of $B_0$ and $\omega_e$. The horizontal axis, in FIGS. 11A and 11B, represents the distance from the FRC axis 78, shown in the graph in centimeters. The electric field and electric potential depend strongly on $\omega_e$.

The above results can be explained on simple physical grounds. When the ions rotate in the diamagnetic direction, the ions are confined magnetically by the Lorentz force. This was shown in FIG. 4A. For electrons, rotating in the same direction as the ions, the Lorentz force is in the opposite direction, so that electrons would not be confined. The electrons leave the plasma and, as a result, a surplus of positive charge is created. This sets up an electric field that prevents other electrons from leaving the plasma. The direction and the magnitude of this electric field, in equilibrium, is determined by the conservation of momentum.

The electrostatic field plays an essential role on the transport of both electrons and ions. Accordingly, an important aspect of this invention is that a strong electrostatic field is created inside the plasma layer 106, the magnitude of this electrostatic field is controlled by the value of the applied magnetic field $B_0$ which can be easily adjusted.

As explained, the electrostatic field is confining for electrons if $\omega_e > 0$. As shown in FIG. 11B, the depth of the well can be increased by tuning the applied magnetic field $B_0$. Except for a very narrow region near the null circle, the electrons always have a small gyroradius. Therefore, electrons respond to short-wavelength fluctuations with an anomalously fast diffusion rate. This diffusion, in fact, helps maintain the potential well once the fusion reaction occurs. The fusion product ions, being of much higher energy, leave the plasma. To maintain charge quasi-neutrality, the fusion products must pull electrons out of the plasma with them, mainly taking the electrons from the surface of the plasma layer. The density of electrons at the surface of the plasma is very low, and the electrons that leave the plasma with the fusion products must be replaced; otherwise, the potential well would disappear.

Figure 12:
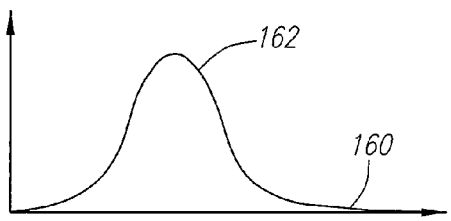
FIG. 12 shows a Maxwell distribution.

FIG. 12 shows a Maxwellian distribution 162 of electrons. Only very energetic electrons from the tail 160 of the Maxwell distribution can reach the surface of the plasma and leave with fusion ions. The tail 160 of the distribution 162 is thus continuously created by electron-electron collisions in the region of high density near the null surface. The energetic electrons still have a small gyroradius, so that anomalous diffusion permits them to reach the surface fast enough to accommodate the departing fusion product ions. The energetic electrons lose their energy ascending the potential well and leave with very little energy. Although the electrons can cross the magnetic field rapidly, due to anomalous transport, anomalous energy losses tend to be avoided because little energy is transported.

Another consequence of the potential well is a strong cooling mechanism for electrons that is similar to evaporative cooling. For example, for water to evaporate, it must be supplied the latent heat of vaporization. This heat is supplied by the remaining liquid water and the surrounding medium, which then thermalize rapidly to a lower temperature faster than the heat transport processes can replace the energy. Similarly, for electrons, the potential well depth is equivalent to water's latent heat of vaporization. The electrons supply the energy required to ascend the potential well by the thermalization process that re-supplies the energy of the Maxwell tail so that the electrons can escape. The thermalization process thus results in a lower electron temperature, as it is much faster than any heating process. Because of the mass difference between electrons and protons, the energy transfer time from protons is about 1800 times less than the electron thermalization time. This cooling mechanism also reduces the radiation loss of electrons. This is particularly important for advanced fuels, where radiation losses are enhanced by fuel ions with an atomic number Z greater than 1;Z>1.

Figure 13A:
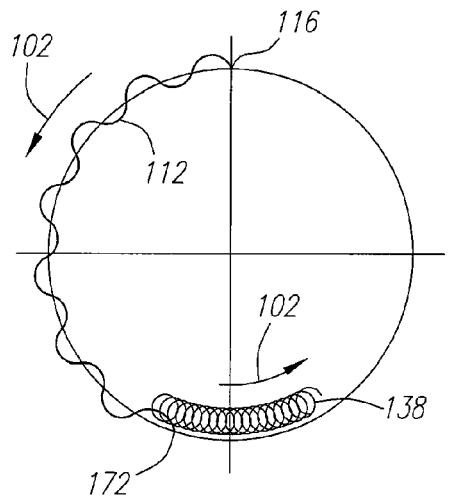
FIGS. 13A and 13B show transitions from betatron orbits to drift orbits due to large-angle, ion-ion collisions.
Figure 13B:
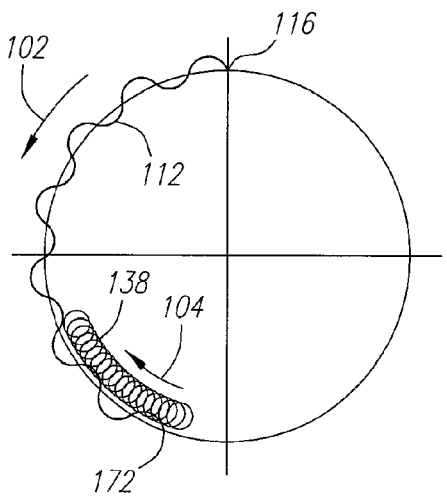

The electrostatic field also affects ion transport. The majority of particle orbits in the plasma layer 106 are betatron orbits 112. Large-angle collisions, that is, collisions with scattering angles between 90° and 180°, can change a betatron orbit to a drift orbit. As described above, the direction of rotation of the drift orbit is determined by a competition between the $\vec{E} \times \vec{B}$ drift and the gradient drift. If the $\vec{E} \times \vec{B}$ drift dominates, the drift orbit rotates in the diamagnetic direction. If the gradient drift dominates, the drift orbit rotates in the counterdiamagnetic direction. This is shown in FIGS. 13A and 13B. FIG. 13A shows a transition from a betatron orbit to a drift orbit due to a 180° collision, which occurs at the point 172. The drift orbit continues to rotate in the diamagnetic direction because the $\vec{E} \times \vec{B}$ drift dominates. FIG. 13B shows another 180° collision, but in this case the electrostatic field is weak and the gradient drift dominates. The drift orbit thus rotates in the counterdiamagnetic direction.

The direction of rotation of the drift orbit determines whether it is confined or not. A particle moving in a drift orbit will also have a velocity parallel to the FRC axis. The time it takes the particle to go from one end of the FRC to the other, as a result of its parallel motion, is called transit time; thus, the drift orbits reach an end of the FRC in a time of the order of the transit time. As shown in connection with FIG. 10A, the Lorentz force at the ends of the FRC is confining only for drift orbits rotating in the diamagnetic direction. After a transit time, therefore, ions in drift orbits rotating in the counterdiamagnetic direction are lost.

This phenomenon accounts for a loss mechanism for ions, which is expected to have existed in all FRC experiments. In fact, in these experiments, the ions carried half of the current and the electrons carried the other half. In these conditions the electric field inside the plasma was negligible, and the gradient drift always dominated the $\vec{E} \times \vec{B}$ drift. Hence, all the drift orbits produced by large-angle collisions were lost after a transit time. These experiments reported ion diffusion rates that were faster than those predicted by classical diffusion estimates.

If there is a strong electrostatic field, the $\vec{E} \times \vec{B}$ drift dominates the gradient drift, and the drift orbits rotate in the diamagnetic direction. This was shown above in connection with FIG. 13A. When these orbits reach the ends of the FRC, they are reflected back into the region of closed field lines by the Lorentz force; thus, they remain confined in the system.

The electrostatic fields in the colliding beam system may be strong enough, so that the $\vec{E} \times \vec{B}$ drift dominates the gradient drift. Thus, the electrostatic field of the system would avoid ion transport by eliminating this ion loss mechanism, which is similar to a loss cone in a mirror device.

Figure 14A:
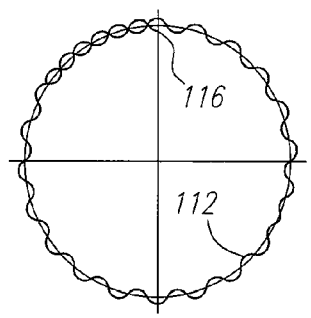
FIGS. 14 show A, B, C and D betatron orbits when small-angle, electron-ion collisions are considered.
Figure 14B:
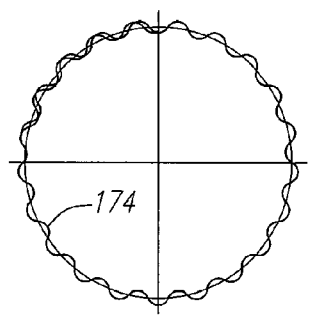
Figure 14C:
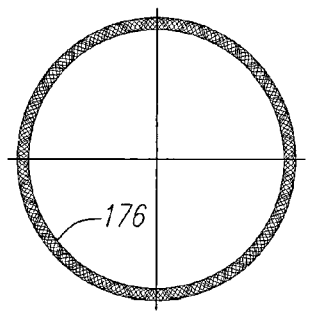
Figure 14D:
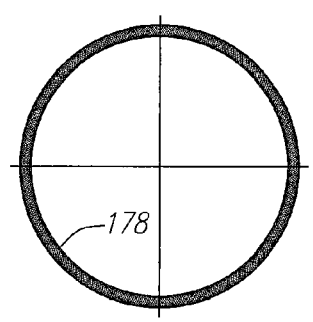

Another aspect of ion diffusion can be appreciated by considering the effect of small-angle, electron-ion collisions on betatron orbits. FIG. 14A shows a betatron orbit 112; FIG. 14B shows the same orbit 112 when small-angle electron-ion collisions are considered 174; FIG. 14C shows the orbit of FIG. 14B followed for a time that is longer by a factor of ten 176; and FIG. 14D shows the orbit of FIG. 14B followed for a time longer by a factor of twenty 178. It can be seen that the topology of betatron orbits does not change due to small-angle, electron-ion collisions; however, the amplitude of their radial oscillations grows with time. In fact, the orbits shown in FIGS. 14A to 14D fatten out with time, which indicates classical diffusion.

Formation of the FRC

Conventional procedures used to form a FRC primarily employ the theta pinch-field reversal procedure. In this conventional method, a bias magnetic field is applied by external coils surrounding a neutral gas back-filled chamber. Once this has occurred, the gas is ionized and the bias magnetic field is frozen in the plasma. Next, the current in the external coils is rapidly reversed and the oppositely oriented magnetic field lines connect with the previously frozen lines to form the closed topology of the FRC (see FIG. 3). This formation process is largely empirical and there exists almost no means of controlling the formation of the FRC. The method has poor reproducibility and no tuning capability as a result.

In contrast, the FRC formation methods of the present invention allow for ample control and provide a much more transparent and reproducible process. In fact, the FRC formed by the methods of the present invention can be tuned and its shape as well as other properties can be directly influenced by manipulation of the magnetic field applied by the outer field coils 325. Formation of the FRC by methods of the present inventions also results in the formation of the electric field and potential well in the manner described in detail above. Moreover, the present methods can be easily extended to accelerate the FRC to reactor level parameters and high-energy fuel currents, and advantageously enables the classical confinement of the ions. Furthermore, the technique can be employed in a compact device and is very robust as well as easy to implement—all highly desirable characteristics for reactor systems.

In the present methods, FRC formation relates to the circulating plasma beam 335. It can be appreciated that the circulating plasma beam 335, because it is a current, creates a poloidal magnetic field, as would an electrical current in a circular wire. Inside the circulating plasma beam 335, the magnetic self-field that it induces opposes the externally applied magnetic field due to the outer coil 325. Outside the plasma beam 335, the magnetic self-field is in the same direction as the applied magnetic field. When the plasma ion current is sufficiently large, the self-field overcomes the applied field, and the magnetic field reverses inside the circulating plasma beam 335, thereby forming the FRC topology as shown in FIGS. 3 and 5.

The requirements for field reversal can be estimated with a simple model. Consider an electric current $I_P$ carried by a ring of major radius $r_0$ and minor radius $a \ll r_0$. The magnetic field at the center of the ring normal to the ring is $B_p = 2\pi I_P/(cr_o)$. Assume that the ring current $I_P = N_p e(\Omega_0/2\pi)$ is carried by $N_p$ ions that have an angular velocity $\Omega_0$. For a single ion circulating at radius $r_0 = V_0/\Omega_0, \Omega_0 = eB_0/m_i c$ is the cyclotron frequency for an external magnetic field $B_0$. Assume $V_0$ is the average velocity of the beam ions. Field reversal is defined as $$B_p = \frac{N_p e \Omega_0}{r_0 c} \geq 2B_0, \quad (3)$$

which implies that $N_p > 2r_0/\alpha_i$, and $$I_p \geq \frac{eV_0}{\pi \alpha_i}, \quad (4)$$

where $\alpha_i = e^2/m_i c^2 = 1.57 \times 10^{-16}$ cm and the ion beam energy is $$\frac{1}{2} m_i V_0^2.$$

In the one-dimensional model, the magnetic field from the plasma current is $B_p = (2\pi/c)i_p$, where $i_p$ is current per unit of length. The field reversal requirement is $i_p > eV_0/\pi r_0 \alpha_i = 0.225$ kA/cm, where $$B_0 = 69.3\ G \text{ and } \frac{1}{2}m_i V_0^2 = 100 \text{ eV}.$$

For a model with periodic rings and $B_z$ is averaged over the axial coordinate $\langle B_z \rangle = (2\pi/c)(I_p/s)$ (s is the ring spacing), if $s=r_0$, this model would have the same average magnetic field as the one dimensional model with $i_p = I_p/s$.

Combined Beam/Betatron Formation Technique

A preferred method of forming a FRC within the confinement system 300 described above is herein termed the combined beam/betatron technique. This approach combines low energy beams of plasma ions with betatron acceleration using the betatron flux coil 320.

Figure 15:
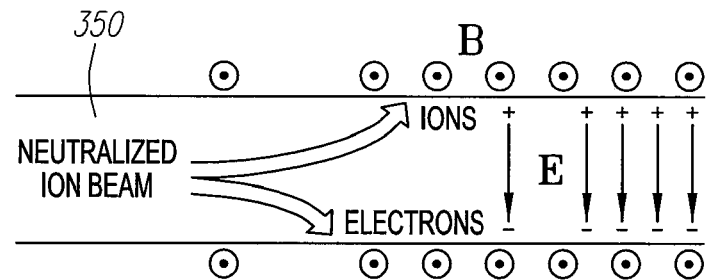
FIG. 15 shows a neutralized ion beam as it is electrically polarized.
Figure 16:
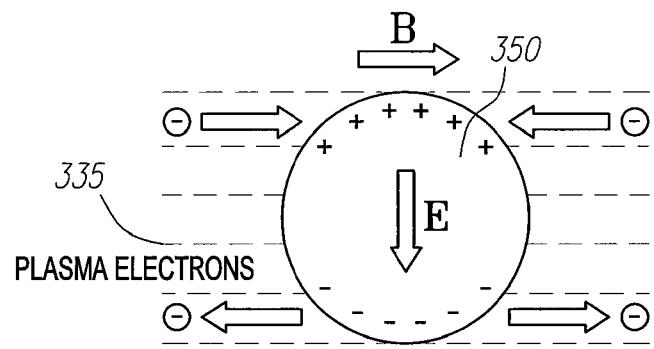
FIG. 16 is a head-on view of a neutralized ion beam as it contacts plasma in a confining chamber.

The first step in this method is to inject a substantially annular cloud layer of background plasma in the chamber 310 using the background plasma sources 345. Outer coil 325 produces a magnetic field inside the chamber 310, which magnetizes the background plasma. At short intervals, low energy ion beams are injected into the chamber 310 through the injector ports 340 substantially transverse to the externally applied magnetic field within the chamber 310. As explained above, the ion beams are trapped within the chamber 310 in large betatron orbits by this magnetic field. The ion beams may be generated by an ion accelerator, such as an accelerator comprising an ion diode and a Marx generator. (see R. B. Miller, *An Introduction to the Physics of Intense Charged Particle Beams*, (1982)). As one of skill in the art can appreciate, the applied magnetic field will exert a Lorentz force on the injected ion beam as soon as it enters the chamber 310; however, it is desired that the beam not deflect, and thus not enter a betatron orbit, until the ion beam reaches the circulating plasma beam 335. To solve this problem, the ion beams are neutralized with electrons and, as illustrated in FIG. 15, when the ion beam 350 is directed through an appropriate magnetic field, such as the unidirectional applied magnetic field within the chamber 310, the positively charged ions and negatively charged electrons separate. The ion beam 350 thus acquires an electric self-polarization due to the magnetic field. This magnetic field also may be produced by, e.g., a permanent magnet or by an electromagnet along the path of the ion beam. When subsequently introduced into the confinement chamber 310, the resultant electric field balances the magnetic force on the beam particles, allowing the ion beam to drift undeflected. FIG. 16 shows a head-on view of the ion beam 350 as it contacts the plasma 335. As depicted, electrons from the plasma 335 travel along magnetic field lines into or out of the beam 350, which thereby drains the beam's electric polarization. When the beam is no longer electrically polarized, the beam joins the circulating plasma beam 335 in a betatron orbit around the principle axis 315, as shown in FIG. 1 (see also FIG. 5).

When the plasma beam 335 travels in its betatron orbit, the moving ions comprise a current, which in turn gives rise to a poloidal magnetic self-field. To produce the FRC topology within the chamber 310, it is necessary to increase the velocity of the plasma beam 335, thus increasing the magnitude of the magnetic self-field that the plasma beam 335 causes. When the magnetic self-field is large enough, the direction of the magnetic field at radial distances from the axis 315 within the plasma beam 335 reverses, giving rise to a FRC. (See FIGS. 3 and 5). It can be appreciated that, to maintain the radial distance of the circulating plasma beam 335 in the betatron orbit, it is necessary to increase the applied magnetic field from the outer coil 325 as the circulating plasma beam 335 increases in velocity. A control system is thus provided for maintaining an appropriate applied magnetic field, dictated by the current through the outer coil 325. Alternatively, a second outer coil may be used to provide the additional applied magnetic field that is required to maintain the radius of the plasma beam's orbit as it is accelerated.

Figure 17:
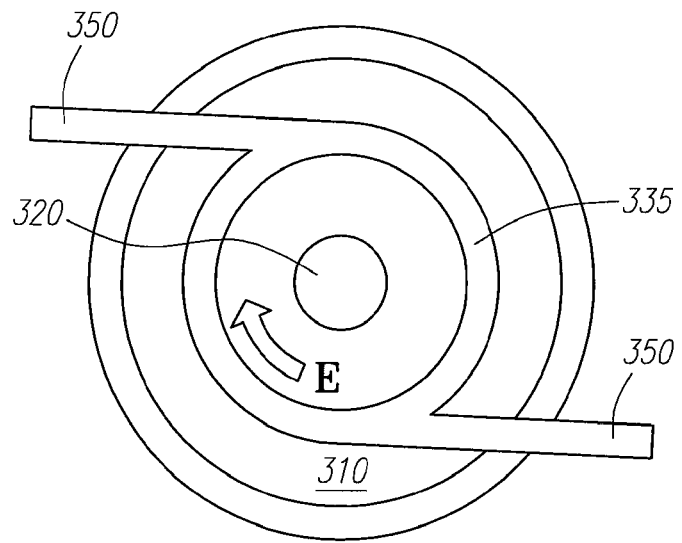
FIG. 17 is an end view schematic of a confining chamber according to a preferred embodiment of a start-up procedure.

To increase the velocity of the circulating plasma beam 335 in its orbit, the betatron flux coil 320 is provided. Referring to FIG. 17, it can be appreciated that increasing a current through the betatron flux coil 320, by Ampere's Law, induces an azimuthal electric field, E, inside the chamber 310. The positively charged ions in the plasma beam 335 are accelerated by this induced electric field, leading to field reversal as described above. When ion beams 350, which are neutralized and polarized as described above, are added to the circulating plasma beam 335, the plasma beam 335 depolarizes the ion beams.

For field reversal, the circulating plasma beam 335 is preferably accelerated to a rotational energy of about 100 eV, and preferably in a range of about 75 eV to 125 eV. To reach fusion relevant conditions, the circulating plasma beam 335 is preferably accelerated to about 200 keV and preferably to a range of about 100 keV to 3.3 MeV.

FRC formation was successfully demonstrated utilizing the combined beam/betatron formation technique. The combined beam/betatron formation technique was performed experimentally in a chamber 1 m in diameter and 1.5 m in length using an externally applied magnetic field of up to 500 G, a magnetic field from the rotating plasma induced by the betatron flux coil 320 of up to 5 kG, and a vacuum of $1.2 \times 10^{-5}$ torr. In the experiment, the background plasma had a density of $10^{13}$ cm$^{-3}$ and the ion beam was a neutralized Hydrogen beam having a density of $1.2 \times 10^{13}$ cm$^{-3}$, a velocity of $2 \times 10^7$ cm/s, and a pulse length of around 20 μs (at half height). Field reversal was observed.

Betatron Formation Technique

Another preferred method of forming a FRC within the confinement system 300 is herein termed the betatron formation technique. This technique is based on driving the betatron induced current directly to accelerate a circulating plasma beam 335 using the betatron flux coil 320. A preferred embodiment of this technique uses the confinement system 300 depicted in FIG. 1, except that the injection of low energy ion beams is not necessary.

As indicated, the main component in the betatron formation technique is the betatron flux coil 320 mounted in the center and along the axis of the chamber 310. Due to its separate parallel windings construction, the coil 320 exhibits very low inductance and, when coupled to an adequate power source, has a low LC time constant, which enables rapid ramp up of the current in the flux coil 320.

Preferably, formation of the FRC commences by energizing the external field coils 325, 330. This provides an axial guide field as well as radial magnetic field components near the ends to axially confine the plasma injected into the chamber 310. Once sufficient magnetic field is established, the background plasma sources 345 are energized from their own power supplies. Plasma emanating from the guns streams along the axial guide field and spreads slightly due to its temperature. As the plasma reaches the mid-plane of the chamber 310, a continuous, axially extending, annular layer of cold, slowly moving plasma is established.

At this point the betatron flux coil 320 is energized. The rapidly rising current in the coil 320 causes a fast changing axial flux in the coil's interior. By virtue of inductive effects this rapid increase in axial flux causes the generation of an azimuthal electric field E (see FIG. 18), which permeates the space around the flux coil. By Maxwell's equations, this electric field E is directly proportional to the change in strength of the magnetic flux inside the coil, i.e.: a faster betatron coil current ramp-up will lead to a stronger electric field.

Figure 18:
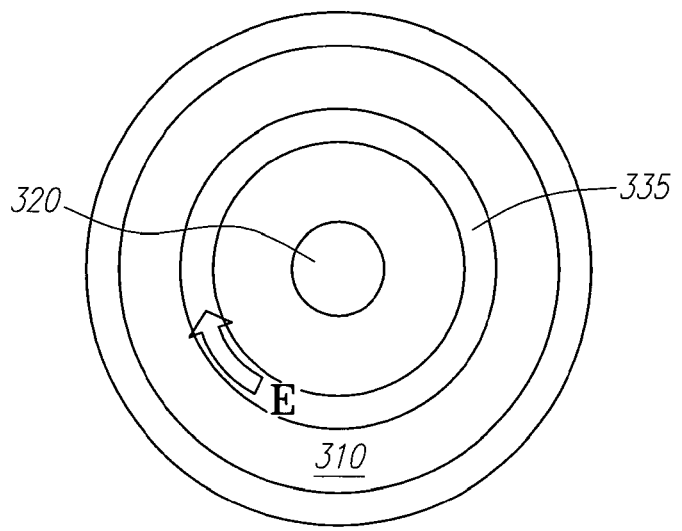
FIG. 18 is an end view schematic of a confining chamber according to another preferred embodiment of a start-up procedure.

The inductively created electric field E couples to the charged particles in the plasma and causes a ponderomotive force, which accelerates the particles in the annular plasma layer. Electrons, by virtue of their smaller mass, are the first species to experience acceleration. The initial current formed by this process is, thus, primarily due to electrons. However, sufficient acceleration time (around hundreds of micro-seconds) will eventually also lead to ion current. Referring to FIG. 18, this electric field E accelerates the electrons and ions in opposite directions. Once both species reach their terminal velocities, current is carried about equally by ions and electrons.

As noted above, the current carried by the rotating plasma gives rise to a self magnetic field. The creation of the actual FRC topology sets in when the self magnetic field created by the current in the plasma layer becomes comparable to the applied magnetic field from the external field coils 325, 330. At this point magnetic reconnection occurs and the open field lines of the initial externally produced magnetic field begin to close and form the FRC flux surfaces (see FIGS. 3 and 5).

The base FRC established by this method exhibits modest magnetic field and particle energies that are typically not at reactor relevant operating parameters. However, the inductive electric acceleration field will persist, as long as the current in the betatron flux coil 320 continues to increase at a rapid rate. The effect of this process is that the energy and total magnetic field strength of the FRC continues to grow. The extent of this process is, thus, primarily limited by the flux coil power supply, as continued delivery of current requires a massive energy storage bank. However, it is, in principle, straightforward to accelerate the system to reactor relevant conditions.

For field reversal, the circulating plasma beam 335 is preferably accelerated to a rotational energy of about 100 eV, and preferably in a range of about 75 eV to 125 eV. To reach fusion relevant conditions, the circulating plasma beam 335 is preferably accelerated to about 200 keV and preferably to a range of about 100 keV to 3.3 MeV. When ion beams are added to the circulating plasma beam 335, as described above, the plasma beam 335 depolarizes the ion beams.

FRC formation utilizing the betatron formation technique was successfully demonstrated at the following parameter levels:

Vacuum chamber dimensions: about 1 m diameter, 1.5 m length.
Betatron coil radius of 10 cm.
Plasma orbit radius of 20 cm.
Mean external magnetic field produced in the vacuum chamber was up to 100 Gauss, with a ramp-up period of 150 µs and a mirror ratio of 2 to 1. (Source: Outer coils and betatron coils).
The background plasma (substantially Hydrogen gas) was characterized by a mean density of about $10^{13}$ cm$^{-3}$, kinetic temperature of less than 10 eV.
The lifetime of the configuration was limited by the total energy stored in the experiment and generally was around 30 µs.

The experiments proceeded by first injecting a background plasma layer by two sets of coaxial cable guns mounted in a circular fashion inside the chamber. Each collection of 8 guns was mounted on one of the two mirror coil assemblies. The guns were azimuthally spaced in an equidistant fashion and offset relative to the other set. This arrangement allowed for the guns to be fired simultaneously and thereby created an annular plasma layer.

Upon establishment of this layer, the betatron flux coil was energized. Rising current in the betatron coil windings caused an increase in flux inside the coil, which gave rise to an azimuthal electric field curling around the betatron coil. Quick ramp-up and high current in the betatron flux coil produced a strong electric field, which accelerated the annular plasma layer and thereby induced a sizeable current. Sufficiently strong plasma current produced a magnetic self-field that altered the externally supplied field and caused the creation of the field reversed configuration. Detailed measurements with B-dot loops identified the extent, strength and duration of the FRC.

Figure 19:
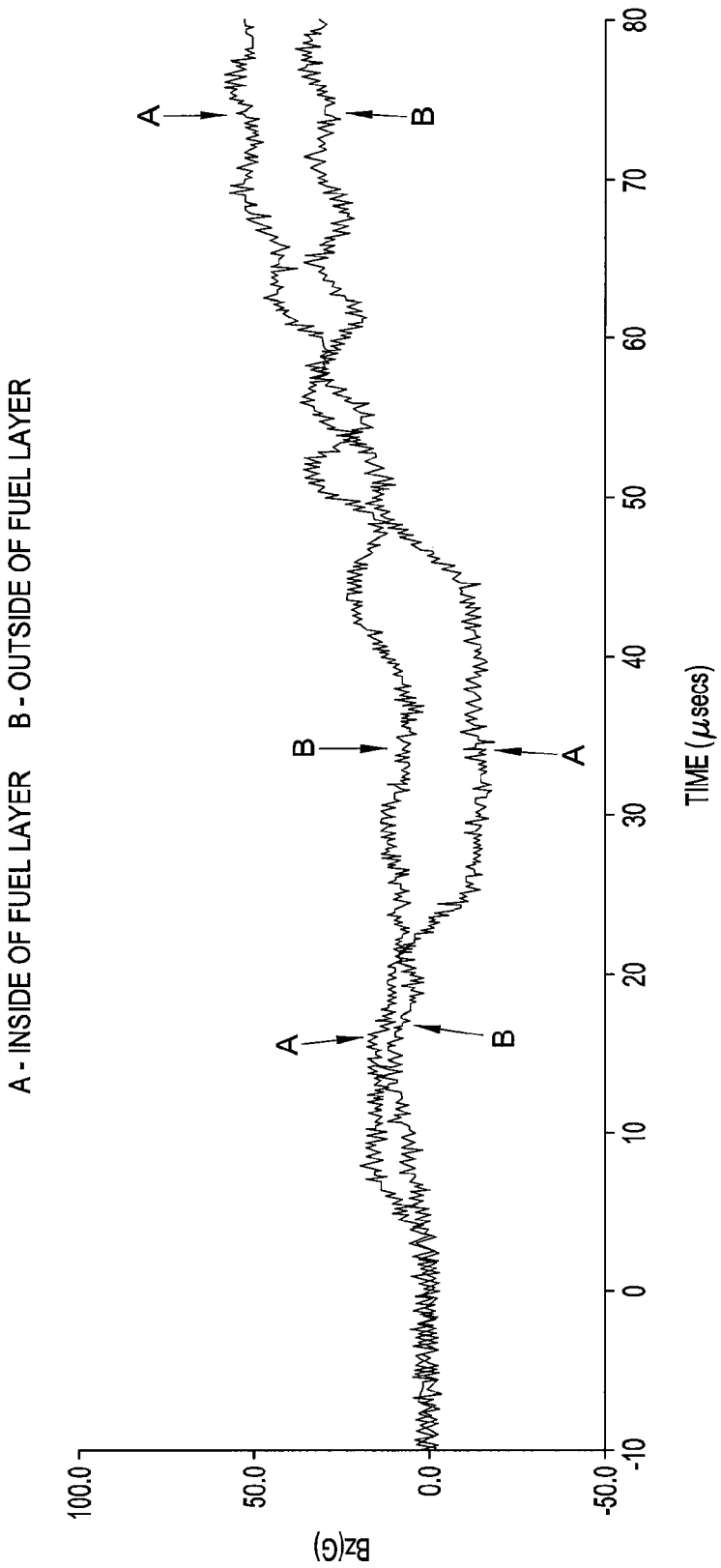
FIG. 19 shows traces of B-dot probe indicating the formation of a FRC.

An example of typical data is shown by the traces of B-dot probe signals in FIG. 19. The data curve A represents the absolute strength of the axial component of the magnetic field at the axial mid-plane (75 cm from either end plate) of the experimental chamber and at a radial position of 15 cm. The data curve B represents the absolute strength of the axial component of the magnetic field at the chamber axial mid-plane and at a radial position of 30 cm. The curve A data set, therefore, indicates magnetic field strength inside of the fuel plasma layer (between betatron coil and plasma) while the curve B data set depicts the magnetic field strength outside of the fuel plasma layer. The data clearly indicates that the inner magnetic field reverses orientation (is negative) between about 23 and 47 µs, while the outer field stays positive, i.e., does not reverse orientation. The time of reversal is limited by the ramp-up of current in the betatron coil. Once peak current is reached in the betatron coil, the induced current in the fuel plasma layer starts to decrease and the FRC rapidly decays. Up to now the lifetime of the FRC is limited by the energy that can be stored in the experiment. As with the injection and trapping experiments, the system can be upgraded to provide longer FRC lifetime and acceleration to reactor relevant parameters.

Overall, this technique not only produces a compact FRC, but it is also robust and straightforward to implement. Most importantly, the base FRC created by this method can be easily accelerated to any desired level of rotational energy and magnetic field strength. This is crucial for fusion applications and classical confinement of high-energy fuel beams.

Inductive Plasma Source

The betatron and beam/betatron FRC formation techniques describe above, both rely on imparting energy to a background plasma via the flux coil 320. Analogous to a transformer, the flux coil performs the duties of the primary windings of the transformer, while the plasma acts as the secondary windings. For this inductive system to work efficiently, it is imperative that the plasma is a good conductor.

Counter to typical conductors, such as metals, a plasma becomes less resistive and, thus, more conductive as its temperature increases. The temperature of plasma electrons, in particular, plays an important role and, to a large degree, determines dissipation, which is a function of electron-ion collisions. In essence, dissipation is due to resistance, which is caused by electron-ion collisions: the higher the collision frequency, the higher the resistivity. This is due to the collective phenomena in a plasma, where the coulomb collision cross-section is screened. The collision frequency (the rate at which successive collisions occur) is essentially a function of density, screened coulomb scattering cross-section and thermal (or average) velocity of the colliding/scattering charges, i.e.: $v_c = n\sigma v$. By definition v scales with $T^{1/2}$, σ is proportional to $v^{-4}$ or, thus, $T^{-2}$. The collision frequency $v_c$ is, therefore, proportional to $nT^{-3/2}$. The resistivity is related to the collision frequency by $\eta=v_c m/ne^2$. Hence, the resistivity is proportional to $T^{-3/2}$ and, notably, independent of density—a direct result of the fact that even though the number of charge carriers increases with density, the number of scattering centers increases as well. Thus, higher temperature leads to higher plasma conductivity and less dissipative losses.

To achieve better performance with regard to confinement in an FRC, a hot plasma is, therefore, highly desirable. In the case of the PEG system, enhanced electron temperature leads to improved FRC startup (the better a conductor the plasma becomes, the better the inductive coupling between the plasma and flux coil), better current sustainment (reduced plasma resistivity leads to less frictional/dissipative losses and hence less current loss) and higher magnetic field strength (the stronger the current, the more self-field). Adequate electron temperature during initial plasma formation and before the flux coil is engaged will lead to better coupling of the flux coil to the plasma (which advantageously tends to reduce the formation of azimuthal image currents in the chamber wall). This in turn will result in enhanced betatron acceleration (less resistivity leads to better inductive transfer of energy from flux coil to plasma) and plasma heating (some of the imparted directional energy as represented by the rotating current flow will thermalize and turn to random energy—ultimately leading to heating of the plasma by the flux coil), which will consequently increase the ion-electron collision time (due to higher temperature), reduce dissipation (less resistivity) and allow ultimately for the attainment of higher FRC fields (higher currents lead to stronger fields).

Figure 20A:
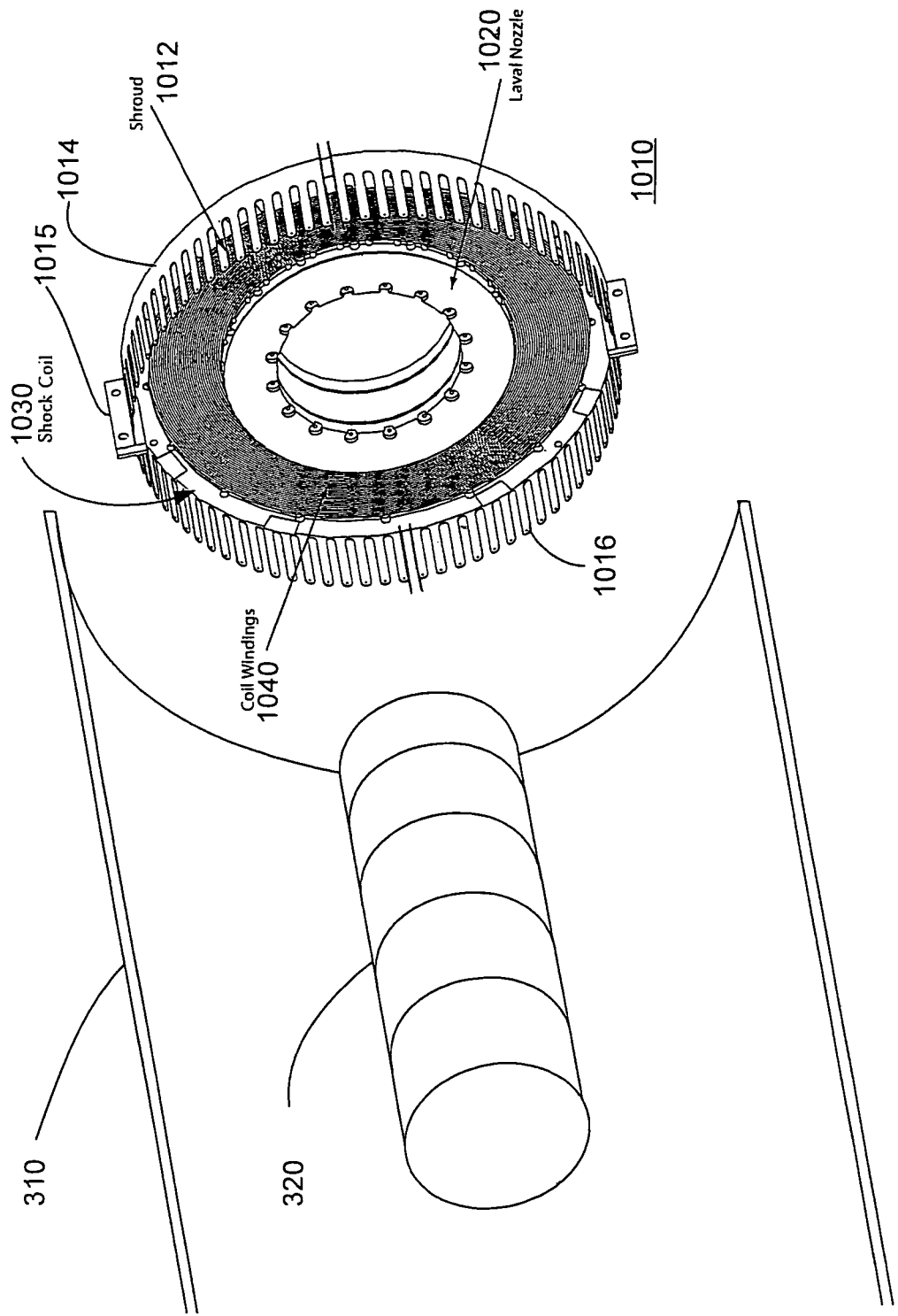
FIG. 20A shows a view of an inductive plasma source mountable within a chamber.

To achieve better initial plasma temperature, an inductive plasma source is provided. As depicted in FIGS. 20A, 20B and 20C, the inductive plasma source 1010 is mountable within the chamber 310 about the end of the flux coil 320 and includes a single turn shock coil assembly 1030 that is preferably fed by a high voltage (about 5-15 kV) power source (not shown). Neutral gas, such as Hydrogen (or other appropriate gaseous fusion fuel), is introduced into the source 1010 through direct gas feeds via a Laval nozzle 1020. The gas flow is controlled preferably by sets of ultra fast puff valves to produce a clean shock front. Once the gas emanates from the nozzle 1020 and distributes itself over the surface of the coil windings 1040 of the shock coil 1030, the windings 1040 are energized. The ultra fast current and flux ramp-up in the low inductance shock coil 1030 leads to a very high electric field within the gas that causes breakdown, ionization and subsequent ejection of the formed plasma from the surface of the shock coil 1030 towards the center of the chamber 310.

In a preferred embodiment, the shock coil 1030 comprises an annular disc shaped body 1032 bounded by an outer ring 1034 formed about its outer periphery and an annular hub 1036 formed about its inner periphery. The ring 1034 and hub 1036 extend axially beyond the surface of the body 1032 forming the edges of a open top annular channel 1035. The body 1032, ring 1034 and hub 1036 are preferably formed through unitary molded construction of an appropriate non-conductive material with good vacuum properties and low outgassing properties such as glass, plexiglass, pirex, quartz, ceramics or the like.

A multi-sectioned shroud 1012 is preferably coupled to the ring 1034 of the shock coil 1030 to limit the produced plasma from drifting radially. Each section 1014 of the shroud 1012 includes a plurality of axially extending fingers 1016. The ends of each section 1014 include a mounting bracket 1015.

The coil windings 1040 are preferably affixed to the face of the coil body 1032 in the channel 1035 using epoxy or some other appropriate adhesive. To obtain fast electro-magnetic characteristics of the shock coil 1030, it is important to keep its inductance as low as possible. This is achieved by using as few turns in the coil 1040 as possible, as well as building the coil 1040 up of multiple strands of wire 1042 that are wound in parallel. In an exemplary embodiment, the coil 1040 comprised 24 parallel strands of wire 1042, each of which executed one loop. The wires 1042 each begin at entry points 1044 that are located preferably about 15 degrees apart on the outer perimeter of the body 1032 and end after only one axis encircling turn at exit points 1046 on the inner radius of the body 1032. The coil windings 1040, therefore, cover the entire area between the inner and outer edges of channel 1035. Preferably, groups of strands 1042 are connected to the same capacitive storage bank. In general, power can be fed to all strands 1042 from the same capacitive storage bank or, as in an exemplary embodiment, 8 groups of 3 strands 1042 each are connected together and commonly fed by one of 2 separate capacitive storage banks.

An annular disc-shaped nozzle body 1022 is coupled about its inner perimeter to the hub 1036 to form the Laval nozzle 1020. The surface 1024 of the nozzle body 1022 facing the hub 1036 has an expanding midsection profile defining an annular gas plenum 1025 between the surface 1024 and the face 1037 of the hub 1036. Adjacent the outer periphery of the nozzle body 1022, the surface 1024 has a contracting-to-expanding profile defining an azimuthally extending Laval-type nozzle outlet 1023 between the surface 1024 and the face 1037 of the hub 1036.

Attached to the opposite side of the hub 1036 is a valve seat ring 1050 with several valve seats 1054 formed in the outer face of the ring 1050. The valve seats 1054 are aligned with gas feed channels 1052 formed through the hub 1036.

In operation, neutral gas is feed through ultra fast puff valves in the valve seats 1054 to the gas channels 1052 extending through the hub 1036. Because of the constricting portion of the nozzle outlet 1023, the gas tends to feed into and fill the annular plenum 1025 prior to emanating from the nozzle 1020. Once the gas emanates from the nozzle 1020 and distributes itself over the surface of the coil windings 1040 of the shock coil 1030, the windings 1040 are energized. The ultra fast current and flux ramp-up in the low inductance shock coil 1030 leads to a very high electric field within the gas that causes breakdown, ionization and subsequent ejection of the formed plasma from the surface of the shock coil 1030 towards the center of the chamber 310.

The current ramp-up is preferably well synchronized in all strands 1042 or groups of strands 1042 that are intended to be fired together. Another option that is possible and potentially advantageous, is to fire different groups of strands at different times. A delay can be deliberately instituted between engaging different groups of strands 1042 to fire different groups of strands at different times. When firing different groups of strands at different times it is important to group strands in a way so that the arrangement is azimuthally symmetric and provides sufficient coverage of the surface of the coil 1040 with current carrying wires 1042 at any given power pulse. In this fashion it is possible to create at least two consecutive but distinct plasma pulses. The delay between pulses is limited by how much neutral gas is available. In practice, it is possible to fire such pulses between about 5 and 600 micro-seconds apart.

In practice, the input operating parameters are preferably as follows:
  Charging Voltage: about 10 to 25 kV split supply
  Current: up to about 50 kA total current through all windings combined
  Pulse/Rise Time: up to about 2 microseconds Gas Pressure: about −20 to 50 psi Plenum size: about 0.5 to 1 cm³ per valve—i.e.: about 4 to 8 cm³ total gas volume per shot In an exemplary embodiment, the input operating parameters were as follows:

Charging Voltage: 12 to 17 kV split supply, i.e.: from −12 kV to +12 kV

Current: 2 to 4.5 kA per group of 3 strands, i.e.: 16 to 36 kA total current through all windings combined Pulse/Rise Time: 1 to 1.5 microseconds Gas Pressure: −15 to 30 psi Plenum size: 0.5 to 1 cm³ per valve—i.e.: 4 to 8 cm³ total gas volume per shot The plasma created by this operational method of the inductive plasma source 1010 using the parameters noted above has the following advantageous characteristics:

Density ~4×10¹³ cm⁻³

Temperature ~10-20 eV

Annular scale ~40-50 cm diameter

Axial drift velocity ~5-10 eV.

Due to the shape and orientation of the source 1010, the shape of the emerging plasma is annular and has a diameter tending to equal the rotating plasma annulus of the to be formed FRC. In a PEG present system two such inductive plasma sources 1010 are preferably placed on either axial end of the chamber 310 and preferably fired in parallel. The two formed plasma distributions drift axially towards the center of the chamber 310 where they form the annular layer of plasma that is then accelerated by the flux coil 320 as described above.

RF Drive For Ions and Electrons in FRC

A RF current drive, called a rotomak, has been employed for FRCs in which the current is carried mainly by electrons. It involves a rotating radial magnetic field produced by two phased antennas. The electrons are magnetized and frozen to the rotating magnetic field lines. This maintains the current until Coulomb collisions of the ions with electrons cause the ions to be accelerated and reduce the current. The rotomak, however, is not suitable for maintaining the current indefinitely, but it has been successful for milliseconds.

In the FRCs of the present system the current is mainly carried by ions that are in betatron orbits which would not be frozen to rotating magnetic field lines. The large orbit ions are important for stability and classical diffusion. Instead of antennas, electrodes are employed as in cyclotrons and the ions are driven by an electrostatic wave. The problem is completely electrostatic because the frequency of the RF is less than 10 Megacycles so that the wavelength (30 m) is much longer than any dimension of the plasma. Electrostatic fields can penetrate the FRC plasma much more easily than electromagnetic waves.

The electrostatic wave produced by the electrodes is designed to travel at a speed that is close to the average azimuthal velocity of the ions, or of the electrons. If the wave travels faster than the average speed of the ions, it will accelerate them and thereby compensate for the drag due to the ion-electron collisions. Electrons, however, are accelerated by Coulomb collisions with the ions. In this case the wave must have a speed slower than the electron average velocity and the electrons will accelerate the wave. The average electron velocity is less than the average ion velocity so that the electrons must be driven at two different frequencies. The higher frequency will be for ions and energy is preferably supplied by the external circuit. For electrons, energy can be extracted at the lower frequency.

Electrode Systems

Figures 21A, 21B:
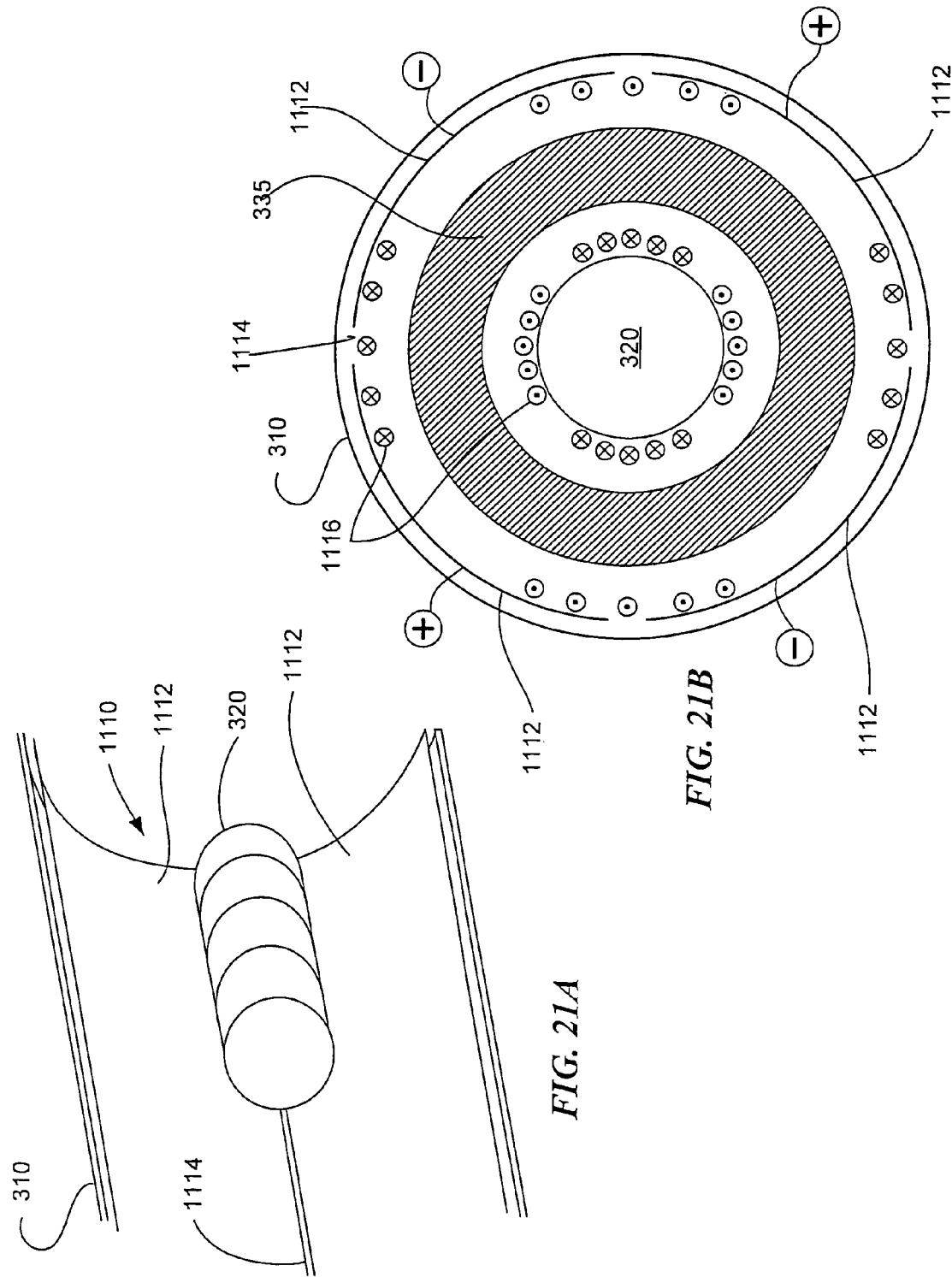
FIGS. 21A and 21B show partial views of a RF drive system.

A quadrupole RF drive system is shown in FIG. 21A and 21B. As depicted, the RF drive comprises a quadrupolar cyclotron 1110 located within the chamber 310 and having four elongate, azimuthally symmetrical electrodes 1112 with gaps 1114 there between. The quadrupole cyclotron 1110 preferably produces an electric potential wave that rotates in the same direction as the azimuthal velocity of ions, but at a greater velocity. Ions of appropriate speed can be trapped in this wave, and reflected periodically. This process increases the momentum and energy of the fuel ions and this increase is conveyed to the fuel ions that are not trapped by collisions. Fuel ions from the fuel plasma 335 may be replaced by injecting neutrals at any convenient velocity.

An alternative and supplemental method to drive current is to augment the electrode system with additional magnetic field coils 1116 positioned about the flux coil 325 and quadrupole cyclotron 1110, and that are driven at half the frequency of the cyclotron electrodes 1112. The following discussion presented here, however, is dedicated to illustrate the electrode only version (without magnetic field coils 1116).

Figure 21C:
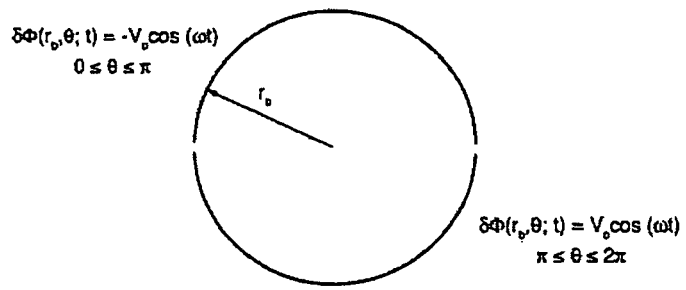
FIG. 21C shows a schematic of dipole and quadrupole configurations.
Figure 21C:
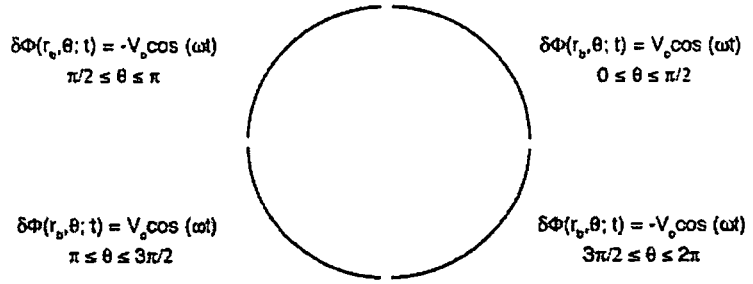

In FIG. 21C electrodes are illustrated for two and four electrode configurations.

The potential created by the electrodes with the indicated applied voltages are noted in FIG. 21C for vacuum in the space $r<r_b$. The expressions are for the lowest harmonic. They are obtained by solving the Laplace equation $$\left(\frac{1}{r}\frac{\partial}{\partial r}r\frac{\partial}{\partial r} + \frac{1}{r^2}\frac{\partial}{\partial \theta^2}\right)\Phi(r,\theta;t) = 0 \quad (5)$$

with appropriate boundary conditions. For example for the dipole cyclotron $$\Phi(r_b, t) = -V_o \cos\omega t \text{ for } 0 \leq \theta \leq \pi \quad (6)$$
$$= V_o \cos\omega t \text{ for } \pi \leq \theta \leq 2\pi$$

$\Phi(r, \theta; t)$ is finite.

Since $\Phi(r, \theta\bullet, t)$ is periodic in $\theta$ with a period $2\pi$, it can be expanded in a Fourier series, i.e.:

$$\Phi(r,\theta;t) = \sum_{n=-\infty}^{\infty} u_n(r,t)e^{in\theta} \quad (7)$$

$$u_n(r,t) = \frac{1}{2\pi}\int_0^{2\pi} d\theta' e^{-in\theta'}\Phi(r,\theta';t) \quad (8)$$

and $u_n$ satisfies the equation $$\left(\frac{1}{r}\frac{\partial}{\partial r}r\frac{\partial}{\partial r} + \frac{n^2}{r^2}\right)u_n(r,t) = 0 \quad (9)$$

$$u_n(r_o, t) = \frac{V_o \cos\omega t}{in\pi}(e^{-in\pi} - 1) = 0 \text{ if } n = 2, 4 \ldots \text{etc.}$$

$$u_n(0, t) = 0$$

$$\Phi(r,\theta;t) = \frac{4V_o \cos\omega t}{\pi}\sum_{l=1}^{\infty}\frac{\sin(2l-1)\theta}{2l-1}\left(\frac{r}{r_b}\right)^{2l-1}. \quad (10)$$

The lowest harmonic is $$\Phi_1(r,\theta;t) = \frac{2V_o}{\pi}\frac{r}{r_b}[\sin(\omega t + \theta) - \sin(\omega t - \theta)] \quad (11)$$

Higher harmonics are $$\Phi_l(r, \theta; t) = \frac{2V_o}{\pi}\left(\frac{r}{r_b}\right)^{2l-1}\{\sin[\omega t + (2l-1)\theta] - \sin[\omega t - (2l-1)\theta]\} \tag{12}$$

The wave speed in the azimuthal direction is $\dot{\theta}=\pm\omega/(2l-1)$ so that the higher harmonics have a smaller phase velocity and amplitude. These comments apply to both cases in FIG. 21C. The frequency $\omega$ would be close to $\omega_i$ the frequency of rotation of the ions in a rigid rotor equilibrium for the FRC. Thus $\dot{\theta}=\omega_i$ for l=1. For l=2 $\dot{\theta}=\omega_i/3$ and the wave amplitude would be substantially lower; it is thus a good approximation to consider only the lowest harmonic.

Plasma Effect

The response of the plasma can be described by a dielectric tensor. The electric field produces plasma currents which produce charge separation according to the charge conservation equation $$\nabla \cdot \vec{J} + \frac{\partial \rho}{\partial t} = 0 \tag{13}$$

where $\vec{J}$ is current density and $\rho$ is charge density. The appropriate equation is $$\nabla \cdot \vec{E} = 4\pi\rho = 4\pi\vec{\chi}\cdot\vec{E} \tag{14}$$

or $$\nabla \cdot \vec{\varepsilon}\cdot\vec{E} = -\nabla \cdot \vec{\varepsilon}\cdot\nabla\Phi = 0$$

where $\vec{\varepsilon}=\vec{1}+4\pi\vec{\chi}$ is the dielectric tensor and $\chi$ is the polarizability. If only the contribution of the electrons is included the tensor $\vec{\varepsilon}$ is diagonal with one component $$\varepsilon_\perp = 1 + \frac{4\pi nmc^2}{B^2} \tag{15}$$

where n is the density and B is the FRC magnetic field. n and B vary rapidly with r and B=0 on a surface at $r=r_0$ within the plasma. The expression for $\epsilon_\perp$ is derived assuming electrons have a small gyroradius and the electric field changes slowly compared to $\Omega_e=eB/mc$, the gyrofrequency. This approximation breaks down near the null surface. The characteristic orbits change from drift orbits to betatron orbits which have a much smaller response to the electric field, i.e. $\epsilon_\perp \cong 1$ near the null surface at $r=r_0$. The ions mainly have betatron orbits and for the drift orbits the response to the electric field is small because the electric field changes at the rate $\omega \cong \omega_i$.

The net result is that the Laplace equation is replaced by $$\frac{1}{r}\frac{\partial}{\partial r}r\frac{\partial\Phi}{\partial r} + \frac{1}{\varepsilon_\perp(r)}\frac{d\varepsilon_\perp}{dr}\frac{\partial\Phi}{\partial r} + \frac{1}{r^2}\frac{\partial^2\Phi}{\partial r^2} = 0 \tag{16}$$

which must be solved numerically. The additional term vanishes near $r=r_o$. The potential for the lowest harmonic of the quadrupole case has the form $$\Phi = V_o\frac{F(r)}{2}\sin(2\theta - \omega t) \tag{17}$$

and a similar form for the dipole case. Waves traveling in the opposite direction to the ions (or electrons) will be neglected.

Acceleration Due to Ions Trapped in an Electrostatic Wave

We assume that $\omega=2\omega_i+\Delta\omega$ so that the wave $\dot{\theta}=\omega/2=\omega_i+\Delta\omega/2$ is a little faster than the ions. The standard rigid rotor distribution function is assumed for the ions $$f_i(\vec{x},\vec{v}) = \left(\frac{m_i}{2\pi T_i}\right)^{3/2} n_i(r)\exp\left\{\left[-\frac{m_i}{2T_i}[v_r^2 + v_z^2 + (v_\theta - r\omega_i)^2]\right]\right\}. \tag{18}$$

The reduced distribution function of interest is $$F_i(r, v_\theta) = \left(\frac{m_i}{2\pi T_i}\right)^{1/2}\exp\left[-\frac{m_i}{2T_i}(v_\theta - r\omega_i)^2\right].$$

The wave velocity of the electrostatic wave produced by the quadrupole cyclotron is $v_w=r\omega/2=r\omega_i+\Delta v_w$. Ions moving faster than the wave reflect if $$v_\theta - v_w < \sqrt{\frac{2e\Phi_o}{m_i}}. \tag{19}$$

This increases the wave energy, i.e., $$\frac{dW_+}{dt} = \tag{20}$$

$$\sum_{i=1,2}\frac{n_i m_i}{\lambda}\int_{v_\theta=v_w}^{v_\theta=v_w+\sqrt{\frac{2e\Phi_o}{m_i}}} dv_\theta F_i(r, v_\theta)\left[\frac{v_\theta^2}{2} - \frac{(2v_w-v_\theta)^2}{2}\right](v_\theta - v_w).$$

Ions moving slower than the wave reflect if $$v_w - v_\theta < \sqrt{\frac{2e\Phi_o}{m_i}}.$$

and the wave loses energy at the rate $$\frac{dW_-}{dt} = \tag{21}$$

$$\sum_{i=1,2}\frac{n_i m_i}{\lambda}\int_{v_\theta=v_w-\sqrt{\frac{2e\Phi_o}{m_i}}}^{v_\theta=v_w} dv_\theta F_i(r, v_\theta)\left[\frac{v_\theta^2}{2} - \frac{(2v_w-v_\theta)^2}{2}\right](v_w - v_\theta).$$

The net results is simplified with the change of variable $v'_\theta=v_\theta-v_w$, i.e., $$\frac{dW}{dt} = \frac{dW_+}{dt} - \frac{dW_-}{dt} = \tag{22}$$

$$\sum_{i=1,2}\frac{2n_i m_i v_w}{\lambda}\int_0^{\sqrt{\frac{2e\Phi_o}{m_i}}} dv'_\theta(v'_\theta)^2[F_i(v_w + v'_\theta) - F_i(v_w - v'_\theta)].$$

The approximation $$F_i[v_w \pm v_\theta] = F_i(v_w) \pm \left.\frac{\partial F_i}{\partial v_\theta}\right|_{v_w} v_\theta, \tag{23}$$

results in $$\frac{dW}{dt} = \sum_{i=1,2}\frac{2n_i m_i v_w}{\lambda}\left(\frac{2e\Phi_o}{m_i}\right)^2\left.\frac{\partial F_i}{\partial v_\theta}\right|_{v_\theta=v_w}. \tag{24}$$

This has a form similar to Landau damping, but it is not physically the same because Landau damping (growth) is a linear phenomena and this is clearly non-linear.

Since $$\frac{\partial F_i}{\partial v_\theta}\bigg|_{v_w} = \left(\frac{m_i}{2\pi T_i}\right)^{1/2}\frac{m_i}{T_o}(v_w - r\omega_o)\exp\left[-\frac{m_i}{2T_i}(v_w - r\omega_i)^2\right]. \quad (25)$$

If $v_w = r\omega_i$ there is no change in the wave energy. If $w_w > r\omega_i$ or $\Delta v_w > 0$, the wave energy decreases; for $\Delta v_w < 0$ the wave energy increases. This is similar to the interpretation of Landau damping. In the first case $\Delta v_w > 0$, there are more ions going slower than the wave than faster. Therefore, the wave energy decreases. In the opposite case $\Delta v_w < 0$, the wave energy increases. The former case applies to maintaining the ion energy and momentum with a quadrupole cyclotron. This is current drive. The latter case provides the basis for a converter. Eqs. (22) and (24) can be used to evaluate the applicability to fusion reactor conditions.

The power transferred to the ions when $v_w - r\omega_i = \Delta v_w \cong v_i$, the ion thermal velocity, is $$P = 2\pi \int_0^{r_b} \frac{dW}{dt} r\, dr,$$

where $dW/dt$ is determined by Eqs. (24) and (25).

To simplify the integration $\Phi_0(r)$ is replaced by $\Phi_0(r_0)$, the value at the peak density which is a lower bound of the wave amplitude.

$$P = \left(\frac{2}{\pi}\right)^{3/2} \sum_{i=1,2} (N_i T_i)\omega_i \left[\frac{2e_i \Phi_o(r_o)}{T_i}\right]^2 \quad (26)$$

$N_i$ is the line density of ions. $i=1,2$ accommodates two types of ions which is usually the case in a reactor.

Detailed calculations of $F(r)$ indicate that the wave amplitude $\Phi_0(r_0)$ is about a factor of 10 less than the maximum gap voltage which is $2V_o$. This will determine the limitations of this method of RF drive. $V_o$ will be limited by the maximum gap voltage that can be sustained which is probably about 10 kVolts for a 1 cm gap.

Reactor Requirements

For current drive a power $P_i$ is preferably transferred to the ions at frequency $\omega_e$ and a power $P_e$ is preferably transferred to the electrons at frequency $\omega_e$. This will compensate for the Coulomb interactions between electrons and ions, which reduces the ion velocity and increases the electron velocity. (In the absence of the power transfers, Coulomb collisions would lead to the same velocity for electrons and ions and no current). The average electric field to maintain the equilibrium of electrons and ions is given by $$2\pi r_0 \langle E_\theta \rangle = IR \quad (27)$$

where $$I = \frac{N_e e}{2\pi}(\omega_i - \omega_e)$$

is the current/unit length and $$R = \frac{(2\pi r_0)^2 m}{N_e e^2}\left(\frac{N_1 Z_1 m_1}{N_e t_{1e}} + \frac{N_2 Z_2 m_2}{N_e t_{2e}}\right)$$

is the resistance/unit length. $N_e$, $N_1$, $N_2$ are line densities of electrons and ions $N_e = N_1 Z_1 + N_2 Z_2$ where $Z_1$, $Z_2$ are atomic numbers of the ions; $t_{1e}$ and $t_{2e}$ are momentum transfer times from ions to electrons. The average electric field is the same for ions or electrons because $N_e \cong N_i$ for quasi-neutrality and the charge is opposite. The power that must be transferred to the ions is $$P_i = 2\pi r_0 I_{i\theta} \langle E_\theta \rangle \quad (28)$$

and the power that can be extracted from electrons is $$P_e = -|2\pi r_0 I_{e\theta} \langle E_\theta \rangle| \quad (29)$$

where $I_{i\theta} = N_e e\omega_i/2\pi$ and $I_{e\theta} = N_e e\omega_e/2\pi$.

For refueling with the RF drive the fuel may be replaced at any energy atrates given by the fusion times $t_{F1} = 1/n_1 \langle\sigma v\rangle_1$ and $t_{F2} = 1/n_2 \langle\sigma v\rangle_2$; $n_1$ and $n_2$ are plasma ion densities and $\langle\sigma v\rangle$ are reactivities. The magnitude will be seconds. The injected neutrals (to replace the fuel ions that burn and disappear) will ionize rapidly and accelerate due to Coulomb collisions up to the average ion velocity in a time of the order of milliseconds (for reactor densities of order $10^{15} cm^{-3}$). However this requires an addition to $\langle E_\theta \rangle$ and an addition to transfer of power to maintain a steady state. The addition is $$\delta\langle E_\theta \rangle = \frac{V_{i\theta} - V_{b\theta}}{N_e e^2}\left(\frac{N_1 Z_1 m_1}{t_{F1}} + \frac{N_2 Z_2 m_2}{t_{F2}}\right) \quad (30)$$

which will increase the required power transfer by about a factor of two (2).

The power can be provided for current drive and refueling without exceeding the maximum gap voltage amplitude of 10 kVolts/cm. Considering that the frequency will be 1-10 Mega-Hertz and the magnetic field will be of order 100 kGauss no breakdown would be expected. The power that must be transferred for current drive and refueling is similar for any current drive method. However RF technology at 1-10 Mega-Hertz has been an established high-efficiency technology for many years. The method described that uses electrodes instead of antennas has a considerable advantage because the conditions for field penetration are much more relaxed than for electromagnetic waves. Therefore this method would have advantages with respect to circulating power and efficiency.

Fusion

Significantly, these two techniques for forming a FRC inside of a containment system 300 described above, or the like, can result in plasmas having properties suitable for causing nuclear fusion therein. More particularly, the FRC formed by these methods can be accelerated to any desired level of rotational energy and magnetic field strength. This is crucial for fusion applications and classical confinement of high-energy fuel beams. In the confinement system 300, therefore, it becomes possible to trap and confine high-energy plasma beams for sufficient periods of time to cause a fusion reaction therewith.

To accommodate fusion, the FRC formed by these methods is preferably accelerated to appropriate levels of rotational energy and magnetic field strength by betatron acceleration. Fusion, however, tends to require a particular set of physical conditions for any reaction to take place. In addition, to achieve efficient burn-up of the fuel and obtain a positive energy balance, the fuel has to be kept in this state substantially unchanged for prolonged periods of time. This is important, as high kinetic temperature and/or energy characterize a fusion relevant state. Creation of this state, therefore, requires sizeable input of energy, which can only be recovered if most of the fuel undergoes fusion. As a consequence, the confinement time of the fuel has to be longer than its burn time. This leads to a positive energy balance and consequently net energy output.

A significant advantage of the present invention is that the confinement system and plasma described herein are capable of long confinement times, i.e., confinement times that exceed fuel burn times. A typical state for fusion is, thus, characterized by the following physical conditions (which tend to vary based on fuel and operating mode):

Average ion temperature: in a range of about 30 to 230 keV and preferably in a range of about 80 keV to 230 keV Average electron temperature: in a range of about 30 to 100 keV and preferably in a range of about 80 to 100 keV Coherent energy of the fuel beams (injected ion beams and circulating plasma beam): in a range of about 100 keV to 3.3 MeV and preferably in a range of about 300 keV to 3.3 MeV.

Total magnetic field: in a range of about 47.5 to 120 kG and preferably in a range of about 95 to 120 kG (with the externally applied field in a range of about 2.5 to 15 kG and preferably in a range of about 5 to 15 kG).

Classical Confinement time: greater than the fuel burn time and preferably in a range of about 10 to 100 seconds.

Fuel ion density: in a range of about $10^{14}$ to less than $10^{16}$ cm$^{-3}$ and preferably in a range of about $10^{14}$ to $10^{15}$ cm$^{-3}$.

Total Fusion Power: preferably in a range of about 50 to 450 kW/cm (power per cm of chamber length)

To accommodate the fusion state illustrated above, the FRC is preferably accelerated to a level of coherent rotational energy preferably in a range of about 100 keV to 3.3 MeV, and more preferably in a range of about 300 keV to 3.3 MeV, and a level of magnetic field strength preferably in a range of about 45 to 120 kG, and more preferably in a range of about 90 to 115 kG. At these levels, high energy ion beams, which are neutralized and polarized as described above, can be injected into the FRC and trapped to form a plasma beam layer wherein the plasma beam ions are magnetically confined and the plasma beam electrons are electrostatically confined.

Preferably, the electron temperature is kept as low as practically possible to reduce the amount of bremsstrahlung radiation, which can, otherwise, lead to radiative energy losses. The electrostatic energy well of the present invention provides an effective means of accomplishing this.

The ion temperature is preferably kept at a level that provides for efficient burn-up since the fusion cross-section is a function of ion temperature. High direct energy of the fuel ion beams is essential to provide classical transport as discussed in this application. It also minimizes the effects of instabilities on the fuel plasma. The magnetic field is consistent with the beam rotation energy. It is partially created by the plasma beam (self-field) and in turn provides the support and force to keep the plasma beam on the desired orbit.

Fusion Products

The fusion products are born in the power core predominantly near the null surface 86 from where they emerge by diffusion towards the separatrix 84 (see FIGS. 3 and 5). This is due to collisions with electrons (as collisions with ions do not change the center of mass and therefore do not cause them to change field lines). Because of their high kinetic energy (fusion product ions have much higher energy than the fuel ions), the fusion products can readily cross the separatrix 84. Once they are beyond the separatrix 84, they can leave along the open field lines 80 provided that they experience scattering from ion-ion collisions. Although this collisional process does not lead to diffusion, it can change the direction of the ion velocity vector such that it points parallel to the magnetic field. These open field lines 80 connect the FRC topology of the core with the uniform applied field provided outside the FRC topology. Product ions emerge on different field lines, which they follow with a distribution of energies. Advantageously, the product ions and charge-neutralizing electrons emerge in the form of rotating annular beams from both ends of the fuel plasma. For example for a 50 MW design of a p-B$^{11}$ reaction, these beams will have a radius of about 50 centimeters and a thickness of about 10 centimeters. In the strong magnetic fields found outside the separatrix 84 (typically around 100 kG), the product ions have an associated distribution of gyro-radii that varies from a minimum value of about 1 cm to a maximum of around 3 cm for the most energetic product ions.

Initially the product ions have longitudinal as well as rotational energy characterized by ½ M($v_{par}$)$^2$ and ½ M($v_{perp}$)$^2$. $v_{perp}$ is the azimuthal velocity associated with rotation around a field line as the orbital center. Since the field lines spread out after leaving the vicinity of the FRC topology, the rotational energy tends to decrease while the total energy remains constant. This is a consequence of the adiabatic invariance of the magnetic moment of the product ions. It is well known in the art that charged particles orbiting in a magnetic field have a magnetic moment associated with their motion. In the case of particles moving along a slow changing magnetic field, there also exists an adiabatic invariant of the motion described by ½ M($v_{perp}$)$^2$/B. The product ions orbiting around their respective field lines have a magnetic moment and such an adiabatic invariant associated with their motion. Since B decreases by a factor of about 10 (indicated by the spreading of the field lines), it follows that $v_{perp}$ will likewise decrease by about 3.2. Thus, by the time the product ions arrive at the uniform field region their rotational energy would be less than 5% of their total energy; in other words almost all the energy is in the longitudinal component.

Energy Conversion

Figure 22A:
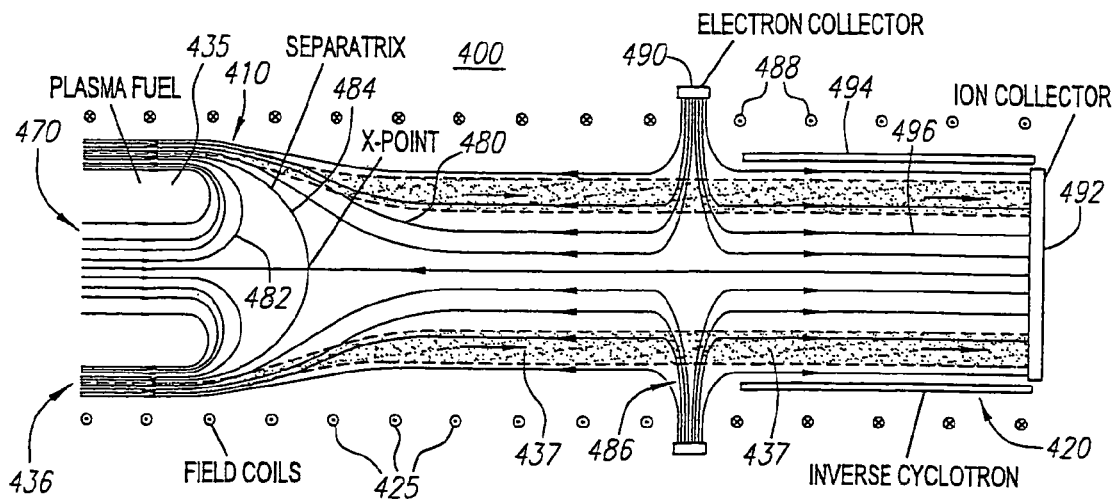
FIG. 22A shows a partial plasma-electric power generation system comprising a colliding beam fusion reactor coupled to an inverse cyclotron direct energy converter.
Figure 23A:
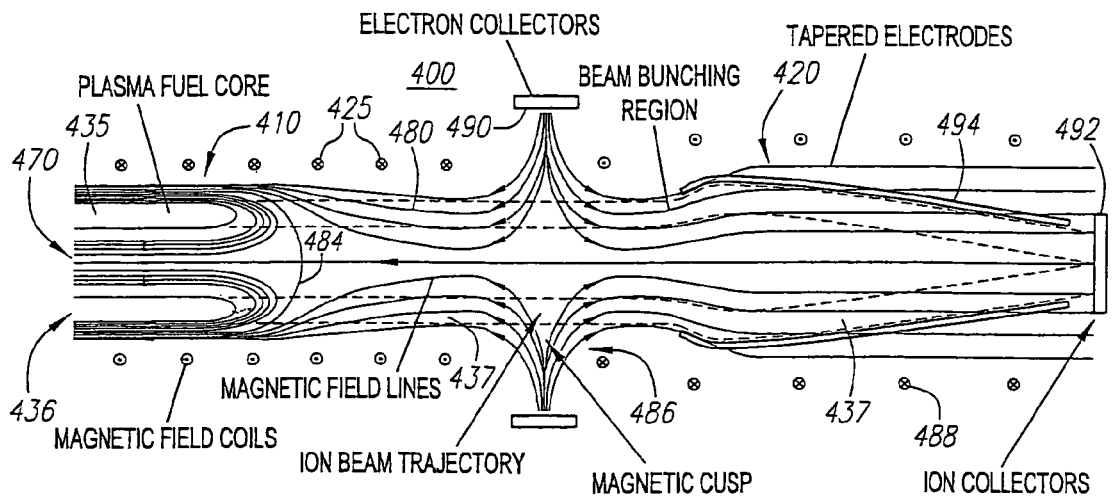
FIG. 23A shows a partial plasma electric power generation system comprising a colliding beam fusion reactor coupled to an alternate embodiment of the inverse cyclotron converter.

The direct energy conversion system of the present invention comprises an inverse cyclotron converter (ICC) 420 shown in FIGS. 22A and 23A coupled to a (partially illustrated) power core 436 of a colliding beam fusion reactor (CBFR) 410 to form a plasma-electric power generation system 400. A second ICC (not shown) may be disposed symmetrically to the left of the CBFR 410. A magnetic cusp 486 is located between the CBFR 410 and the ICC 420 and is formed when the CBFR 410 and ICC 420 magnetic fields merge.

Before describing the ICC 420 and its operation in detail, a review of a typical cyclotron accelerator is provided. In conventional cyclotron accelerators, energetic ions with velocities perpendicular to a magnetic field rotate in circles. The orbit radius of the energetic ions is determined by the magnetic field strength and their charge-to-mass ratio, and increases with energy. However, the rotation frequency of the ions is independent of their energy. This fact has been exploited in the design of cyclotron accelerators.

Figure 24A:
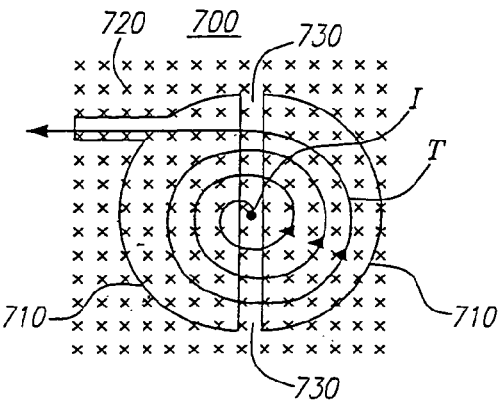
FIG. 24A shows a particle orbit inside a conventional cyclotron.

Referring to FIG. 24A, a conventional cyclotron accelerator 700 includes two mirror image C-shaped electrodes 710 forming mirror image D-shaped cavities placed in a homogenous magnetic field 720 having field lines perpendicular to the electrodes' plane of symmetry, i.e., the plane of the page. An oscillating electric potential is applied between the C-shaped electrodes (see FIG. 21B). Ions I are emitted from a source placed in the center of the cyclotron 700. The magnetic field 720 is adjusted so that the rotation frequency of the ions matches that of the electric potential and associated electric field. If an ion I crosses the gap 730 between the C-shaped electrodes 710 in the same direction as that of the electric field, it is accelerated. By accelerating the ion I, its energy and orbit radius increase. When the ion has traveled a half-circle arc (experiencing no increase in energy), it crosses the gap 730 again. Now the electric field between the C-shaped electrodes 710 has reversed direction. The ion I is again accelerated, and its energy is further increased. This process is repeated every time the ion crosses the gap 730 provided its rotation frequency continues to match that of the oscillating electric field (see FIG. 24C). If on the other hand a particle crosses the gap 730 when the electric field is in the opposite direction it will be decelerated and returned to the source at the center. Only particles with initial velocities perpendicular to the magnetic field 720 and that cross the gaps 730 in the proper phase of the oscillating electric field will be accelerated. Thus, proper phase matching is essential for acceleration.

In principle, a cyclotron could be used to extract kinetic energy from a pencil beam of identical energetic ions. Deceleration of ions with a cyclotron, but without energy extraction has been observed for protons, as described by Bloch and Jeffries in *Phys. Rev.* 80, 305 (1950). The ions could be injected into the cavity such that they are brought into a decelerating phase relative to the oscillating field. All of the ions would then reverse the trajectory T of the accelerating ion shown in FIG. 24A. As the ions slow down due to interaction with the electric field, their kinetic energy is transformed into oscillating electric energy in the electric circuit of which the cyclotron is part. Direct conversion to electric energy would be achieved, tending to occur with very high efficiency.

In practice, the ions of an ion beam would enter the cyclotron with all possible phases. Unless the varying phases are compensated for in the design of the cyclotron, half of the ions would be accelerated and the other half decelerated. As a result, the maximum conversion efficiency would effectively be 50%. Moreover the annular fusion product ion beams discussed above are of an unsuitable geometry for the conventional cyclotron.

As discussed in greater detail below, the ICC of the present invention accommodates the annular character of the fusion product beams exiting the FRC of fusion reactor power core, and the random relative phase of the ions within the beam and the spread of their energies.

Referring back to FIG. 22A, a portion of a power core 436 of the CBFR 410 is illustrated on the left side, wherein a plasma fuel core 435 is confined in a FRC 470 formed in part due to a magnetic field applied by outside field coils 425. The FRC 470 includes closed field lines 482, a separatrix 484 and open field lines 480, which, as noted above, determines the properties of the annular beam 437 of the fusion products. The open field lines 480 extend away from the power core 436 towards the magnetic cusp 486. As noted above, fusion products emerge from the power core 436 along open field lines 480 in the form of an annular beam 437 comprising energetic ions and charge neutralizing electrons.

The geometry of the ICC 420 is like a hollow cylinder with a length of about five meters. Preferably, four or more equal, semi-cylindrical electrodes 494 with small, straight gaps 497 make up the cylinder surface. In operation, an oscillating potential is applied to the electrodes 494 in an alternating fashion. The electric field E within the converter has a quadrupole structure as indicated in the end view illustrated in FIG. 22B. The electric field E vanishes on the symmetry axis and increases linearly with the radius; the peak value is at the gap 497.

In addition, the ICC 420 includes outside field coils 488 to form a uniform magnetic field within the ICC's hollow cylinder geometry. Because the current runs through the ICC field coils 488 in a direction opposite to the direction of the current running through the CBFR field coils 425, the field lines 496 in the ICC 420 run in a direction opposite to the direction of the open field lines 480 of the CBFR 410. At an end furthest from the power core 436 of the CBFR 410, the ICC 420 includes an ion collector 492.

In between the CBFR 410 and the ICC 420 is a symmetric magnetic cusp 486 wherein the open field lines 480 of the CBFR 410 merge with the field lines 496 of the ICC 420. An annular shaped electron collector 490 is position about the magnetic cusp 486 and electrically coupled to the ion collector 498. As discussed below, the magnetic field of the magnetic cusps 486 converts the axial velocity of the beam 437 to a rotational velocity with high efficiency. FIG. 22C illustrates a typical ion orbit 422 within the converter 420.

The CBFR 410 has a cylindrical symmetry. At its center is the fusion power core 436 with a fusion plasma core 435 contained in a FRC 470 magnetic field topology in which the fusion reactions take place. As noted, the product nuclei and charge-neutralizing electrons emerge as annular beams 437 from both ends of the fuel plasma 435. For example for a 50 MW design of a p-$B^{11}$ reaction, these beams will have a radius of about 50 cm and a thickness of about 10 cm. The annular beam has a density $n \simeq 10^7 - 10^8$ cm$^3$. For such a density, the magnetic cusp 486 separates the electrons and ions. The electrons follow the magnetic field lines to the electron collector 490 and the ions pass through the cusp 486 where the ion trajectories are modified to follow a substantially helical path along the length of the ICC 420. Energy is removed from the ions as they spiral past the electrodes 494 connected to a resonant circuit (not shown). The loss of perpendicular energy is greatest for the highest energy ions that initially circulate close to the electrodes 494, where the electric field is strongest.

The ions arrive at the magnetic cusp 486 with the rotational energy approximately equal to the initial total energy, i.e., $\frac{1}{2}Mv_p^2 \cong \frac{1}{2}Mv_0^2$. There is a distribution of ion energies and ion initial radii $r_0$ when the ions reach the magnetic cusp 486. However, the initial radii $r_0$ tends to be approximately proportional to the initial velocity $v_0$. The radial magnetic field and the radial beam velocity produce a Lorentz force in the azimuthal direction. The magnetic field at the cusp 486 does not change the particle energy but converts the initial axial velocity $v_p \cong v_0$ to a residual axial velocity $v_z$ and an azimuthal velocity $v_\perp$, where $v_0^2 = v_z^2 + v_\perp^2$. The value of the azimuthal velocity $v_\perp$ can be determined from the conservation of canonical momentum $$P_\theta = Mr_0 v_\perp - \frac{qB_0 r_0^2}{2c} = \frac{qB_0 r_0^2}{2c} \tag{31}$$

A beam ion enters the left hand side of the cusp 486 with $B_z = B_0$, $v_z = v_0$, $v_\perp = 0$ and $r = r_0$. It emerges on the right hand side of the cusp 486 with $r = r_0$, $B_z = -B_0$, $v_\perp = qB_0 r_0/Mc$ and $v_z = \sqrt{v_0^2 - v_\perp^2}$ $$\frac{v_z}{v_0} = \sqrt{1 - \left(\frac{r_0 \Omega_0}{v_0}\right)^2} \tag{32}$$

where $$\Omega_0 = \frac{qB_0}{Mc}$$

is the cyclotron frequency. The rotation frequency of the ions is in a range of about 1-10 MHz, and preferably in a range of about 5-10 MHz, which is the frequency at which power generation takes place.

In order for the ions to pass through the cusp 486, the effective ion gyro-radius must be greater than the width of the cusp 486 at the radius $r_0$. It is quite feasible experimentally to reduce the axial velocity by a factor of 10 so that the residual axial energy will be reduced by a factor of 100. Then 99% of the ion energy will be converted to rotational energy. The ion beam has a distribution of values for $v_0$ and $r_0$. However, because $r_0$ is proportional to $v_0$ as previously indicated by the properties of the FRC based reactor, the conversion efficiency to rotational energy tends to be 99% for all ions.

Figure 22B:
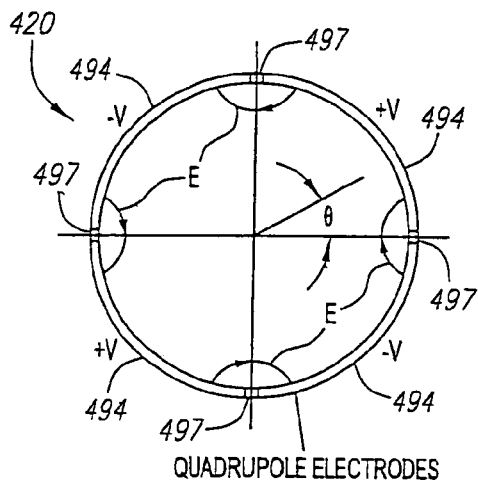
FIG. 22B shows an end view of the inverse cyclotron converter in FIG. 19A.
Figure 22C:
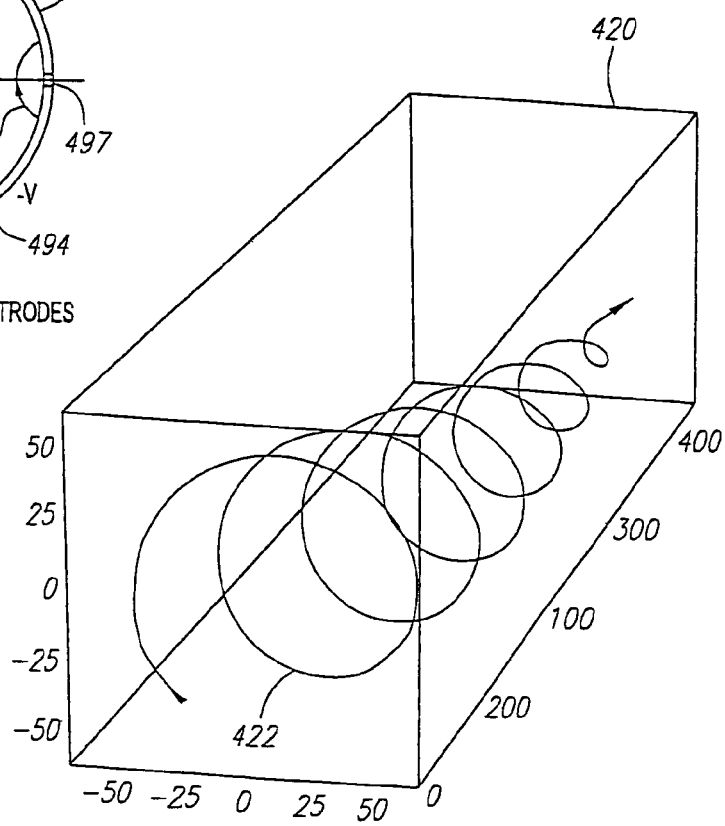
FIG. 22C shows an orbit of an ion in the inverse cyclotron converter.
Figure 25:
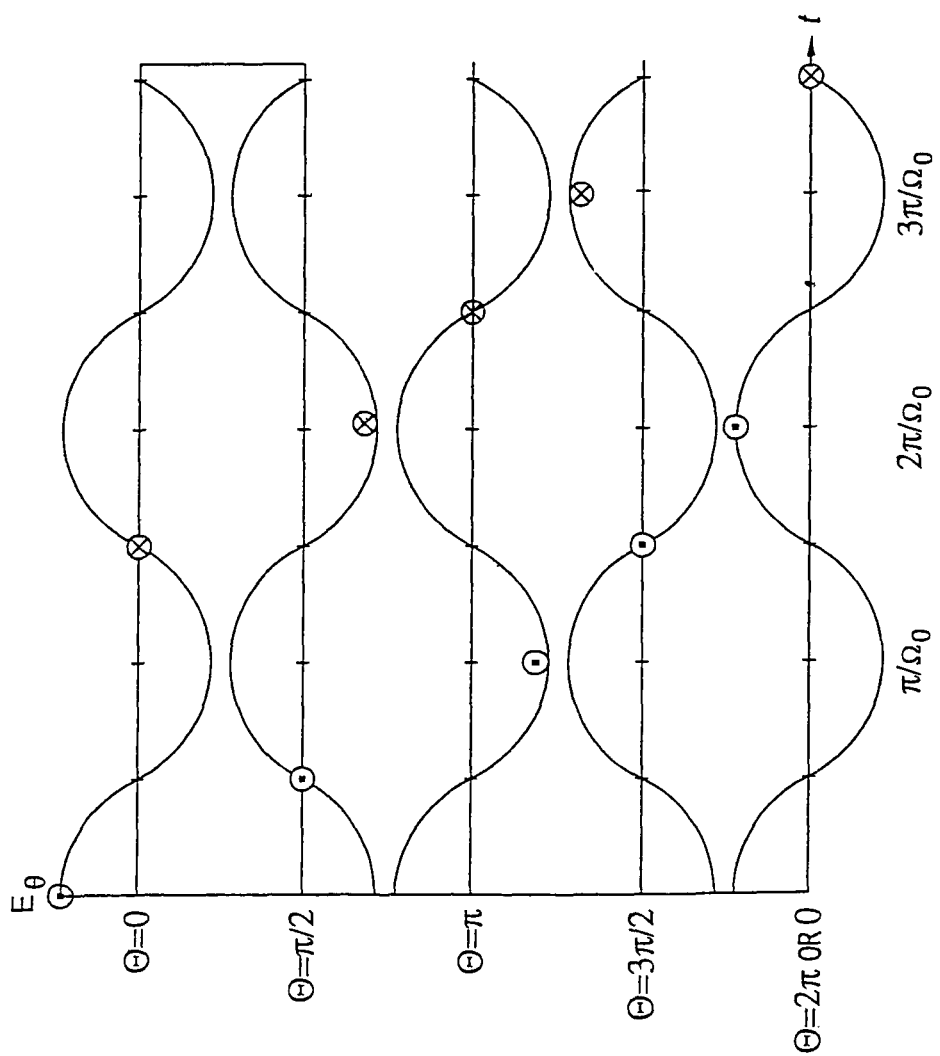
FIG. 25 shows an azimuthal electric field at gaps between the electrodes of the ICC that is experienced by an ion with angular velocity.

As depicted in FIG. 22B, the symmetrical electrode structure of the ICC 420 of the present invention preferably includes four electrodes 494. A tank circuit (not shown) is connected to the electrode structures 494 so that the instantaneous voltages and electric fields are as illustrated. The voltage and the tank circuit oscillate at a frequency of $\omega = \Omega_0$. The azimuthal electric field E at the gaps 497 is illustrated in FIG. 22B and FIG. 25. FIG. 25 illustrates the electric field in the gaps 497 between electrodes 494 and the field an ion experiences as it rotates with angular velocity $\Omega_0$. It is apparent that in a complete revolution the particle will experience alternately acceleration and deceleration in an order determined by the initial phase. In addition to the azimuthal electric field $E_\theta$ there is also a radial electric field $E_r$. The azimuthal field $E_\theta$ is maximum in the gaps 497 and decreases as the radius decreases. FIG. 22 assumes the particle rotates maintaining a constant radius. Because of the gradient in the electric field the deceleration will always dominate over the acceleration. The acceleration phase makes the ion radius increase so that when the ion next encounters a decelerating electric field the ion radius will be larger. The deceleration phase will dominate independent of the initial phase of the ion because the radial gradient of the azimuthal electric field $E_\theta$ is always positive. As a result, the energy conversion efficiency is not limited to 50% due to the initial phase problem associated with conventional cyclotrons. The electric field $E_r$ is also important. It also oscillates and produces a net effect in the radial direction that returns the beam trajectory to the original radius with zero velocity in the plane perpendicular to the axis as in FIG. 22C.

Figure 26:
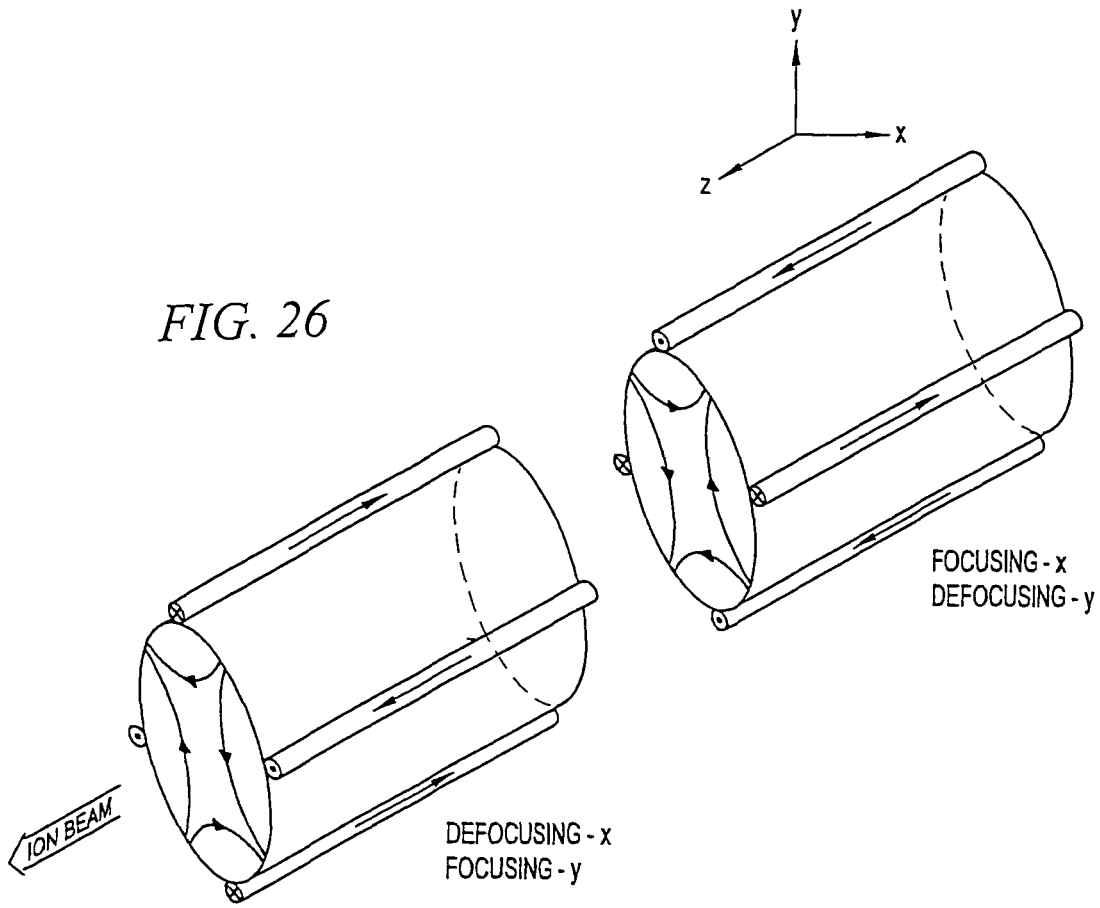
FIG. 26 shows a focusing quadrupole doublet lens.

The process by which ions are always decelerated is similar to the principle of strong focusing that is an essential feature of modern accelerators as described in U.S. Pat. No. 2,736,799. The combination of a positive (focusing) and negative lens (defocusing) is positive if the magnetic field has a positive gradient. A strong focusing quadrupole doublet lens is illustrated in FIG. 26. The first lens is focusing in the x-direction and defocusing in the y-direction. The second lens is similar with x and y properties interchanged. The magnetic field vanishes on the axis of symmetry and has a positive radial gradient. The net results for an ion beam passing through both lenses is focusing in all directions independent of the order of passage.

Similar results have been reported for a beam passing through a resonant cavity containing a strong axial magnetic field and operating in the $TE_{111}$ mode (see Yoshikawa et al.). This device is called a peniotron. In the $TE_{111}$ mode the resonant cavity has standing waves in which the electric field has quadrupole symmetry. The results are qualitatively similar to some of the results described herein. There are quantitative differences in that the resonance cavity is much larger in size (10 meter length), and operates at a much higher frequency (155 MHz) and magnetic field (10 T). Energy extraction from the high frequency waves requires a rectenna. The energy spectrum of the beam reduces the efficiency of conversion. The existence of two kinds of ions is a more serious problem, but the efficiency of conversion is adequate for a D-$He^3$ reactor that produces 15 MeV protons.

A single particle orbit 422 for a particle within the ICC 420 is illustrated in FIG. 22C. This result was obtained by computer simulation and a similar result was obtained for the peniotron. An ion entering at some radius $r_0$ spirals down the length of the ICC and after losing the initial rotational energy converges to a point on a circle of the same radius $r_0$. The initial conditions are asymmetric; the final state reflects this asymmetry, but it is independent of the initial phase so that all particles are decelerated. The beam at the ion collector end of the ICC is again annular and of similar dimensions. The axial velocity would be reduced by a factor of 10 and the density correspondingly increased. For a single particle an extracting efficiency of 99% is feasible. However, various factors, such as perpendicular rotational energy of the annular beam before it enters the converter, may reduce this efficiency by about 5%. Electric power extraction would be at about 1-10 MHz and preferably about 5-10 MHz, with additional reduction in conversion efficiency due to power conditioning to connect to a power grid.

Figure 23B:
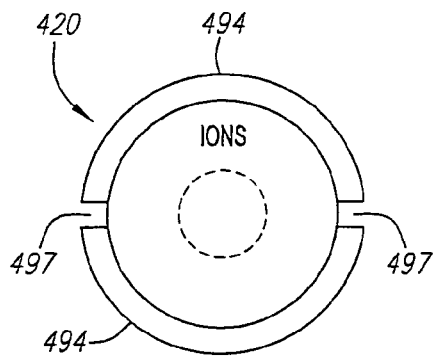
FIG. 23B shows an end view of the inverse cyclotron converter in FIG. 20A.

As shown in FIGS. 23A and 23B, alternative embodiments of the electrode structures 494 in the ICC 420 may include two symmetrical semi-circular electrodes and/or tapered electrodes 494 that taper towards the ion collector 492.

Figure 24B:
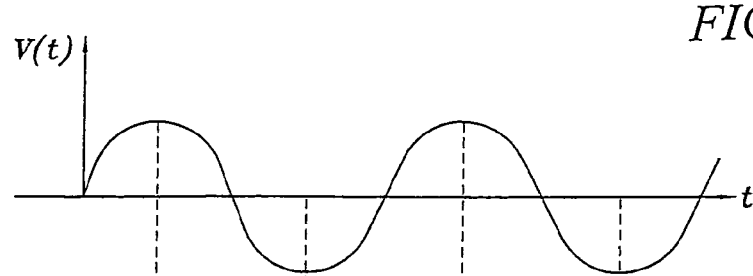
FIG. 24B shows an oscillating electric field.
Figure 24C:
FIG. 24C shows the changing energy of an accelerating particle.
Figure 27A:
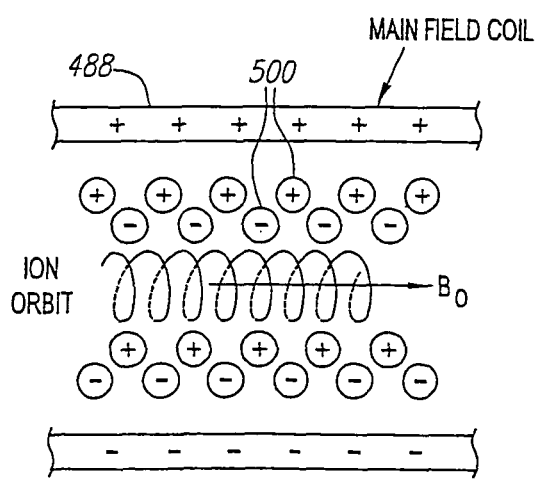
FIGS. 27A and 27B show auxiliary magnetic-field-coil system.
Figure 27B:
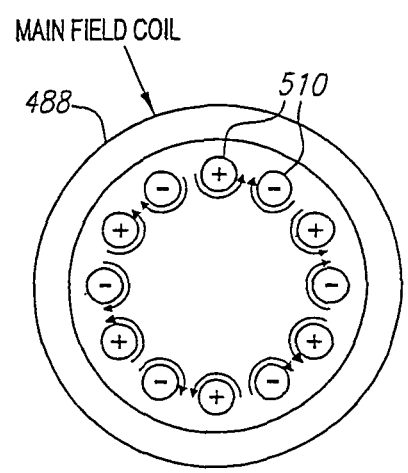

Adjustments to the ion dynamics inside the main magnetic field of the ICC 420 may be implemented using two auxiliary coil sets 500 and 510, as shown in FIGS. 27A and 24B. Both coil sets 500 and 510 involve adjacent conductors with oppositely directed currents, so the magnetic fields have a short range. A magnetic-field gradient, as schematically illustrated in FIG. 27A, will change the ion rotation frequency and phase. A multi-pole magnetic field, as schematically illustrated in FIG. 27B, will produce bunching, as in a linear accelerator.

Reactor

Figure 28:
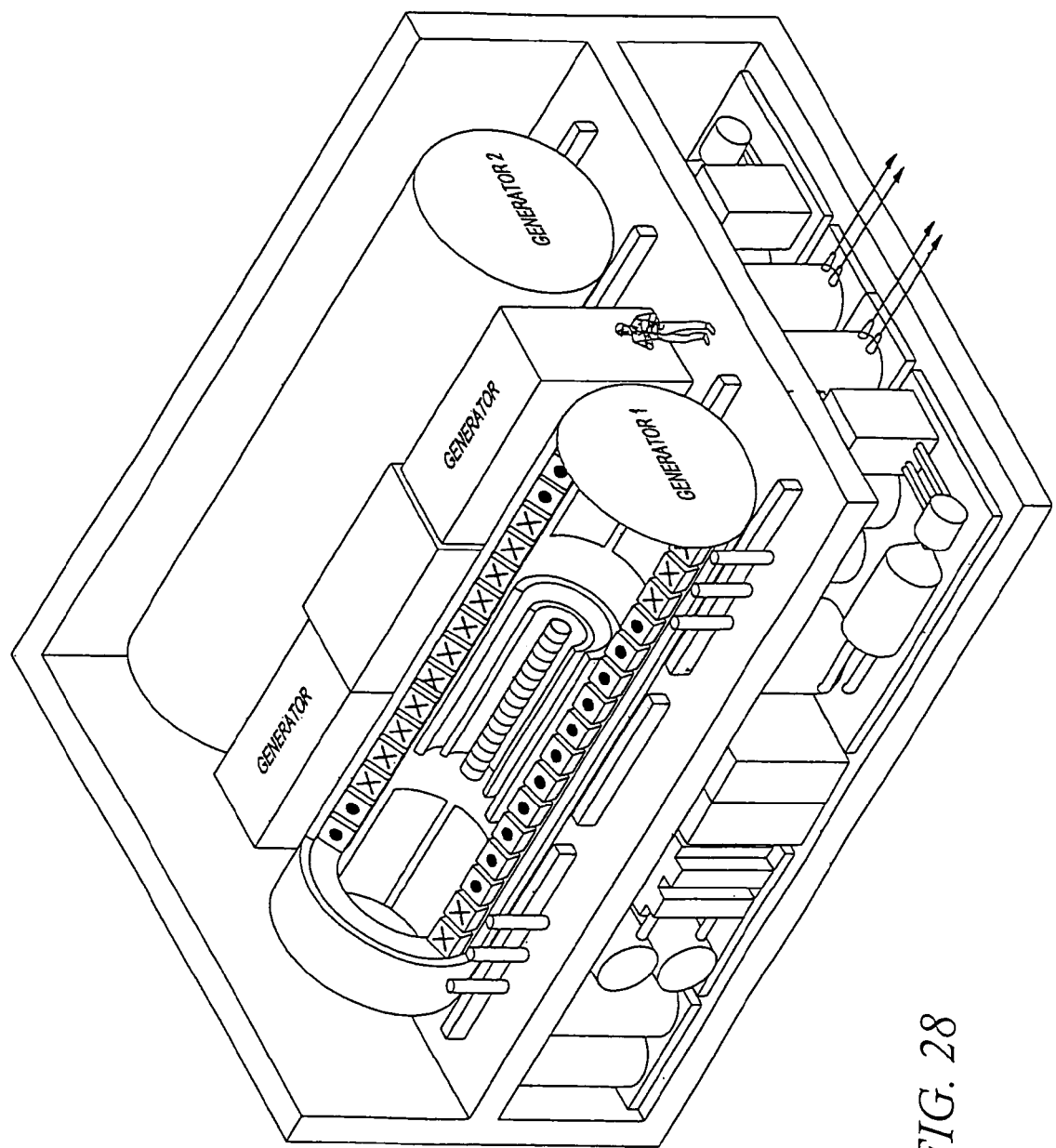
FIG. 28 shows a 100 MW reactor.
Figure 29:
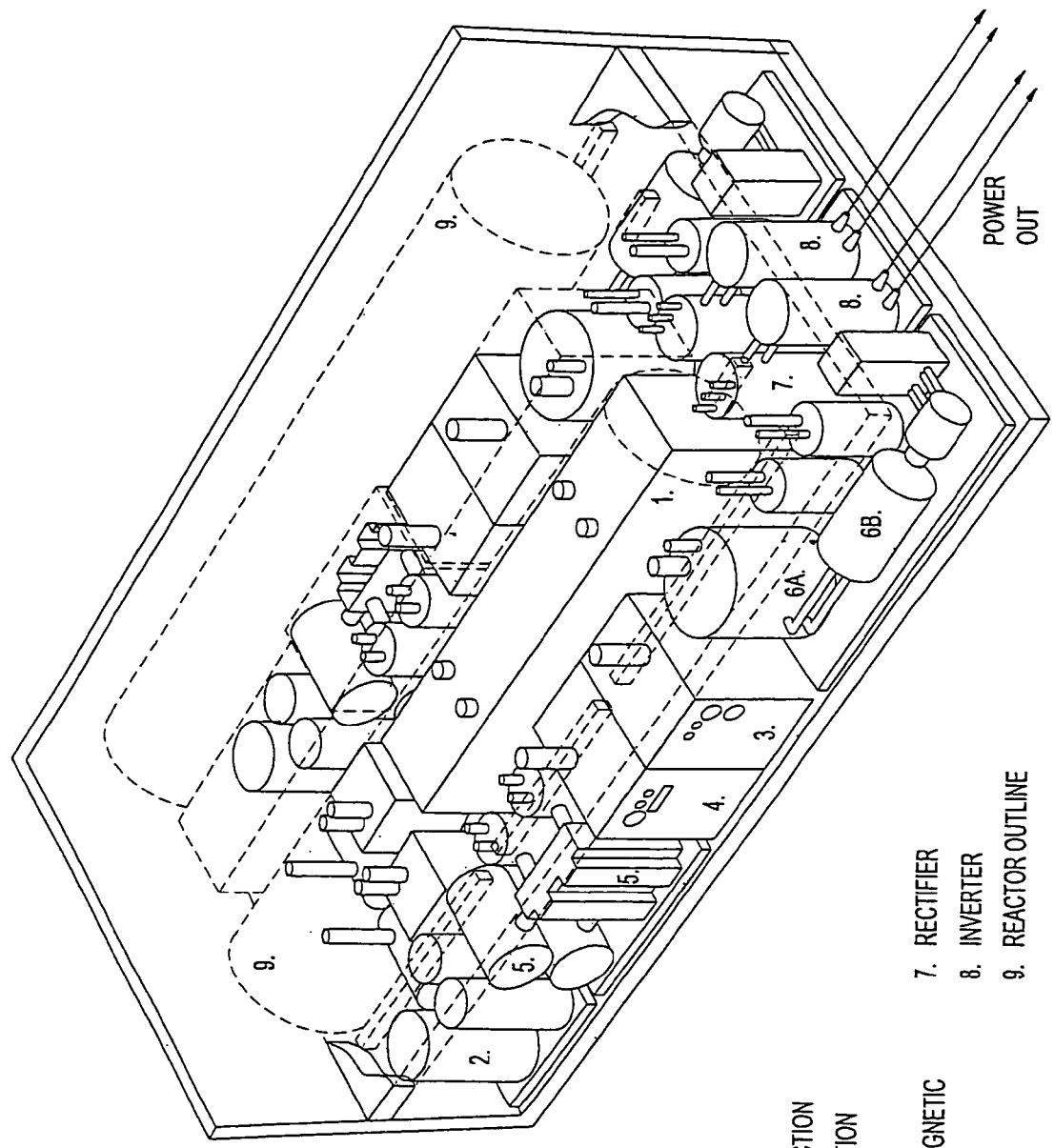
FIG. 29 shows reactor support equipment.

FIG. 28 illustrates a 100 MW reactor. The generator cut away illustrates a fusion power core region having superconducting coils to apply a uniform magnetic field and a flux coil for formation of a magnetic field with field-reversed topology. Adjacent opposing ends of the fusion power core region are ICC energy converters for direct conversion of the kinetic energy of the fusion products to electric power. The support equipment for such a reactor is illustrated in FIG. 29.

Propulsion System

Exploration of the solar system (and beyond) requires propulsion capabilities that far exceed the best available chemical or electric propulsion systems. For advanced propulsion applications, the present invention holds the most promise: design simplicity, high-thrust, high specific impulse, high specific power-density, low system mass, and fuels that produce little or no radio-activity.

Figure 30:
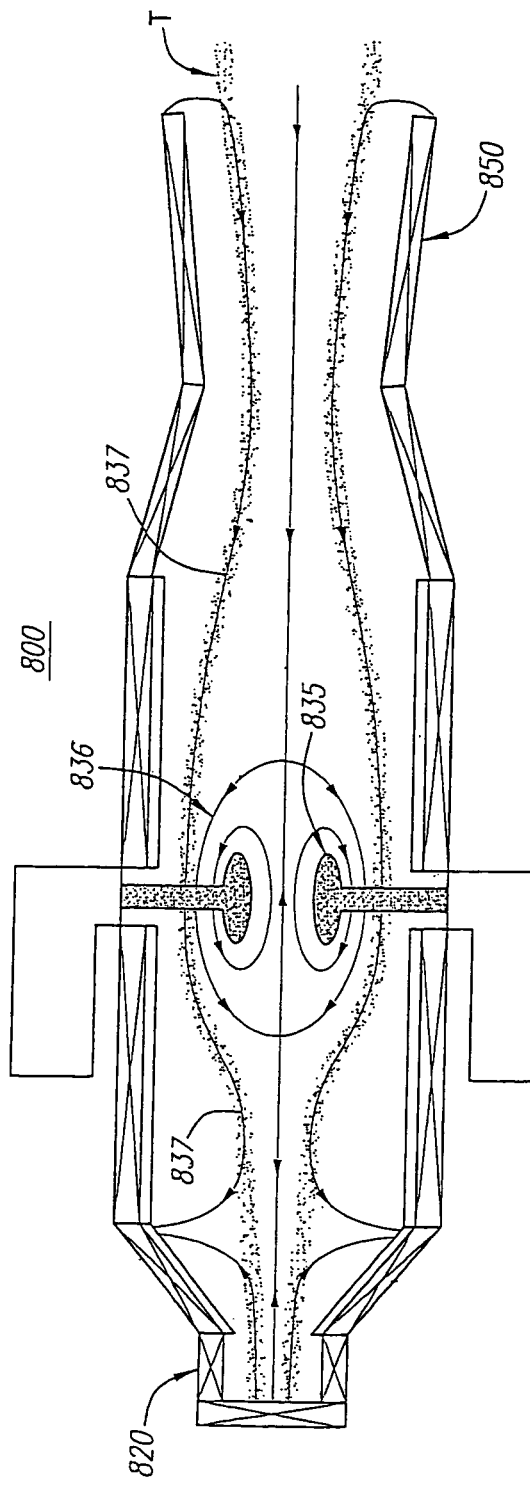
FIG. 30 shows a plasma-thrust propulsion system.

A plasma-thrust propulsion system, in accordance with the present invention, utilizes the high kinetic energy embedded in the fusion products as they are expelled axially out of the fusion plasma core. The system 800 is illustrated schematically in FIGS. 30 and 31. The system includes a FRC power core 836 colliding beam fusion reactor in which a fusion fuel core 835 is contained as described above. The reactor further comprises a magnetic field generator 825, a current coil (not shown) and ion beam injectors 840. An ICC direct-energy converter 820, as described above, is coupled to one end of the power core 836, and intercepts approximately half of the fusion product particles which emerge from both ends of the power core 836 in the form of annular beams 837. As described above, the ICC 820 decelerates them by an inverse cyclotron process, and converts their kinetic energy into electric energy. A magnetic nozzle 850 is positioned adjacent the other end of the power core 836 and directs the remaining fusion product particles into space as thrust T. The annular beam 837 of fusion products stream from one end of the fusion power core 836 along field lines 837 into the ICC 820 for energy conversion and from the other end of the power core 836 along field lines 837 out of the nozzle 850 for thrust T.

Bremsstrahlung radiation is converted into electric energy by a thermoelectric-energy converter (TEC) 870. Bremsstrahlung energy that is not converted by the TEC 870 is passed to a Brayton-cycle heat engine 880. Waste heat is rejected to space. A power-control subsystem (810, see FIG. 32), monitors all sources and sinks of electric and heat energy to maintain system operation in the steady state and to provide an independent source of energy (i.e, fuel-cells, batteries, etc.) to initiate operation of the space craft and propulsion system from a non-operating state. Since the fusion products are charged α-particles, the system does not require the use of massive radiation and neutron shields and hence is characterized by significantly reduced system mass compared to other nuclear space propulsion systems.

Figure 31:
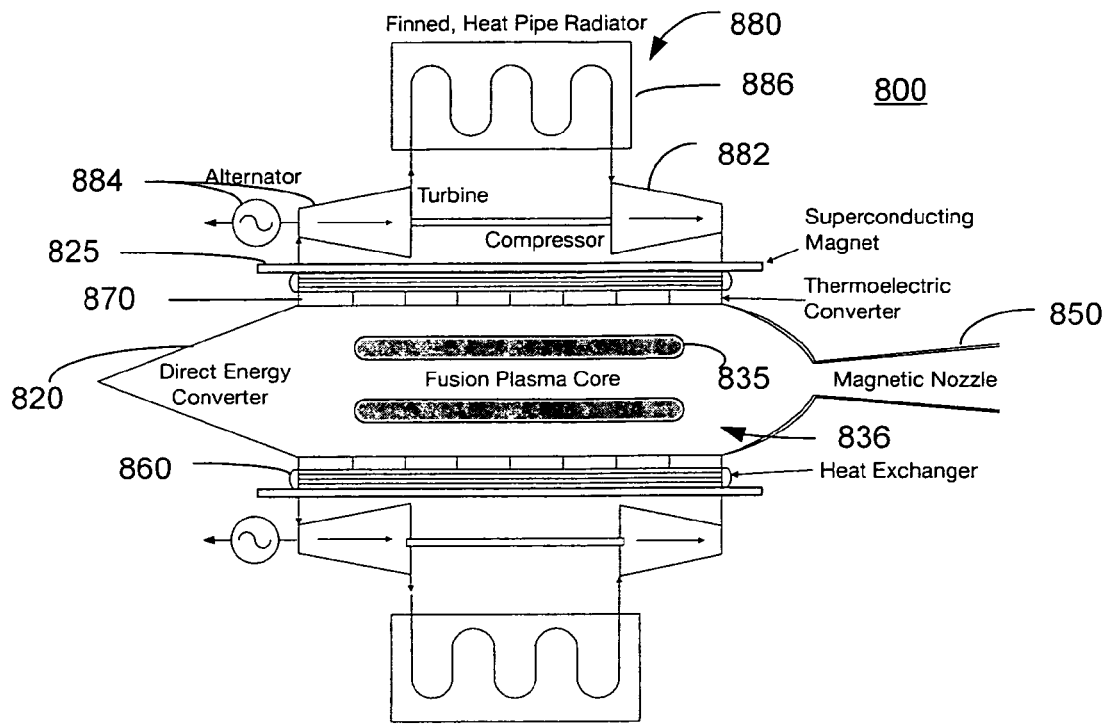
FIG. 31 shows the main components of a plasma-thruster propulsion system.

The performance of the plasma-thrust propulsion system 800 is characterized by the following kinetic parameters for a 100 MW p-B 11 fusion core example having a design as depicted in FIG. 31:

| | |
|---|---|
| Specific Impulse, $I_{sp}$ | $1.4 \times 10^6$ s |
| Thrust Power, $P_T$ | 50.8 MW |
| Thrust Power/Total Output Power, $P_T/P_o$ | 0.51 |
| Thrust, T | 28.1 N |
| Thrust/Total Output Power, $T/P_o$ | 281 mN/MW |

The system 800 exhibits a very high specific impulse, which allows for high terminal velocities of a space craft utilizing the plasma-thrust propulsion system.

Figure 32:
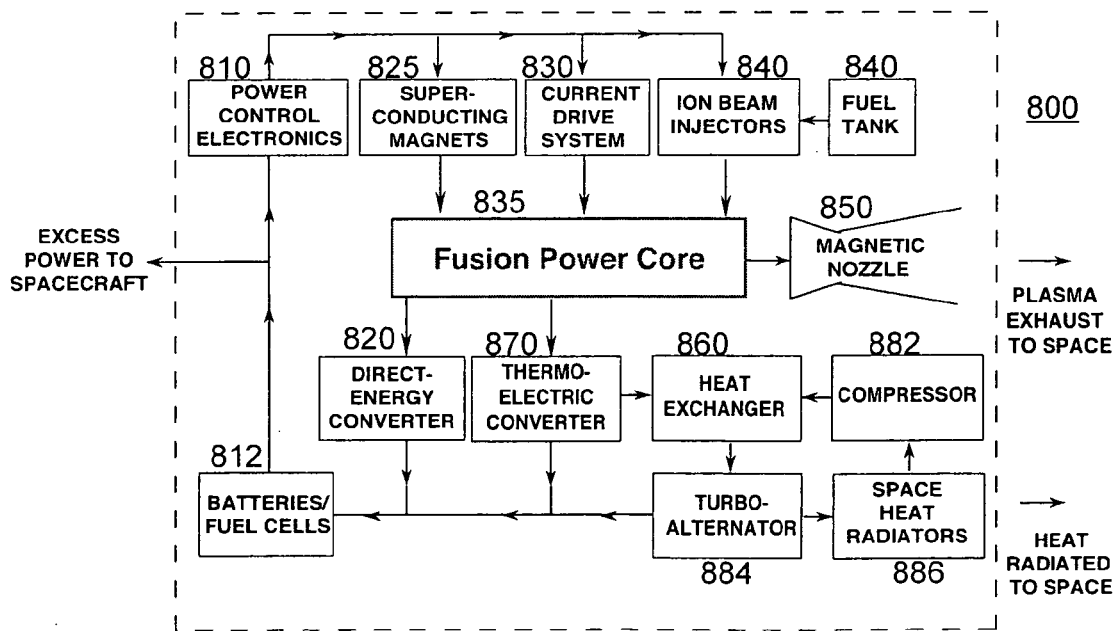
FIG. 32 shows a block diagram of the plasma-thruster propulsion system.

A key mission performance/limitation metric for all space vehicles is system mass. The principal mass components in the plasma-thrust propulsion system 800 are illustrated in FIGS. 31 and 32. The fusion core 835 requires approximately 50 MW of injected power for steady-state operation. The system generates approximately 77 MW of nuclear (particle) power, half of which is recovered in the direct-energy converter 820 with up to 90% efficiency. Thus, an additional 11.5 MW is needed to sustain the reactor, which is provided by the TEC 870 and Brayton-heat engine 880.

The principal source of heat in the plasma-thruster propulsion system 880 is due to Bremsstrahlung radiation. The TEC 870 recovers approximately 20% of the radiation, or 4.6MW, transferring approximately 18.2 MW to the closed-cycle, Brayton-heat engine 880. The Brayton-heat engine 880 comprises a heat exchanger 860, turbo-alternator 884, compressor 882, and radiators 886, as shown in FIG. 31. The Brayton engine 880 supplies the remaining 7 MW of power needed to sustain the reactor, another 11 MW is dumped directly to space by means of radiators.

A closed-cycle, a Brayton-heat engine is a mature and efficient option to convert excess heat rejected by the TEC 870. In Brayton engines the maximum-cycle temperature is constrained by material considerations, which limits the maximum thermodynamic-cycle efficiency. Based on a standard performance map for the Brayton engine, several design points can be extracted. Typical efficiencies can reach up to 60%. For the present case, 7 MW is needed to be recovered, hence, only a 40% efficiency in converting waste heat is acceptable and well within currently attainable limits of conventional Brayton engines.

The component mass for the entire Brayton engine (less the heat radiators) is calculated based on specific-mass parameters typical of advanced industrial technologies, i.e. in the range of 3 kg/kWe. Turbomachines, including compressors, power turbines, and heat exchangers, are combined for a total subsystem mass of 18 MT.

The radiator mass is estimated to be 6 MT, preferably using heat-pipe panels with state-of-the-art high thermal conductivity.

Significant system weight also comes from the magnets 825 confining the plasma core 835. The superconducting magnetic coils 825 are preferably made of Nb3Sn, which operates stably at 4.5K and at a field of 12.5-13.5 T. The cryogenic requirements for Nb3 Sn are less stringent than other materials considered. With a magnetic field requirement of 7 Tesla and a device length of approximately 7.5 meters, the coil needs about 1500 turns of wire carrying 56 kA of current. Using 0.5-cm radius wires, the total mass of this coil is about 3097 kg. The liquid helium cooling system is comprised of two pumps, one at each end of the main coil. The total mass of these pumps is approximately 60 kg. The outer structural shell is used to support the magnets and all internal components from outside. It is made of 0.01-m thick kevlar/carbon-carbon composite with a total mass of about 772 kg. The outermost layer is the insulation jacket to shield the interior from the large temperature variation in space is estimated at 643 kg. The total mass for the magnet subsystem 825 is, therefore, about 4.8 MT.

At present, the ion injection system 840 most appropriate for space applications would be an induction linac or RFQ. Approximately 15 years ago an RFQ was flown on a scientific rocket and successfully demonstrated the use of high voltage power and the injection of ion beams into space. In a preferred embodiment, six injectors 840 distributed along the length of the CBFR, three for each species of ion. Each injector 840 is preferably a 30 beamlet RFQ with an overall dimension of 0.3 meters long and a 0.020-m radius. Each injector requires an ion source, preferaby 0.02-meters long and 0.020-meters radius, that supplies ionized hydrogen or boron. One source is needed for each accelerator. Both the injector and the source are well within currently attainable limits; with design refinements for space their total mass, including the sources and the accelerators, should be about 60 kg.

The cone-shaped ICC direct energy converter 820 is located at one end of the reactor 836, which is preferably made of stainless steel. With a base radius of 0.5 meters and a length of 2 meters, the ICC mass is approximately 1690 kg. An RF power supply 820 (inverter/converter) recovers the directed-ion flow, converting it into electric power. The power supply mass is about 30 kg. A storage battery 812 is used to start/re-start the CBFR. The stored capacity is about 30 MJ. Its mass is about 500 kg. Alternately, a fuel cell could also be used. Additional control units coordinate operation of all the components. The control-subsystem mass is estimated to be 30 kg. The total energy converter/starter subsystem mass is, therefore, estimated at about 2.25 MT.

A magnetic nozzle 850 is located at the other end of the fusion core 835. The nozzle 850 focuses the fusion product stream as a directed particle flow. It is estimated that the mass of the magnetic nozzle and the ICC are about equal; since both are comprised of superconducting magnets and relatively low-mass, structural components.

The TEC 870 recovers energy from the electromagnetic emissions of the fusion core. It is preferably a thin-film structure made of 0.02-cm thick boron-carbide/silicon-germanium, which has a mass density of about 5 g/cm$^3$. The TEC 870 is located at the first wall and preferably completely lines the inner surface of the reactor core; the mass of the TEC 870 is estimated at about 400 kg. The radiant flux onto the TEC 870 is 1.2 MW/m$^2$ and its peak operating temperature is assumed to be less than 1800° K.

The total plasma-thruster propulsion system mass is thus estimated at about 33 MT. This defines the remaining mission-critical parameters for the presently discussed 100 MW unit:

| | |
|---|---|
| Total Mass/Total Power, $M_T/P_o$ | $0.33 \times 10^{-3}$ kg/W |
| Thrust/Mass, $T/M_T$ | $0.85 \times 10^{-3}$ N/kg |

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method of driving plasma ions and electrons in a field reversed configuration (FRC) magnetic field comprising the steps of generating an FRC about an rotating elongate annular layer of plasma of ions and electrons axially extending within a cylindrical chamber along the longitudinal axis of the chamber, the plasma having a density of $10^{14}$ per cubic centimeters or more and wherein the ions in the rotating layer of plasma orbit in betatron orbits normal to the longitudinal axis of the chamber, creating an electric potential wave that penetrates the rotating layer of plasma and rotates in the same direction as the azimuthal velocity of ions in the rotating layer of plasma, wherein the electric potential wave has a wavelength one or more orders of magnitude greater than the radius of the chamber, trapping ions in the rotating layer of plasma in the electric potential wave, and increasing the momentum and energy of the trapped ions.

2. The method of claim 1 wherein the step of creating an electric potential wave includes energizing a plurality of elongate electrodes forming a cylindrical surface within the chamber.

3. The method of claim 2 wherein the plurality of elongate electrodes form an elongate cyclotron.

4. The method of claim 2 wherein the cyclotron is a quadrupole cyclotron.

5. The method of claim 2 wherein the cyclotron is a dipole cyclotron.

6. The method of claim 1 further comprising the step of injecting neutral atoms into the plasma.

* * * * *